United States Patent [19]

Lode

[11] 4,075,698
[45] Feb. 21, 1978

[54] DIGITAL PHASE MEASUREMENT SYSTEM

[76] Inventor: Tenny D. Lode, 3270 Cherryridge Road, Englewood, Colo. 80110

[21] Appl. No.: 690,869

[22] Filed: May 28, 1976

Related U.S. Application Data

[63] Continuation of Ser. No. 456,853, April 1, 1974, abandoned.

[51] Int. Cl.² .................... H03K 13/02; G01R 25/00
[52] U.S. Cl. ............................... 364/483; 324/83 D; 340/347 AD; 340/347 SY
[58] Field of Search ............... 340/347 AD, 347 SY, 340/347 P; 324/83 D, 186; 328/133

[56] References Cited

U.S. PATENT DOCUMENTS

| | | | |
|---|---|---|---|
| 3,624,641 | 11/1971 | Brennan | 340/347 AD |
| 3,737,894 | 6/1973 | Poretti et al. | 340/347 AD |
| 3,745,559 | 7/1973 | Mattern | 340/347 AD |
| 3,760,270 | 9/1973 | Irvin | 324/83 D |
| 3,761,916 | 9/1973 | Schenk | 340/347 AD |
| 3,766,545 | 10/1973 | Hikosaka | 340/347 AD |
| 3,889,189 | 6/1975 | Lode | 324/186 |
| 3,919,706 | 11/1975 | Grimm et al. | 340/347 AD |

*Primary Examiner*—Felix D. Gruber
*Attorney, Agent, or Firm*—Dugger, Johnson & Westman

[57] ABSTRACT

This invention relates to analog-to-digital conversion systems, and makes use of the properties of cyclic variables such as phase angles. In one form of the invention, an analog signal to be converted into a digital value is applied to an input of a phase modulator. The phase modulator shifts the phase of an oscillator signal in accordance with the value of the analog input signal. A series of alternate frequency doubling and heterodyne frequency conversion steps are used to generate a series of signals with the same frequency as the oscillator output signal, but with phase shifts of 2, 4, 8, etc., times the phase shift of the phase modulator output signal. Binary (two-state) signals are generated whose values correspond to the relative phases of the phase modulator output and multiplied phase shift signals. The values of these binary signals are sampled when an analog-to-digital conversion is to be performed. Simple logical operations upon the sampled binary signal values resolve any ambiguities and provide a digital value, corresponding to the value of the analog input signal, in a normal binary or other desired form.

The general concept may be implemented with other than conventional electronic techniques. For example, it may be implemented with microwave, optical and/or other techniques.

32 Claims, 58 Drawing Figures

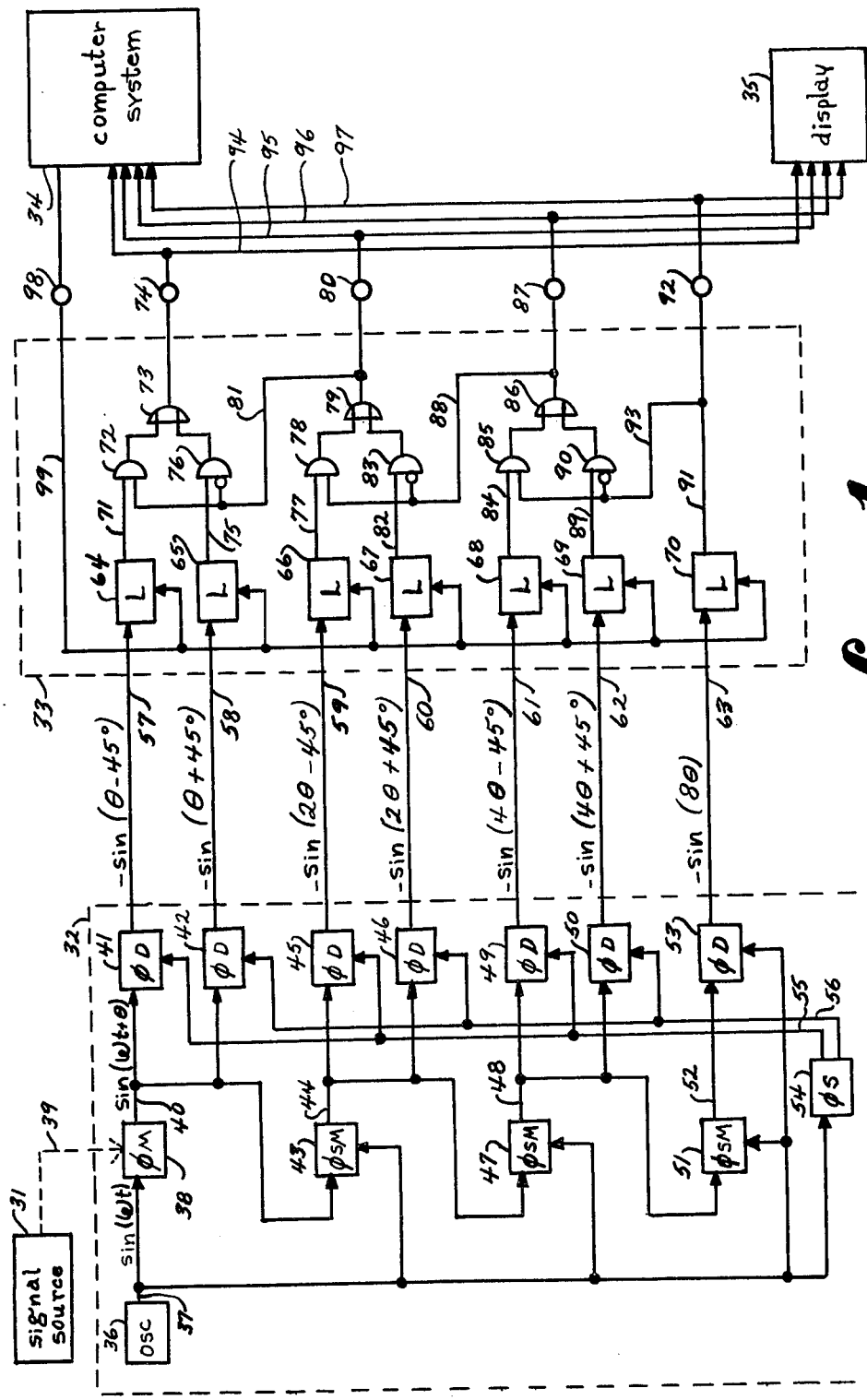

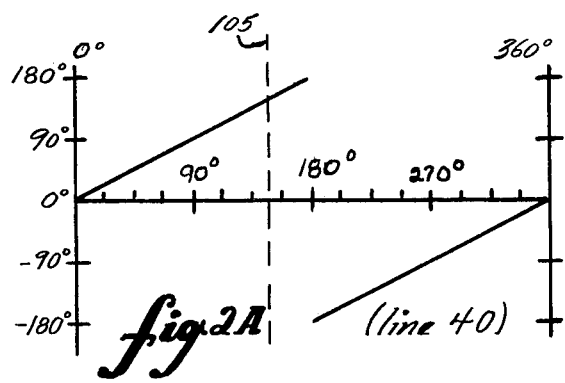
fig. 2A (line 40)
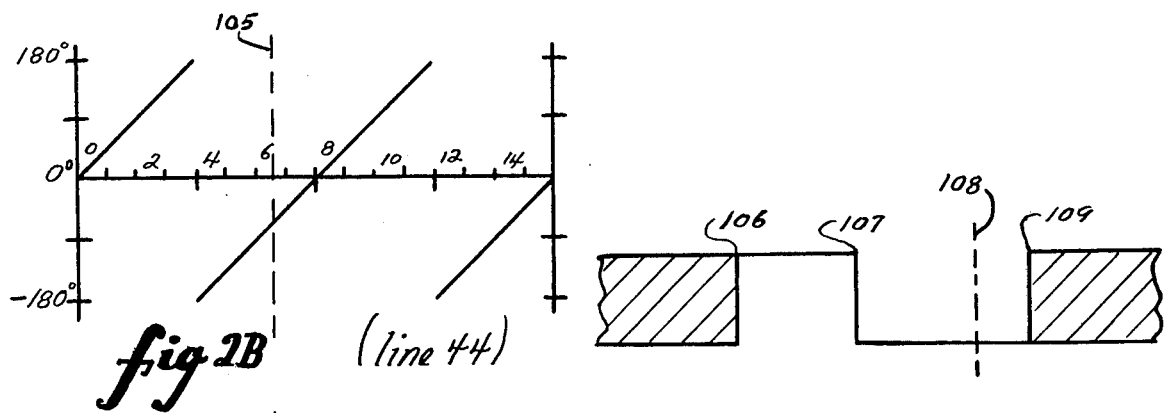
fig. 2B (line 44)
fig. 3
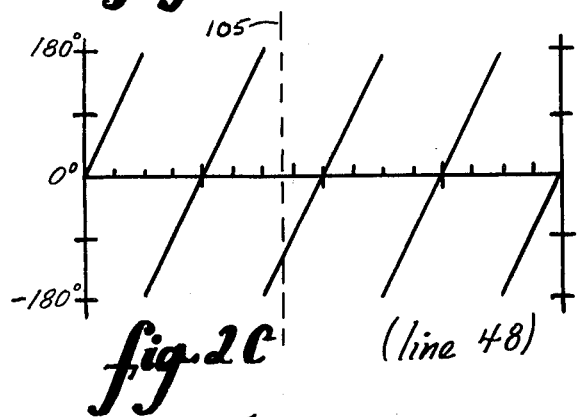
fig. 2C (line 48)
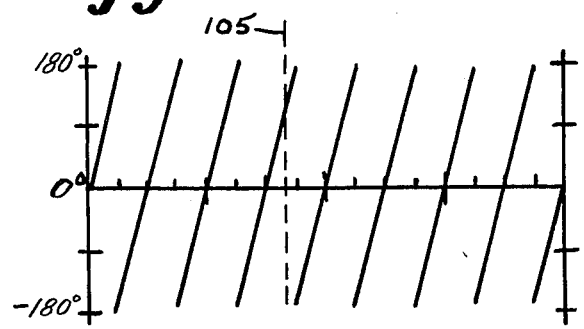
fig. 2D (line 52)

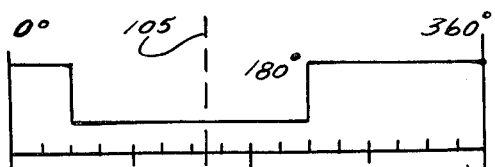
fig. 4A (line 57/71)
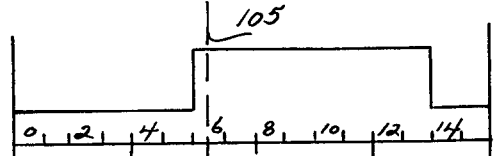
fig. 4B (line 58/75)
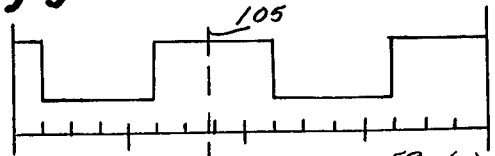
fig. 4C (line 59/77)
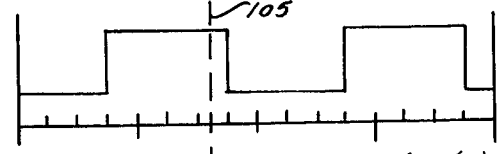
fig. 4D (line 60/82)
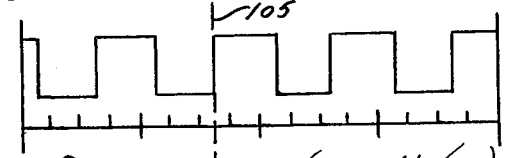
fig. 4E (line 61/84)
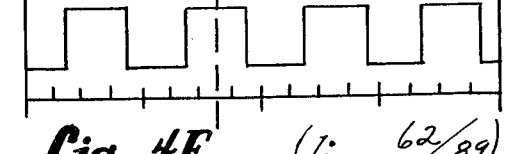
fig. 4F (line 62/89)
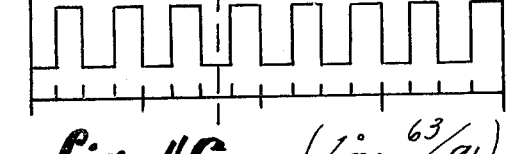
fig. 4G (line 63/91)
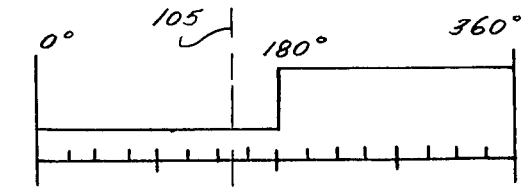
fig. 4H (terminal 74)
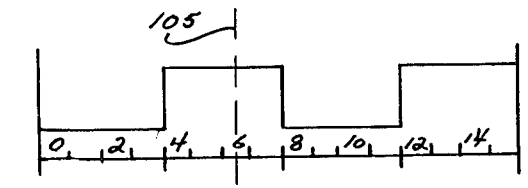
fig. 4I (terminal 80)
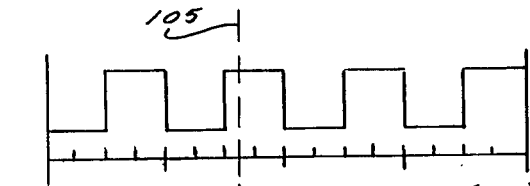
fig. 4J (terminal 87)
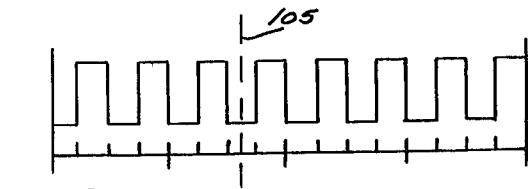
fig. 4K (terminal 92)

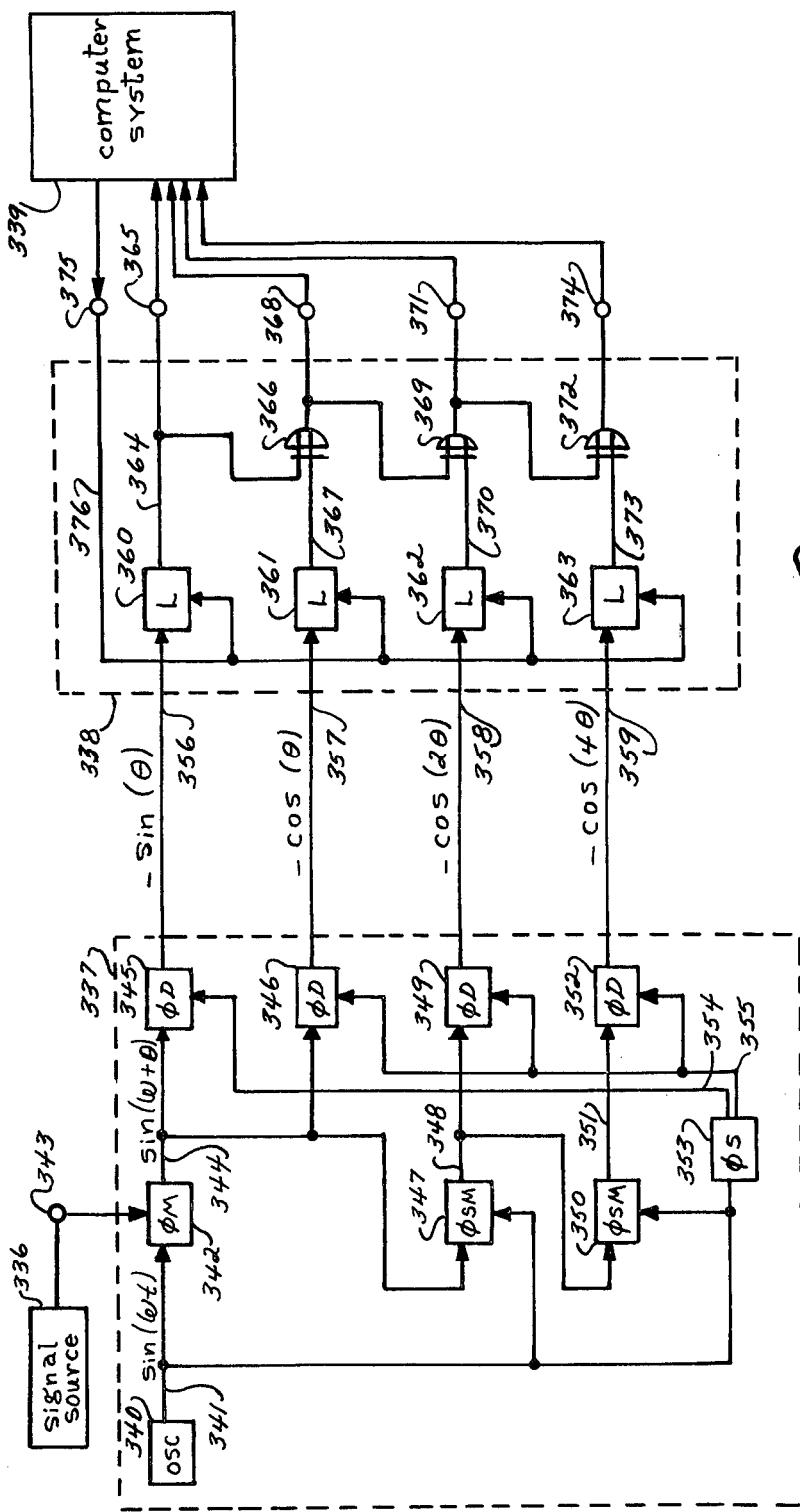

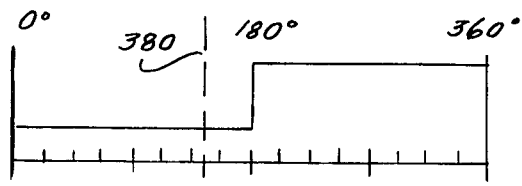
fig. 13A (line 356/364)
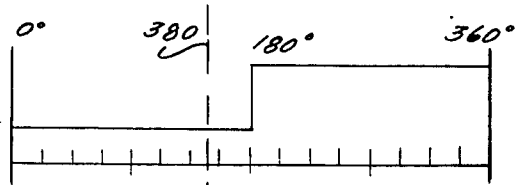
fig. 13E (terminal 365)
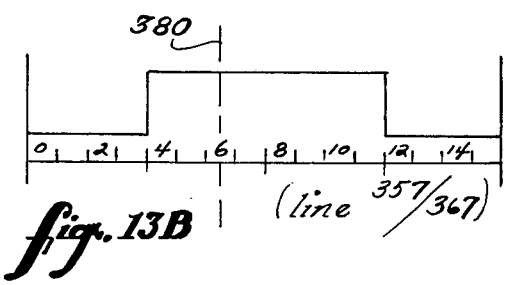
fig. 13B (line 357/367)
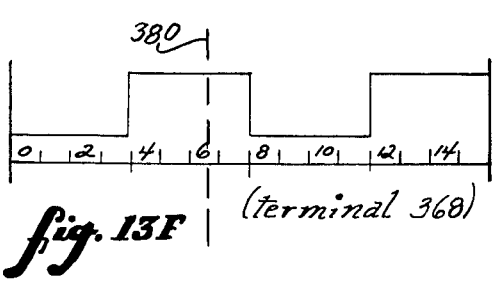
fig. 13F (terminal 368)
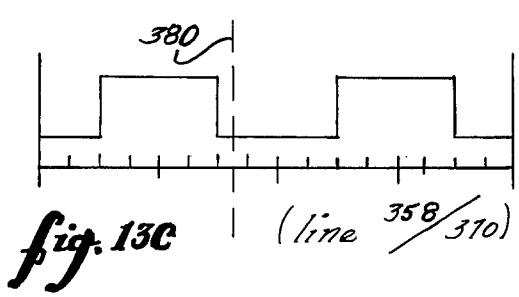
fig. 13C (line 358/370)
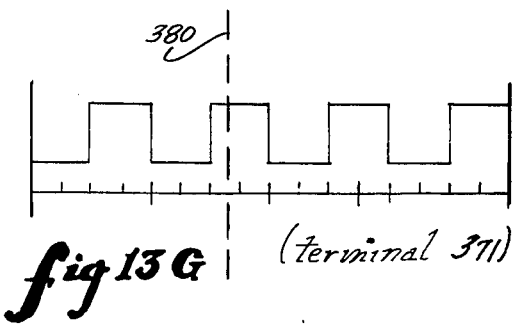
fig. 13G (terminal 371)
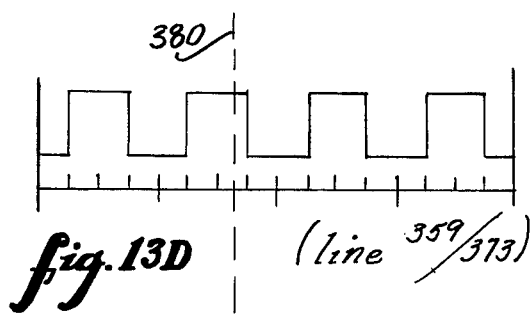
fig. 13D (line 359/373)
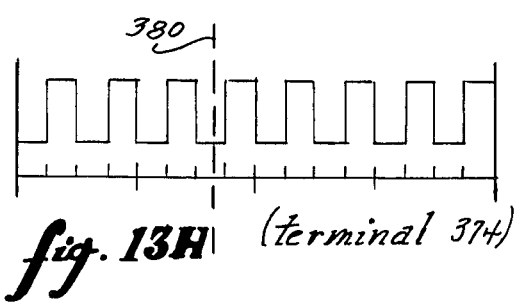
fig. 13H (terminal 374)

DIGITAL PHASE MEASUREMENT SYSTEM

This is a continuation of application Ser. No. 456,853, filed Apr. 1, 1974, and now abandoned.

BACKGROUND OF THE INVENTION

When digital computers are used to measure or control the operation of equipment, processes or systems, it is often desirable or necessary to provide the computer with means to sense and measure analog inputs (such as voltages or currents which may vary over given ranges) in addition to discrete or digital inputs (such as from switches or pushbuttons). For example, if a digital computer, is to be used to monitor or control a chemical process, it must be able to measure temperatures, pressures and/or other process variables.

The usual way of doing this is to employ one or more analog-to-digital converters which allow the digital computer to measure analog voltages. The analog-to-digital converter(s) measures signals from various transducer circuits which convert temperatures, pressures and/or other quantities into analog voltages. In general, the increasing use of digital computers for measurement, computation and control makes it desirable to be able to convert a wide variety of physical quantities into digital values.

Given either a digital-to-analog converter or an analog-to-digital converter, it is possible to construct the complementary type of converter using appropriate feedback circuits. It is a common practice to construct medium to high accuracy, medium to high speed analog-to-digital converters by using a parallel type digital-to-analog converter and feedback control circuits. Such converters are sometimes called comparison converters. At the present time, the comparison type of analog-to-digital converter is the most widely used type for an input device for digital computer systems. Hence, it will be discussed in greater detail below.

In a comparison type converter, a medium to high accuracy, medium to high speed analog-to-digital converter is constructed by using a digital-to-analog converter and feedback control circuits. The digital-to-analog converter generates an analog voltage corresponding to a number in a digital register. Feedback control circuits adjust the number in the digital register until the converted analog voltage corresponds to an input analog voltage. A common practice is to perform a series of comparisons and adjustments of a binary digital number, one bit at a time beginning with the most significant bit, so as to achieve a relatively short conversion time. Converters using this technique are often referred to as successive approximation converters. For example, a 12-bit successive approximation converter, with a precision of one part in 4096 ($2^{12}$), will require only twelve comparisons for a complete analog-to-digital conversion.

In conventional comparison type analog-to-digital converters, the accuracy and resolution are normally quite closely tied together. That is, in order to provide a high resolution, it is also necessary to provide a similarly high accuracy. In some applications, it may be desirable to provide a high resolution without necessarily providing a correspondingly high absolute accuracy. For example, suppose one wishes to weigh several objects to determine their uniformity of weight. One may wish to measure small differences with an accuracy of (say) a fraction of an ounce, without necessarily wanting to know the total weight of each object to a similar accuracy. Similarly, one may wish to measure the temperature of a chemical reaction vessel. It may be desirable to measure a rate of change of temperature by measuring differences of (say) a few hundredths of a degree over a short period of time, while it is not necessary to measure the temperature itself with a similar accuracy. In such applications, the ability to measure small differences or changes with a high resolution, but without necessarily a similarly high absolute accuracy, can be of value.

A critical element in the comparison type analog-to-digital converter is the digital-to-analog converter. A common practice is to use a parallel resistor network driven by a number of voltage or current switches, with each switch being controlled by one bit of the binary number to be converted. The resistor network is adjusted so that the relative weight given to the output of each voltage or current switch is one-half the weight given to the output of the switch corresponding to the next more significant bit.

Using an eight-bit binary converter as an example, the problem in the parallel digital-to-analog converter (and hence, the comparison type analog-to-digital converter) is that the voltage developed by the converter in response to, for example, a digital input of 10000000 (128 in decimal) may not be exactly one increment larger than the voltage developed for a digital input of 01111111 (127 in decimal). If the effective weighting values of the resistor network and/or the inaccuracies of the voltage or current switches are such that the effective weight given to the most significant bit is slightly low, the voltage generated for the conversion of 10000000 may actually be less than the voltage generated for the conversion of 01111111.

Adjustments are usually provided to set the weights given to some number of the most significant bits to overcome this problem. Unfortunately, resistor networks tend to drift with variations in temperature and with time, and the characteristics of semiconductor voltage or current switches may also drift, so that readjustment may be required from time to time. At the present time, 15 or 16 bits is about the practical limit for parallel resistor network type digital-to-analog converters and, hence, comparison type analog-to-digital converters.

In general, a comparison type analog-to-digital converter can provide a high resolution only by providing a correspondingly high absolute accuracy. Simply extending the number of bits in a comparison type converter by adding additional circuits is generally of no utility, as the values of the additional bits in the converted digital numbers will have no particularly significant relationship to the value of the analog input signal.

As an example, the resolution and accuracy situation in regard to conventional comparison type analog-to-digital converters is similar to the use of a balance and a set of weights of 16 ounces, 8 ounces, 4 ounces, 2 ounces and 1 ounce for weighing. Measuring a change of weight from 15 ounces to 16 ounces requires going from using the combination of the 8, 4, 2 and 1 ounce weights to using the 16 ounce weight. The accuracy of the 16 ounce weight must generally be better than the desired resolution. In contrast, a simple spring type scale may have an absolute error of several ounces when weighing an object of approximately 16 ounces. However, it is still capable of indicating a change of, say, one ounce and thus providing a usable resolution which is significantly finer than its absolute accuracy.

Conventional analog-to-digital converters are, in general, not capable of providing useful resolutions finer than their absolute accuracies.

A further limitation of conventional comparison type analog-to-digital converters is that the conversion time can be quite slow for high resolution conversions. The successive approximation type converter requires a comparison for each bit of the digital output value, which must be made with an accuracy somewhat greater than the desired resolution. After each adjustment of the digital data value, it is necessary to wait until the digital-to-analog converter output has settled to a stable value and the comparison circuitry has measured the perhaps quite small difference between the digital-to-analog converter output voltage and the analog input voltage.

In the case of a high resolution analog-to-digital converter, this total process may be somewhat slow. At the present time, moderate accuracy successive approximation analog-to-digital converters (say up to eight bits) can be readily built to provide a complete analog-to-digital conversion in less than 10 microseconds. Commercially available high accuracy successive approximation converters (say 15 or 16 bits) typically require several hundred microseconds for a complete conversion. High speed analog-to-digital converters, using approaches other than the successive approximation technique described above, can perform complete conversions in a small fraction of a microsecond. However, these high speed converter designs are generally more expensive and are usually capable of providing only low to moderate accuracy conversions Examples of the prior art related to the subject invention include U.S. Pat. No. 3,068,456 issued Dec. 11, 1962 to S. G. Nevius; U.S. Pat. No. 3,353,175 issued Nov. 14, 1967 to J. E. Brook, et al; U.S. Pat. No. 3,624,641 issued Nov. 30, 1971 to L. E. Brennan; and U.S. Pat. No. 3,745,559 issued July 10, 1973 to J. Mattern.

SUMMARY OF THE INVENTION

The subject invention takes advantage of the properties of cyclic variables, such as phase angles, whose values effectively repeat in a generally cyclic manner. A phase angle variable can be measured relative to a convenient scale, such as 0° to 360° representing one complete cycle. Given a particular phase angle value, 2 times, 4 times, or any number times the original phase angle can still be represented on the same 0° to 360° scale. For example, if an input phase angle value is 200° and we wish to multiply it by 2, the result is 400°. This 400° value is also equal to 40° and, hence, still on the original 0° to 360° scale. In the subject invention, an analog quality to be converted into digital form in converted into a phase angle signal, if not already in that form, to take advantage of these properties.

This cyclic property and the advantages thereof are generally not found in scales conventionally used for the representation and conversion of analog quantities. For example, if an analog input value is represented as a voltage on a 0 to 1 volt scale, there is no correspondingly simple and direct means whereby one can always represent (say) twice the value of the input voltage on this same 0 to 1 volt scale. If the input voltage can very over a 0 to 1 volt range, twice the input voltage will vary over a 0 to 2 volt range.

In one form of the subject invention, an analog signal to be converted into digital form is applied to an input of a phase modulator. The phase modulator shifts the phase of an oscillator signal in accordance with the value of the analog input signal. A series of alternate frequency doubling and heterodyne frequency conversion steps are used to generate a series of signals with the same frequency as the oscillator output signal, but with phase shifts of 2, 4, 8, etc., times the phase shift of the phase modulator output signal. Binary (two-state) signals are generated whose values correspond to the relative phases of the phase modulator output and multiplied phase shift signals. In some instances, more than one binary signal may be generated corresponding to one phase value. The values of these binary signals are sampled when an analog-to-digital conversion is to be performed. Simple logical operations upon the sampled binary signal values resolve any ambiguities and provide a digital value corresponding to the value of the analog input signal, in a normal binary or other desired form.

The general concept may be implemented with other than conventional electronic techniques. For example, it may be implemented with microwave, optical and/or other techniques.

A general object of the subject invention is to provide a novel system for analog-to-digital conversion.

A further object is to provide high resolution analog-to-digital conversions without necessarily requiring a correspondingly high accuracy and the related difficulty and expense.

A further object is to provide a combination of relatively high speed and relatively high resolution analog-to-digital conversion.

BRIEF DESCRIPTION OF THE DRAWINGS

FIG. 1 is a diagrammatic illustration of a first form of the invention showing the analog-to-digital conversion of an analog signal into a four-bit binary number, and the use of an intermediate two-phase code for the resolution of ambiguities;

FIG. 2A through 2D are graphical illustrations showing the relative phases of certain signals within the system of FIG. 1, plotted as functions of the analog input signal;

FIG. 3 is a graphical illustration showing a control signal within the system of FIG. 1 and the relative timing of certain operations therein;

FIGS. 4A through 4K are graphical illustrations of certain logic level signals within the system of FIG. 1, plotted as functions of the analog input signal;

FIG. 12 is a diagrammatic illustration of a second form of the invention showing the analog-to-digital conversion of an analog input signal into a four-bit binary number, and the use of an intermediate Gray code for the resolution of ambiguities;

FIGS. 13A through 13H are graphical illustrations of certain logic level signals within the system of FIG. 12, plotted as functions of the analog input signal;

DESCRIPTION OF THE PREFERRED EMBODIMENTS

Figure 5:
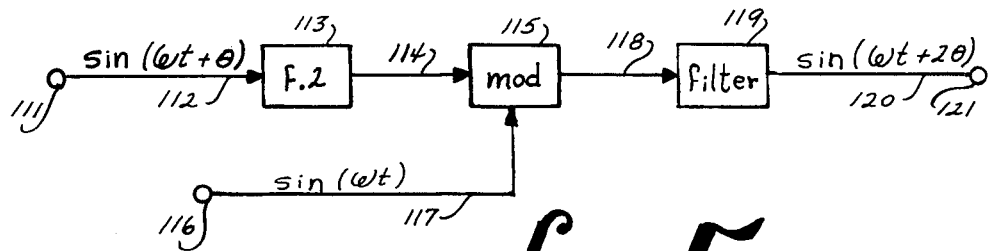
FIG. 5 is a diagrammatic illustration of a first form of phase shift multiplier circuit, incorporating frequency doubling followed by a modulation with a signal whose frequency is substantially equal to that of the input phase signal, which may be used for phase shift multipliers in the system of FIG. 1 and/or in other systems shown in this disclosure.

FIG. 1 is a diagrammatic illustration of a first form of the invention showing the analog-to-digital conversion of an analog signal into a four-bit binary number, and the use of an intermediate two-phase code for the resolution of ambiguities. FIG. 1 includes a signal source 31, a phase shift multiplication section 32, a sampling section 33, a digital computer system 34 and a digital display 35. Within phase shift multiplication section 32, the output oscillator 36 is connected via line 37 to a carrier signal input of phase modulator 38, to phase reference inputs of phase shift multipliers 43, 47 and 51, and phase detector 53, and to the input of phase shift 54. Signal source 31 is connected via link 39 to a modulation signal input of phase modulator 38. The output of phase modulator 38 is connected via line 40 to phase signal inputs of phase detectors 41 and 42, and phase shift multiplier 43. The output of phase shift multiplier 43 is connected via line 44 to phase signal inputs of phase detectors 45 and 46, and phase shift multiplier 47. The output of phase shift multiplier 47 is connected via line 48 to phase signal inputs of phase detectors 49 and 50, and phase shift multiplier 51. The output of phase shift multiplier 51 is connected via line 52 to a phase signal input of phase detector 53. A first output of phase shift 54 is connected via line 55 to phase reference inputs of phase detectors 41, 45 and 49. A second output of phase shift 54 is connected via line 56 to phase reference inputs of phase detectors 42, 46 and 50. The outputs of phase detectors 41, 42, 45, 46, 49, 50 and 53 are connected to lines 57, 58, 59, 60, 61, 62 and 63, respectively. Within sampling section 33, lines 57, 58, 59, 60, 61, 62 and 63 are connected to the signal inputs of latches 64, 65, 66, 67, 68, 69 and 70, respectively. The output of latch 64 is connected via line 71 to a first input of AND gate 72, whose output is connected to a first input of OR gate 73. The output of OR gate 73 is connected to terminal 74. The output of latch 65 is connected via line 75 to a first input of AND gate 76, whose output is connected to a second input of OR gate 73. The output of latch 66 is connected via line 77 to a first input of AND gate 78, whose output is connected to a first input of OR gate 79. The output of OR gate 79 is connected to terminal 80 and, via line 81, to second inputs of AND gates 72 and 76. The second input of AND gate 76 is an inverted input, as indicated by the small circle symbol element at the input point. The small circle symbol element is used similarly throughout the specification to indicate inverted inputs and outputs. The output of latch 67 is connected via line 82 to a first input of AND gate 83, whose output is connected to a second input of OR gate 79. The output of latch 68 is connected via line 84 to a first input of AND gate 85, whose output is connected to a first input of OR gate 86. The output of OR gate 86 is connected to terminal 87 and, via line 88, to second inputs of AND gates 78 and 83. The output of latch 69 is connected via line 89 to a first input of AND gate 90, whose output is connected to a second input of OR gate 86. The output of latch 70 is connected via line 91 to terminal 92 and, via line 93, to second inputs of AND gates 85 and 90. Terminals 74, 80, 87 and 92 are connected via lines 94, 95, 96 and 97, respectively, to signal inputs of digital computer system 34 and to signal inputs of digital display 35. A control signal output of computer system 34 is connected to terminal 98, which is connected via line 99 to control signal inputs of latches 64, 65, 66, 67, 68, 69 and 70.

Signal source 31 is a source of an analog signal which is to be converted into a digital value. Signal source 31 may be, for example, a source of a voltage signal corresponding to a temperature, pressure or other quantity which is to be digitally measured. Link 39 may be an electrical line which connects a voltage signal output of signal source 31 to phase modulator 38. The output of oscillator 36 on line 37 is a signal of the general form $\sin(\omega t)$, where $\omega$ is the angular frequency of the line 37 signal. The output frequency of oscillator 36 will normally be chosen on the basis of considerations such as the desired system response time and the convenience of system implementation. The output of phase modulator 38 on line 48 will be a signal of the form $\sin(\omega t + \theta)$, where $\theta$ is the phase shift introduced by phase modulator 38 corresponding to the signal on link 39.

Many types of phase modulators, which may be used for phase modulator 38, are known. Phase modulator 38 may be, for example, a simple circuit including a voltage variable capacitor element. A voltage signal on link 39 would be applied to the voltage variable capacitor to vary its capacitance and the phase shift through phase modulator 38. Other forms of signals may also be used. For example, phase modulator 38 may be a simple circuit including a pressure sensitive capacitor whose capacitance varies as a function of an applied air pressure. Signal source 31 may then be a source of air at a pressure which is to be measured. Link 39 may be a tube or other carrier of air which couples the variable pressure air source in signal source 31 to the pressure sensitive capacitor in phase modulator 38. A wide variety of other forms of signal sources, links, and phase modulators may be used within the spirit of the subject invention.

The output of phase detector 41 is a logic level signal whose value (high or low) corresponds to the polarity of the $-\sin(\theta - 45°)$ function (positive or negative). The output of phase detector 42 is a logic level signal whose value similarly corresponds to the polarity of the $-\sin(\theta + 45°)$ function. Phase detectors such as phase detectors 41, 42, 45, 46, 49, 50 and 53 are available as integrated circuit devices from several sources, or may be constructed from discrete components. In the various systems shown in this disclosure, it is assumed that the phase detectors include whatever low pass filtering of their output signals that may be required to reduce the magnitude of carrier frequency and other high frequency ripple components therein. Phase detector 41 compares the phase of the line 40 signal with the phase of the line 55 phase reference signal. Phase detector 42 similarly compares the phase of the line 40 signal with the phase of the line 56 phase reference signal.

Figure 6:
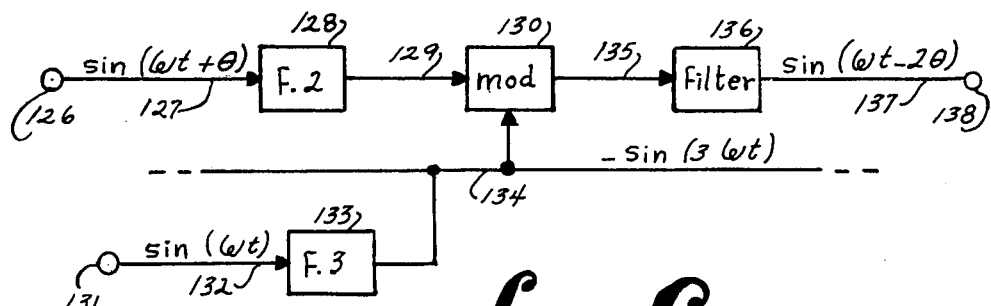
FIG. 6 is a diagrammatic illustration of a second form of phase shift multiplier circuit, incorporating frequency doubling followed by a modulation with a signal whose frequency is substantially three times that of the input phase signal, which may be used for phase shift multipliers in the system of FIG. 1 and/or in other systems shown in this disclosure.
Figure 7:
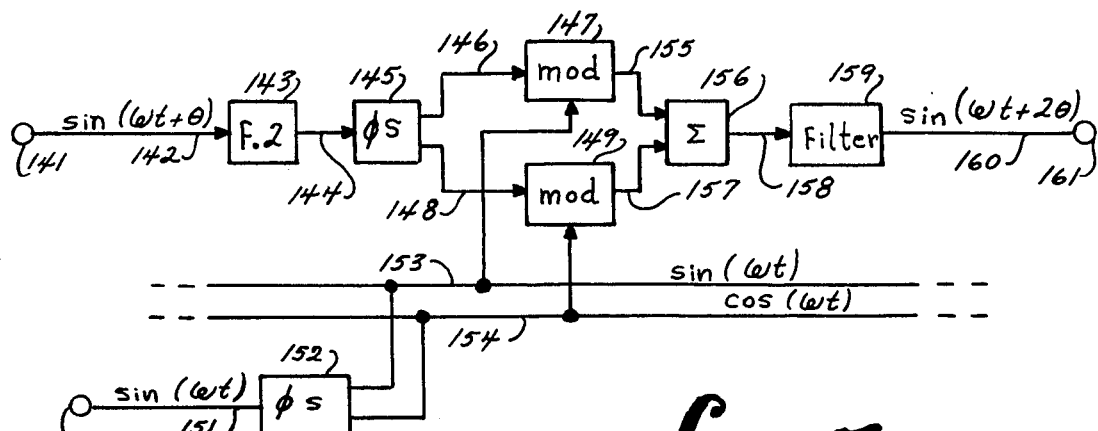
FIG. 7 is a diagrammatic illustration of a third form of phase shift multiplier circuit, incorporating frequency doubling followed by a single sideband modulation type frequency subtraction operation, which may be used for phase shift multipliers in the system of FIG. 1 and/or in other systems shown in this disclosure.

The line 40 signal is also applied to the input of phase shift multiplier 43, which multiplies the effective phase shift and generates an output signal on line 44 of the form $\sin(\omega t + 2\theta)$. Phase shift multiplier circuits which may be used for phase shift multipliers 43, 47 and 51 are shown in FIGS. 5, 6 and 7 and will be described subsequently. The line 37 oscillator 36 output signal is connected to phase shift multipliers 43, 47 and 51 to serve as a phase reference, relative to which the phase shift is multiplied. The outputs of phase detectors 45 and 46, on lines 59 and 60, are logic level signals corresponding to the polarities of $-\sin(2\theta - 45°)$ and $-\sin(2\theta + 45°)$. The phase shift multiplication process is repeated via phase shift multiplier 47, so that the outputs of phase detectors 49 and 50, on lines 61 and 62, are logic level signals corresponding to the polarities of $-\sin(4\theta - 45°)$ and $-\sin(4\theta + 45°)$, respectively. Phase shift multiplier 51 multiplies the phase shift of its input signal and generates a signal line 52 corresponding to $\sin(\omega t + 8\theta)$. The line 37 phase reference signal is applied directly to the phase reference input of phase detector 53, whose output on line 63 is a logic level signal corresponding to $-\sin(8\theta)$.

The phase shift multiplication process in phase shift multiplication section 32 is illustrated further in FIGS. 2A through 2D. The relative phases of the line 40, 44, 48 and 52 signals are plotted in FIGS. 2A, 2B, 2C and 2D, respectively. The functions of FIGS. 2A-2D are plotted on a horizontal scale of 0° to 360°, representing the phase of the line 40 signal. As may be seen, the phase of the FIG. 2B, line 44 signal varies over two complete cycles, while the phase of the FIG. 2A, line 40 signal varies over one cycle. Similarly, the phase of the FIG. 2C, line 48 signal varies over four cycles, and the phase of the FIG. 2D, line 52 signal varies over eight complete cycles for one cycle of the FIG. 2A, line 40 signal.

The outputs of phase detectors 41, 42, 45, 46, 49, 50 and 53, on lines 57 through 63 are applied to the signal inputs of latches 64 through 70. The outputs of latches 64 through 70 are logic level signals with values of zero (low) or one (high) in response to low or high values of the signal inputs at the time of sampling. The latches are controlled by the control signal on terminal 98 and line 99 from digital computer system 34. A high or positive signal on terminal 98 will cause the signals on lines 57 through 63 to be accepted by latches 64 through 70. A low or ground signal on terminal 98 will cause latches 64 through 70 to retain the signal values corresponding to those at the last instant that the terminal 98 signal was high, and to ignore further changes in the signals on lines 57 through 63. A latch circuit typically consists of a flip-flop circuit plus some control gating circuits. Latch circuits of this type are well known logical circuit elements and are available, for example, as standard 7400 series TTL integrated circuit devices.

The network of logical gates between latches 64 through 70 and output terminals 74, 80, 87 and 92 resolves any ambiguities and generates a four-bit binary number on those output terminals. These gates may be, for example, standard 7400 series TTL integrated circuit devices. The four-bit binary number is transmitted to computer system 34 and to digital display 35. The most significant bit signal is on terminal 74 and the least significant bit signal is on terminal 92. Gates such as 76, 83 and 90, which have one inverted input, may be, for example, standard AND or NOR gates with one input line connected through an inverter. The operation of this gate network, and the analog-to-digital conversion process, will be described subsequently in greater detail.

FIG. 3 is a graphical illustration showing a typical terminal 98 control signal within the system of FIG. 1, and the relative timing of certain operations controlled by that signal. Times 106, 107, 108 and 109 are identified so that they may be subsequently referenced.

It is assumed that it is desired to read the digital number corresponding to the link 39 signal into computer system 34 and display 35 from time to time under the control of computer system 34. FIG. 3 is a plot of the control signal on terminal 98 before, during and after the reading of the sampling section 33 outputs by computer system 34. A high or positive value of the terminal 98 signal will cause the logical signal outputs of latches 64 through 70 to follow the values of the signal inputs on lines 57 through 63. In FIG. 3, the high value during the time interval 106–107 will cause latches 64 through 70 to accept and respond to the input signals on lines 57 through 63 during that time interval. The terminal 98 control signal then goes low at time 107, and remains low through time 109. This low or ground terminal 98 signal will cause latches 64 through 70 to retain the signal values corresponding to those at time 107, the last instant that the terminal 98 signal was high.

During the time interval 107–109, the outputs of latches 64 through 70 on lines 71, 75, 77, 82, 84, 89 and 91 will remain constant so that logical operations may be performed on these latch output signals without error or ambiguity due to changing values. The computer data input strobe occurs at time 108, after the terminal 74, 80, 87 and 92 signals have settled to stable values. The value of the terminal 98 signal before time 106 or after time 109 will not affect the particular measurement and conversion. At times other than the computer interrogations, the terminal 98 signal may be either normally high or normally low, depending on the desired mode of operation for display 35.

If the terminal 98 control signal is normally low, display 35 will display the value which was read into computer system 34 at the time of the last computer system interrogation. If the terminal 98 signal is normally high, display 35 will display a current value of the digital output of sampling section 33 regardless of what the previous computer interrogated value may have been. In this latter case, the value displayed by display 35 may occasionally flicker between adjacent values.

FIGS. 4A through 4K illustrate the analog-to-digital conversion process of the system of FIG. 1 in greater detail. FIGS. 4A, 4B, 4C, 4D, 4E, 4F and 4G are plots of the logic level signals on lines 57, 58, 59, 60, 61, 62 and 63, respectively, plotted as functions of the value of $\theta$, the phase shift introduced by phase modulator 38, over a 0° to 360° scale. The 0° to 360° scale is specifically marked on FIGS. 4A and 4H. The 0° to 360° range is also divided into 16 segments of 22.5° each. The individual segments are identified as segments 0 through 15 and are specifically marked on FIGS. 4B and 4I. The signals shown in FIGS. 4A–4K are logic level signals which are normally either high or low and, in general, not of an intermediate value. With standard 7400 series TTL integrated circuit logic devices, a high signal will typically be in the range of 3 to 5 volts positive and a low signal will typically be in the range of 0 to 0.5 volts positive.

FIG. 4A is a plot of a logic level signal on line 57 which corresponds to the polarity of $-\sin(\theta - 45°)$, plotted as a function of $\theta$. FIG. 4A is also a plot of the signal on line 71, the output of latch 64, plotted as a function of the value of $\theta$ at the most recent time of sampling by latch 64. Thus, the plots of the line 57 and line 71 signals are identical in form. However, the significance of the horizontal scale is not exactly the same for the line 57 and 71 signals. Similarly, FIGS. 4B through 4G are plots of the line 58 through 63 signals, corresponding to the polarities of $-\sin(\theta + 45°)$, $-\sin(2\theta - 45°)$, $-\sin(2\theta + 45°)$, $-\sin(4\theta - 45°)$, $-\sin(4\theta + 45°)$ and $-\sin(8\theta)$, respectively, plotted as functions of $\theta$. They are also plots of the line 75, 77, 82, 84, 89 and 91 signals, plotted as functions of the value of $\theta$ at the most recent time of sampling by latches 65 through 70.

FIG. 4H is a plot of the terminal 74 signal, the most significant bit of the four-bit binary number resulting from the analog-to-digital conversion. FIGS. 4I, 4J and 4K are plots of the terminal 80, 87 and 92 signals, the three less significant bits of the binary number.

Now consider the operation of the network of logical gates between latches 64 through 70 and terminals 74, 80, 87 and 92. Latch output line 91 is connected directly to terminal 92, so that the plots of FIGS. 4G and 4K are substantially identical. The line 91, terminal 92 signal plotted in FIGS. 4G and 4K is the least significant bit of the four-bit binary number resulting from the analog-to-digital conversion. Line 93 is connected to a normal or non-inverted input of AND gate 85, and to an inverted input of AND gate 90. The conbination of AND gates 85 and 90, and OR gate 86, serves as a switch which transmits either the line 84 signal or the line 89 signal to terminal 87, depending on the terminal 92 signal. If the terminal 92 signal is low, the line 89 signal will be transmitted to terminal 87. If the terminal 92 signal is high, the line 84 signal will be transmitted to terminal 87. Similarly, the terminal 87 signal determines which of the line 77 or line 82 signals will be transmitted to terminal 80, and the terminal 80 signal determines which of the line 71 or line 75 signals will be transmitted to terminal 74.

As an example, consider the measurement of an analog signal of slightly more than 6/16 of full scale, and a corresponding phase shift angle of slightly more than 6/16 of the 360° scale, at the time of sampling as indicated by dotted line 105 in FIGS. 4A-4K. The polarity of the $-\sin(\theta-45°)$ function will be negative, so that the logic level signal on line 71 will be low as indicated in FIG. 4A. The values of the logic level signals on lines 75, 77, 82, 84, 89 and 91 will be as shown in FIGS. 4B, 4C, 4D, 4E, 4F and 4G, respectively. The negative value of the $-(\sin 8\theta)$ function at the time of sampling, and the corresponding low value of the line 91 signal, causes the terminal 92 signal to be low and the $2^0$ or least significant bit of the binary number to be a zero. The value of the terminal 92 signal causes the selection of the line 89 signal for transmission to terminal 87, and a high or one value for the $2^1$ or two bit of the binary number. The high value of the terminal 87 signal causes the selection of the line 77 signal for transmission to terminal 80, and a high or one value for the $2^2$ or four bit of the binary number. The high value of the terminal 80 signal causes the selection of the line 71 signal for transmission to terminal 74, and a low or zero value for the $2^3$ or eight bit of the binary number.

The digital number resulting from the measurement of the analog input signal and corresponding phase shift angle represented by dotted line 105 is binary 0110 or decimal 6. As may be seen in FIGS. 4B and 4I, dotted line 105 is in angular segment number six. Thus, the system of FIG. 1 has performed an analog-to-digital conversion of the signal represented by dotted line 105. As shown in FIGS. 4A-4K, the system of FIG. 1 will generate digital numbers from 0 through 15 for analog inputs corresponding to phase shift values over a range of 0° to 360°. The functions plotted in FIGS. 4H, 4I, 4J and 4K follow the normal pattern of a four-bit binary number over a range of 0 through 15.

The operation of the system of FIG. 1 is such that whenever the value of $\theta$ is near 45° or 225° at the sampling time, so that the value of the $-\sin(\theta-45°)$ function is near zero and the value of the line 71 logic level signal representing the polarity of the $-\sin(\theta-45°)$ function is perhaps incorrect, the terminal 80 signal will be low and the line 75 signal will be selected for transmission to terminal 74. If the value of $\theta$ is near 135° or 315° at the sampling time, so that the value of the $-\sin(\theta+45°)$ function is near zero and the value of the line 75 signal is perhaps incorrect, the terminal 80 signal will be high and the line 71 signal will be selected for transmission to terminal 74. Similarly, the lines and signals for the less significant bits of the binary number will be selected for transmission to the corresponding data output terminals only when the corresponding angular functions and logic level signals are well away from points of uncertainty. The selection of a signal for any particular bit, except the least significant bit, is controlled by the value of the adjacent less significant bit. This maintains an exact synchronization of the various individual bit signals, and avoids erroneous intermediate transition values which might otherwise arise when the analog input signal and corresponding phase modulator 38 phase shift value were at or near a boundary point between two adjacent digital values.

FIG. 5 is a diagrammatic illustration of a first form of phase shift multiplier circuit, incorporating frequency doubling followed by a modulation with a signal whose frequency is substantially equal to that of the input phase signal, which may be used for phase shift multipliers 43, 47 and 51 of FIG. 1 and/or in other systems shown in this disclosure. FIG. 5 includes phase signal input terminal 111, phase reference signal input terminal 116 and output terminal 121. Terminal 111 is connected via line 112 to the input of frequency doubler 113, whose output is connected via line 114 to a first input of modulator 115. Terminal 116 is connected via line 117 to a second input of modulator 115. The output of modulator 115 is connected via line 118 to the input of filter 119, whose output is connected via line 120 to terminal 121.

For purposes of analysis, the terminal 111, line 112 signal will be expressed as $\sin(\omega t+\theta)$, where $\omega$ is the angular frequency of the carrier signal and $\theta$ is the phase shift which is to be multiplied. The terminal 116, line 117 phase reference signal will be expressed as $\sin(\omega t)$. Frequency doubler 113 is, for example, a circuit which performs a frequency doubling by squaring the input signal, and removing the DC component in the squared signal via a frequency selective filtering operation. The frequency selective filtering also removes unwanted harmonic, distortion and noise components that might otherwise be present in the frequency doubled signal. From trigonometry:

$$\sin^2(\omega t+\theta) = \tfrac{1}{2}(1-\cos(2\omega t+2\theta))$$

Hence, after the frequency selective filtering operation, the frequency doubler 113 output signal on line 114 will be:

$$-\cos(2\omega t+2\theta)$$

Modulator 115 is a balanced modulator, such that the line 118 output signal is substantially proportional to the product of the line 114 and line 117 input signals. Since the line 114 and 117 input signals are $-\cos(2\omega t+2\theta)$ and $\sin(\omega t)$, the line 118 output signal will be:

$$-\cos(2\omega t+2\theta)\sin(\omega t) = -\tfrac{1}{2}(\sin(3\omega t+2\theta) - \sin\omega t+2\theta))$$

Filter 119 is a frequency selective filter which will pass signals with a frequency of $\omega t$, but reject signals of substantially higher or lower frequencies. Filter 119 will pass the $\omega t$ frequency signal component, but reject the $3\omega t$ frequency signal component in the line 118 signal. Hence, neglecting any phase shift in filter 119, the line 120, terminal 121 output signal will be $\sin(\omega t+2\theta)$. Thus, the circuit of FIG. 5 provides an output signal on terminal 121 which is of the same frequency as the input signal on terminal 111, but of twice the phase shift relative to the terminal 116 phase reference signal.

FIG. 6 is a diagrammatic illustration of a second form of phase shift multiplier circuit, incorporating frequency doubling followed by a modulation with a signal whose frequency is substantially three times that of the input phase signal, which may be used for phase shift multipliers 43, 47 and 51 of FIG. 1 and/or in other systems shown in this disclosure. FIG. 6 includes phase signal input terminal 126, phase reference signal input terminal 131 and output terminal 138. Terminal 126 is connected via line 127 to the input of frequency doubler 128, whose output is connected via line 129 to a first input of modulator 130. Terminal 131 is connected via line 132 to the input of frequency tripler 133, whose output is connected via line 134 to a second input of modulator 130. The output of modulator 130 is connected via line 135 to the input of filter 136, whose output is connected via line 137 to terminal 138.

For purposes of analysis, the terminal 126, line 127 input signal will be expressed as $\sin(\omega t+\theta)$, where $\omega$ is the angular frequency of the carrier signal and $\theta$ is the phase shift which is to be multiplied. The terminal 131 line 132 phase reference signal will be expressed as $\sin(\omega t)$. Frequency doubler 128 is of substantially the same form as frequency doubler 113 of FIG. 5. Frequency doubler 128 is assumed to be a circuit which doubles the frequency by squaring the input signal and removing the DC component in the squared signal via a frequency selective filtering operation. The resulting frequency doubler 128 output signal on line 129 is of the form $-\cos(2\omega t+2\theta)$.

Frequency tripler 133 generates a signal on line 134 of frequency $3\omega t$. Line 134 may be connected to other phase shift multipliers of the general form of FIG. 6, so that it is not necessary to duplicate frequency tripler 133 in such additional phase shift multipliers. In a common form of frequency multiplier, the frequency multiplication is performed by a non-linear operation upon the input signal to generate harmonics, followed by frequency selective filtering to select the desired harmonic. In the case of a tripler, the use of an odd non-linear operation will cause the generation of primarily odd harmonics. For purposes of analysis, it will be assumed that the non-linear operation in frequency tripler 133 of FIG. 6 can be represented approximately as a cubing of the input signal. Then, from trigonometry:

$$\sin^3(\omega t) = (\tfrac{3}{4})\sin(\omega t) - (\tfrac{1}{4})\sin(3\omega t)$$

Neglecting any phase shift in the frequency selective filter, the frequency tripled output of frequency tripler 133 on line 134 may be expressed as $-\sin(3\omega t)$.

Modulator 130 is similar to modulator 115 of FIG. 5, and is a balanced modulator such that the line 135 output signal is substantially proportional to the product of the line 129 and line 134 input signals. Since the line 129 and 134 input signals are $-\cos(2\omega t+2\theta)$ and $-\sin(3\omega t)$, the line 135 output signal will be:

$$\cos(2\omega t+2\theta)\sin(3\omega t) = \tfrac{1}{2}(\sin(5\omega t+2\theta) - \sin(-\omega t+2\theta))$$

Filter 136 is a frequency selective filter which will pass signals with a frequency of $\omega t$, but reject signals with substantially higher or lower frequencies. Neglecting any phase shift within filter 136, the line 137, terminal 138 output of filter 136 will be $\sin(\omega t-2\theta)$. Thus, the circuit of FIG. 6 will provide an output signal on terminal 138 of the same frequency as the input signal on terminal 126, but with twice the phase shift relative to the terminal 131 phase reference signal.

The direction of the phase shift is reversed at the same time that it is doubled by the circuit of FIG. 6. While this phase shift reversal must be considered in the design of a system using the phase shift multiplier of FIG. 6, it is otherwise generally of little consequence. An advantage of the circuit of FIG. 6 in some instances is that the two line 135 modulator output signal components differ in frequency by a ratio of one to five. The corresponding ratio for the line 118 modulator output signal components of FIG. 5 is one to three. The one to five signal frequency ratio of the system of FIG. 6 can facilitate the filtering operation to select the desired $\omega t$ frequency signal.

FIG. 7 is a diagrammatic illustration of a third form of phase shift multiplier circuit, incorporating frequency doubling followed by a single sideband modulation type frequency subtraction operation, which may be used for phase shift multipliers 43, 47 and 51 of FIG. 1 and/or in other systems shown in this disclosure. FIG. 7 includes phase signal input terminal 141, phase reference signal input terminal 150 and output terminal 161. Terminal 141 is connected via line 142 to the input of frequency doubler 143, whose output is connected via line 144 to the input of phase shift 145. A first output of phase shift 145 is connected via line 146 to a first input of modulator 147. A second output of phase shift 145 is connected via line 148 to a first input of modulator 149. Terminal 150 is connected via line 151 to the input of phase shift 152. A first and second output of phase shift 152 are connected to lines 153 and 154, respectively. Line 153 is connected to a second input of modulator 147, and line 154 is connected to a second input of modulator 149. The output of modulator 147 is connected via line 155 to a first input of summing circuit 156. The output of modulator 149 is connected via line 157 to a second input of summing circuit 156. The output of summing circuit 156 is connected via line 158 to the input of filter 159, whose output is connected via line 160 to terminal 161.

For purposes of analysis, the terminal 141, line 142 input signal will be expressed as $\sin(\omega t+\theta)$, where $\omega$ is the angular frequency of the carrier signal and $\theta$ is the phase shift which is to be multiplied. The terminal 150, line 151 phase reference signal will be expressed as $\sin(\omega t)$. Frequency doubler 143 is of substantially the same form as frequency doubler 113 of FIG. 5. Frequency doubler 143 is assumed to be a circuit which doubles the frequency by squaring the input signal and removing the DC component in the squared signal via a frequency selective filtering operation. The resulting frequency doubler 143 output signal on line 144 will be a signal of the form $-\cos(2\omega t+2\theta)$. Phase shift 145 provides two output signals on lines 146 and 148 of the form $-\cos(2\omega t+2\theta)$ and $\sin(2\omega t+2\theta)$, respectively. The line 146 output signal is substantially similar to the line 144 input signal while the link 148 output signal is shifted 90°. Phase shift 152 generates two output signals on lines 153 and 154 of the form $\sin(\omega t)$ and $\cos(\omega t)$, respectively. Lines 153 and 154 may be extended to provide these signals to other phase shift multipliers generally of the form of FIG. 7, so that phase shift 152 need not be duplicated in such phase shift multipliers.

Modulators 147 and 149 are balanced modulators, similar to modulator 115 of FIG. 5, in which the output signal is substantially proportional to the product of the two input signals. The two inputs to modulator 147 on lines 146 and 153 are $-\cos(2\omega t+2\theta)$ and $\sin(\omega t)$, respectively. Hence, the modulator 147 output signal on line 155 will be:

$$-\cos(2\omega t+2\theta)\sin(\omega t) = -\tfrac{1}{2}(\sin(3\omega t+2\theta) + \sin(\omega t+2\theta))$$

The two inputs to modulator 149 on lines 148 and 154 are $\sin(2\omega t+2\theta)$ and $\cos(\omega t)$, respectively. Hence, the modulator 149 output signal on line 157 will be:

$$\sin(2\omega t+2\theta)\cos(\omega t) = \tfrac{1}{2}(\sin(3\omega t+2\theta) + \sin(\omega t+2\theta))$$

Summing circuit 156 is a circuit which sums or averages the two input signals on lines 155 and 157. Hence, the line 158 signal will be:

$$\sin(\omega t+2\theta)$$

The purpose of filter 159 is to reject noise and signals at frequencies other than ωt, which may be due to imperfect frequency multiplication and/or modulation operations. The output of filter 159 on line 160 and terminal 161 will be sin(ωt+2θ). Thus, the circuit of FIG. 7 will provide an output signal on terminal 161 of the same frequency as the terminal 141 input signal, but with twice the phase shift relative to the terminal 150 phase reference signal. An advantage of the circuit of FIG. 7 is that relatively little in the way of signal selection may be required of filter 159, and it can have a correspondingly rapid response to phase shifts of the signals passing therethrough.

Figure 8:
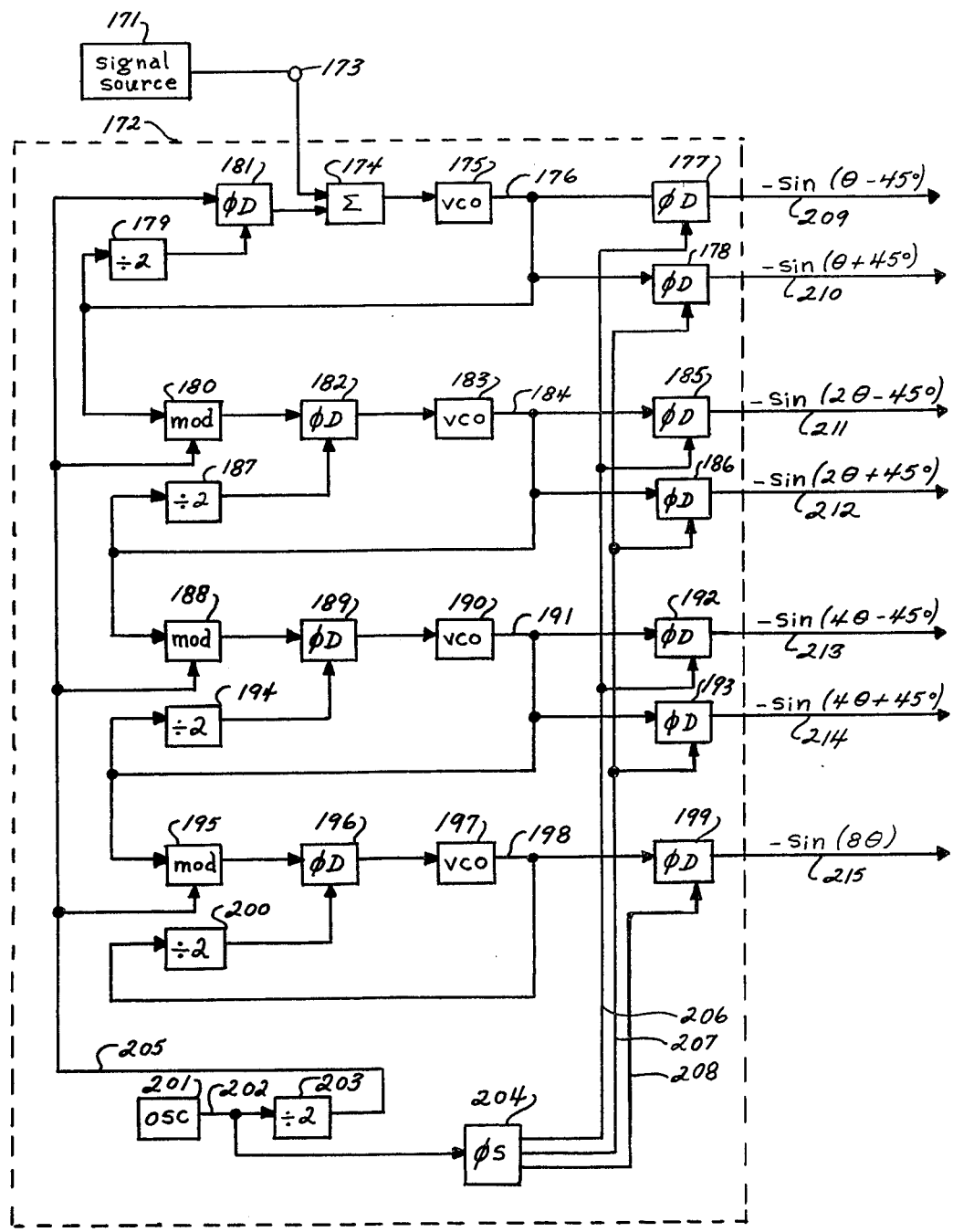
FIG. 8 is a diagrammatic illustration of a second form of phase shift multiplication section, incorporating phase locked loop circuits, which may be used for the phase shift multiplication section of the system of FIG. 1 and/or in other systems shown in this disclosure.

FIG. 8 is a diagrammatic illustration of a second form of phase shift multiplication section, incorporating phase locked loop circuits, which may be used for phase shift multiplication section 32 of FIG. 1 and/or in other systems shown in this disclosure. FIG. 8 includes a signal source 171 and a phase shift multiplication section 172. The output of signal source 171 is connected to terminal 173. Within phase shift multiplication section 172, terminal 173 is connected to a first input of summing circuit 174. The output of summing circuit 174 is connected to the control input of voltage controlled oscillator 175. The output of voltage controlled oscillator 175 is connected via line 176 to phase signal inputs of phase detectors 177 and 178, to the input of frequency divider 179 and to a first input of modulator 180. The output of frequency divider 179 is connected to a first input of phase detector 181, whose output is connected to a second input of summing circuit 174. The output of modulator 180 is connected to a first input of phase detector 182, whose output is connected to the control input of voltage controlled oscillator 183. The output of voltage controlled oscillator 183 is connected via line 184 to phase signal inputs of phase detectors 185 and 186, to the input of frequency divider 187 and to a first input of modulator 188. The output of frequency divider 187 is connected to a second input of phase detector 182. The output of modulator 188 is connected to a first input of phase detector 189, whose output is connected to the control input of voltage controlled oscillator 190. The output of voltage controlled oscillator 190 is connected via line 191 to phase signal inputs of phase detectors 192 and 193, to the input of frequency divider 194 and to a first input of modulator 195. The output of frequency divider 194 is connected to a second input of phase detector 189. The output of modulator 195 is connected to a first input of phase detector 196, whose output is connected to the control input of voltage controlled oscillator 197. The output of voltage controlled oscillator 197 is connected via line 198 to a phase signal input of phase detector 199 and to the input of frequency divider 200. The output of frequency divider 200 is connected to a second input of phase detector 196. The output of oscillator 201 is connected via line 202 to the input of frequency divider 203 and to the input of phase shift 204. The output of frequency divider 203 is connected via line 205 to a second input of phase detector 181 and to second inputs of modulators 180, 188 and 195. A first output of phase shift 204 is connected via line 206 to phase reference inputs of phase detectors 177, 185 and 192. A second output of phase shift 204 is connected via line 207 to phase reference inputs of phase detectors 178, 186 and 193. A third output of phase shift 204 is connected via line 208 to a phase reference input of phase detector 199. The outputs of phase detectors 177, 178, 185, 186, 192, 193 and 199 are connected to lines 209, 210, 211, 212, 213, 214 and 215, respectively.

Phase locked loop techniques for the control of the frequency and/or phase of an oscillator have been known for many years. The development of integrated circuit devices for the major functional components has made the use of phase locked loop circuits more convenient and economical. FIG. 8 is an illustration of the use of phase locked loop techniques for a phase shift multiplication section which may be used for phase shift multiplication section 32 of FIG. 1. If phase shift multiplication section 172 is used for phase shift multiplication section 32, lines 209 through 215 would be connected to lines 57 through 63 of FIG. 1, respectively. Signal source 171 corresponds to signal source 31 of FIG. 1. In FIG. 8, it is assumed that signal source 171 is a source of an electrical analog signal which is connected to terminal 173.

Except for phase shift 204, all of the circuit elements within phase shift multiplication section 172 are commercially available as integrated circuit devices. A number of the integrated circuit devices will require external components to perform their intended functions. For example, voltage controlled oscillators 175, 183, 190 and 197 will normally require an external capacitor and/or other elements to complete the oscillator circuit. Phase detectors 181, 182, 189, 196, 177, 178, 185, 186, 192, 193 and 199 will normally require low pass filtering to reduce the magnitude of the carrier and high frequency ripple components in their output signals. Frequency dividers 179, 187, 194, 200 and 203 may be, for example, binary counter flip-flop devices. Phase shift 204 may be, for example, a simple passive phase shift network. Such phase shift networks are well known.

Phase shift multiplication section 172 consists of four phase locked loop circuits, around the four voltage controlled oscillators 175, 183, 190 and 197. Oscillator 201, frequency divider 203 and phase shift 204 provide certain reference signals which synchronize the operation of the individual phase locked loops and output phase detectors 177, 178, 185, 186, 192, 193 and 199.

The first phase locked loop circuit consists of summing circuit 174, voltage controlled oscillator 175, frequency divider 179 and phase detector 181. For purposes of analysis, the output frequency of oscillator 201 on line 202 will be expressed as 2f. The line 205 signal will then have a frequency of f. Voltage controlled oscillator 175 has a nominal output frequency of 2f. Summing circuit 174 may be, for example, an operational amplifier circuit whose output is the inverted sum of the two input signals. If the terminal 173 signal is zero, the summing circuit 174 output signal will be substantially equal to the inverse of the phase detector 181 output signal. The phase locked loop circuit of voltage controlled oscillator 175 will lock in such that the output of frequency divider 179 corresponds in frequency and phase to the line 205 reference signal. The line 176 signal will have a frequency of 2f and its phase will correspond to the phase of the line 205 reference signal. If the terminal 173 signal is of a value other than zero, the phase locked loop circuit of voltage controlled oscillator 175 will control the phase of oscillator 175 so that the summing circuit 174 output signal remains at a value corresponding to an oscillator 175 output frequency of 2f. Since the summing circuit 174 output remains substantially constant, the output of phase detector 181 will be of substantially the same magnitude as the terminal 173 signal, but of opposite polarity. The phase detector 181 output signal will normally include whatever constant value is required to maintain the oscillator 175 frequency at $2f$.

Thus, the phase locked loop circuit of voltage controlled oscillator 175 is a phase modulation circuit in which the phase of the line 176 signal, relative to the line 205 reference signal, corresponds to the terminal 173 analog input signal. The accuracy and linearity of this phase modulation will be determined largely by the accuracy and linearity of phase detector 181. For moderate phase deviations, this accuracy and linearity can be quite high.

The second phase locked loop circuit, including voltage controlled oscillator 183, acts as a phase shift doubler. Modulator 180 modulates the line 176 $2f$ frequency signal with the line 205 reference signal. The significant component of the modulator 180 output signal is a signal of frequency $f$ with a phase shift which is equal in time but of twice the angle as the phase shift of the line 176 signal, relative to the line 205 reference signal. The loop consisting of phase detector 182, voltage controlled oscillator 183 and frequency divider 187 acts as a frequency doubler, generating a $2f$ frequency signal on line 184. The line 184 signal retains the doubled angular phase shift value of the modulator 180 output signal. The line 176 and 184 signals will both have the same frequency of $2f$. However, the phase shift of the line 184 signal will be double that of the line 176 signal, relative to the line 205 reference signal.

The voltage controlled oscillator circuit including voltage controlled oscillators 190 and 197 similarly generate signals of frequency $2f$ on lines 191 and 198, but of four and eight times the phase shift of the line 176 signal respectively. Phase shift 204 provides phase reference signals on lines 206, 207 and 208 to output phase detectors 177, 178, 185, 186, 192, 193 and 199. These output phase detectors generate logic level signals from the phase signals on lines 176, 184, 191 and 198 in the general manner described for output phase detectors 41, 42, 45, 46, 49, 50 and 53 of phase shift multiplication section 32 of FIG. 1.

Depending on the particular phase locked loop circuit components used and their characteristics, it may be necessary to introduce other and/or additional phase shifts in the circuit of phase shift multiplication section 173 and/or to alter the order to the connections to and from phase detectors 177, 178, 185, 186, 192, 193 and 199.

Figure 9:
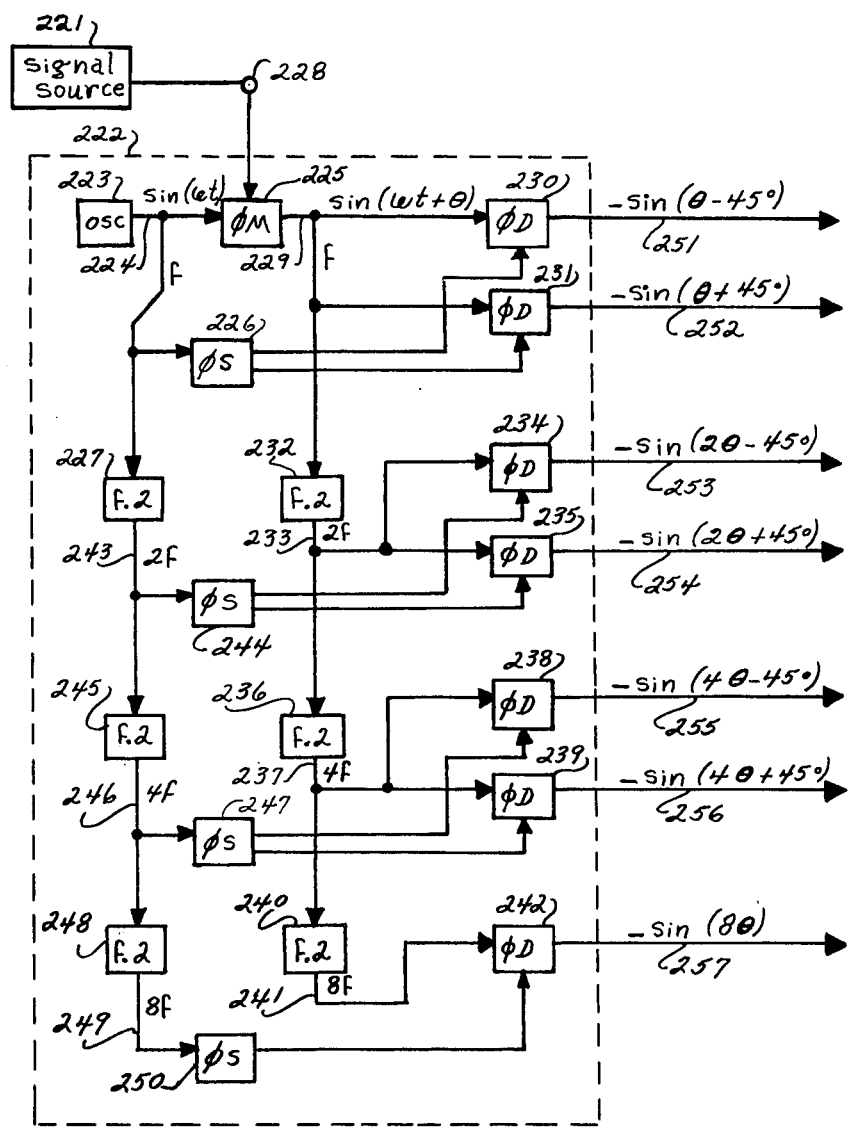
FIG. 9 is a diagrammatic illustration of a third form of phase shift multiplication section, in which the frequencies of the phase signals are one, two, four and eight times the frequency of the phase modulator output signal, which may be used for the phase shift multiplication section of the system of FIG. 1 and/or in other systems shown in this disclosure.

FIG. 9 is a diagrammatic illustration of a third form of phase shift multiplication section, in which the frequencies of the phase signals are one, two, four and eight times the frequency of the phase modulator output signal, which may be used for phase shift multiplication section 32 of FIG. 1 and/or in other systems shown in this disclosure. FIG. 9 includes a signal source 221 and a phase shift multiplication section 222. Within phase shift multiplication section 222, the output of oscillator 223 is connected via line 224 to the carrier signal input of phase modulator 225, and to the inputs of phase shift 226 and frequency doubler 227. The output of signal source 221 is connected to terminal 228 which is connected to the modulation signal input of phase modulator 225. The output of phase modulator 225 is connected via line 229 to phase signal inputs of phase detectors 230 and 231, and to the input of frequency doubler 232. The two outputs of phase shift 226 are connected to the phase reference inputs of phase detectors 230 and 231. The output of frequency doubler 232 is connected via line 233 to phase signal inputs of phase detectors 234 and 235, and to the input of frequency doubler 236. The output of frequency doubler 236 is connected via line 237 to phase signal inputs of phase detectors 238 and 239, and to the input of frequency doubler 240. The output of frequency doubler 240 is connected via line 241 to a phase signal input of phase detector 242. The output of frequency doubler 227 is connected via line 243 to the input of phase shift 244 and to the input of frequency doubler 245. The two outputs of phase shift 244 are connected to the phase reference inputs of phase detectors 234 and 235. The output of frequency doubler 245 is connected via line 246 to the input of phase shift 247 and to the input of frequency doubler 248. The two outputs of phase shift 247 are connected to the phase reference inputs of phase detectors 238 and 239. The output of frequency doubler 248 is connected via line 249 to the input of phase shift 250, whose output is connected to a phase reference input of phase detector 242. The outputs of phase detectors 230, 231, 234, 235, 238, 239 and 242 are connected to lines 251, 252, 253, 254, 255, 256 and 257, respectively.

Phase shift multiplication section 32 of FIG. 1 includes a set of phase shift multipliers which provide a series of multiplied phase shift signals at substantially the same carrier frequency, the output frequency of oscillator 36. This generation of a set of multiplied phase shift signals at substantially the same carrier frequency is convenient for the phase detection process and allows the phase shift multiplication process to be repeated many times. However, it is not necessary that the multiplied phase shift signals be generated at the same carrier frequency. FIG. 9 is an illustration of a phase shift multiplication section in which the multiplied phase shift signals are generated at progressively higher carrier frequencies.

The output signal of oscillator 223 on line 224 is a signal of frequency $f$ and may be represented as $\sin(\omega t)$, where $\omega$ is the angular frequency of the oscillator 223 output signal. The output of phase modulator 225 on line 229 will also be a signal of frequency $f$ and may be represented as $\sin(\omega t + \theta)$, where $\theta$ is the phase modulation corresponding to the terminal 228 signal. Phase shift 226 provides phase reference signals to phase detectors 230 and 231 of frequency $f$, so that their output signals on lines 251 and 252 correspond to $-\sin(\theta - 45°)$ and $-\sin(\theta + 45°)$, respectively. Frequency doubler 227 doubles the frequency of the line 224 signal and generates a signal on line 243 of frequency $2f$ which may be represented as $\sin(2\omega t)$. Frequency doubler 232 doubles the frequency of the line 229 signal and generates a signal on line 233 of frequency $2f$ which may be represented as $\sin(2\omega t + 2\theta)$. The frequency doubling operation doubles both the frequency and the angular phase shift. Phase shift 244 provides phase reference signals of frequency $2f$ to phase detectors 234 and 235 so that their output signals on lines 253 and 254 correspond to $-\sin(2\theta - 45°)$ and $-\sin(2\theta + 45°)$, respectively. Similarly, the line 246 signal is a signal of frequency $4f$ of the form $\sin(4\omega t)$ and the line 237 signal is a signal of frequency $4f$ of the form $\sin(4\omega t + 4\theta)$. The phase detector 238 and 239 output signals on lines 255 and 256 correspond to $-\sin(4\theta - 45°)$ and $-\sin(4\theta + 45°)$, respectively. The line 249 signal is a signal of frequency $8f$ of the form $\sin(8\omega t)$ and the line 241 signal is a signal of frequency $8f$ of the form $\sin(8\omega t + 8\theta)$. The phase detector 242 output signal on line 257 corresponds to $-\sin(8\theta)$.

Since only the polarities of the $-\sin(\theta-45°)$, $-\sin(\theta+45°)$, $-\sin(2\theta-45°)$, $-\sin(2\theta+45°)$, $-\sin(4\theta-45°)$, $-\sin(4\theta+45°)$ and $-\sin(8\theta)$ functions are used in the analog-to-digital conversion process, the phase shift multiplication section 222 output signals representing the polarities of the corresponding functions and need not otherwise indicate the actual amplitudes of the functions. The output signals on lines 251 through 257 of phase shift multiplication section 222 correspond to the output signals of phase shift multiplication section 32 on lines 57 through 63. Hence, phase shift multiplication section 222 may be substituted for phase shift multiplication section 32 in the system of FIG. 1.

Figure 10:
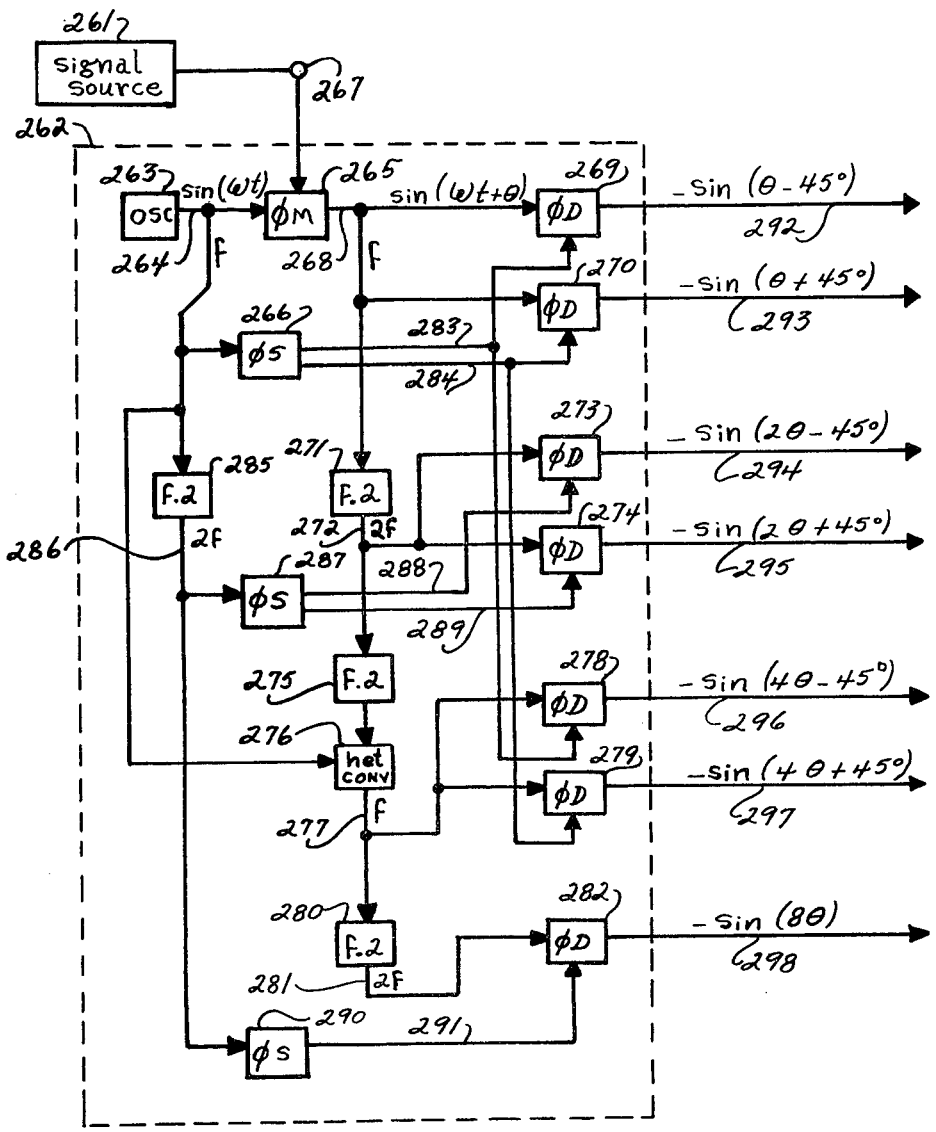
FIG. 10 is a diagrammatic illustration of a fourth form of phase shift multiplication section, in which the frequencies of the phase signals are alternately one and two times the frequency of the phase modulator output signal, which may be used for the phase shift multiplication section in the system of FIG. 1 and/or in other systems shown in this disclosure.

FIG. 10 is a diagrammatic illustration of a fourth form of phase shift multiplication section, in which the frequencies of the phase signals are alternately one and two times the frequency of the phase modulator output signal, which may be used for phase shift multiplication section 32 of FIG. 1 and/or in other systems shown in this disclosure. FIG. 10 includes a signal source 261 and a phase shift multiplication section 262. Within phase shift multiplication section 262, the output of oscillator 263 is connected via line 264 to a carrier signal input of phase modulator 265, to inputs of phase shift 266 and frequency doubler 285, and to a reference signal input of heterodyne converter 276. The output of signal source 261 is connected to terminal 267, which is connected to a modulation signal input of phase modulator 265. The output of phase modulator 265 is connected via line 268 to phase signal inputs of phase detectors 269 and 270, and to the input of frequency doubler 271. The output of frequency doubler 271 is connected via line 272 to phase signal inputs of phase detectors 273 and 274, and to the input of frequency doubler 275. The output of frequency doubler 275 is connected to a signal input of heterodyne converter 276, whose output is connected via line 277 to phase signal inputs of phase detectors 278 and 279, and to the input of frequency doubler 280. The output of frequency doubler 280 is connected via line 281 to a phase signal input of phase detector 282. A first output of phase shift 266 is connected via line 283 to phase reference inputs of phase detectors 269 and 278. A second output of phase shift 266 is connected via line 284 to phase reference inputs of phase detectors 270 and 279. The output of frequency doubler 285 is connected via line 286 to the inputs of phase shifts 287 and 290. A first output of phase shift 287 is connected via line 288 to a phase reference input of phase detector 273. A second output of phase shift 287 is connected via line 289 to a phase reference input of phase detector 274. The output of phase shift 290 is connected via line 291 to a phase reference input of phase detector 282. The outputs of phase detectors 269, 270, 273, 274, 278, 279 and 282 are connected to lines 292, 293, 294, 295, 296, 297 and 298, respectively.

Phase shift multiplication section 32 of FIG. 1 illustrates a system in which a series of multiplied phase shift signals are generated at substantially the same carrier frequency. FIG. 9 illustrates a phase shift multiplication system in which the carrier frequency is multiplied progressively along with the phase shift. The use of heterodyne and/or other frequency conversion techniques will frequently be useful to avoid having to generate and control signals of undesirably high frequency. However, the maximum carrier frequency may be limited by heterodyne or other frequency conversions without such frequency conversions necessarily being performed as a part of all of the phase shift multiplication operations. FIG. 10 is an illustration of a system in which a heterodyne frequency conversion is used to reduce the maximum carrier frequency, but in which a heterodyne frequency conversion is not performed for all of the phase shift mutiplication operations.

The oscillator 263 output signal on line 264 is a signal of frequency $f$, which may be expressed as $\sin(\omega t)$ where $\omega$ is the angular frequency. The phase modulator 265 output signal on line 268 will also be a signal of frequency $f$, which may be expressed as $\sin(\omega t + \theta)$ where $\theta$ is the phase modulation corresponding to the terminal 267 signal. Phase shift 266 provides phase reference signals of frequency $f$ to the phase reference inputs of phase detectors 269 and 270. Their output signals on lines 292 and 293 correspond to $-\sin(\theta-45°)$ and $-\sin(\theta+45°)$, respectively. Frequency doubler 285 doubles the frequency of the line 264 signal and generates a signal on line 286 of frequency $2f$ which may be expressed as $\sin(2\omega t)$. Frequency doubler 271 doubles the line 268 signal and generates a signal on line 272 of frequency $2f$ of the form $\sin(2\omega t + 2\theta)$. Phase shift 287 provides phase reference signals on lines 288 and 289 to the phase reference inputs of phase detectors 273 and 274. Their outputs on lines 294 and 295 correspond to $-\sin(2\theta-45°)$ and $-\sin(2\theta+45°)$, respectively. Frequency doubler 275 doubles the frequency of the line 272 signal and generates a signal of frequency $4f$ of the form $\sin(4\omega t + 4\theta)$ at its output, which is connected to an input of heterodyne frequency converter 276. Heterodyne converter 276 lowers the frequency of the frequency doubler 275 output signal by $3f$, and generates a signal on line 277 of frequency $f$ of the form $\sin(\omega t + 4\theta)$. The frequency $f$ phase reference signal outputs of phase shift 266 are applied to the phase reference inputs of phase detectors 278 and 279. Their outputs on lines 296 and 297 correspond to $-\sin(4\theta-45°)$ and $-\sin(4\theta+45°)$, respectively. Frequency doubler 280 doubles the frequency of the line 277 signal and generates a signal on line 281 of frequency $2f$ of the form $\sin(2\omega t + 8\theta)$. Phase shift 290 provides a phase reference signal of frequency $2f$ to the phase reference input of phase detector 282. Its output on line 298 corresponds to $-\sin(8\theta)$.

As in the case of the previously described phase shift multiplication sections, the phase detector output signals on lines 292 through 298 are logic level signals corresponding to the polarities of the $-\sin(\theta-45°)$, $-\sin(\theta+45°)$, $-\sin(2\theta-45°)$, $-\sin(2\theta+45°)$, $-\sin(4\theta-45°)$, $-\sin(4\theta+45°)$ and $-\sin(8\theta)$ functions, and do not otherwise represent the amplitudes thereof. Thus, the output signals on lines 292 through 298 correspond to the output signals of phase shift multiplication section 32 on lines 57 through 63. Phase shift multiplication section 262 of FIG. 10 may be substituted for phase shift multiplication section 32 in the system of FIG. 1.

Figure 11:
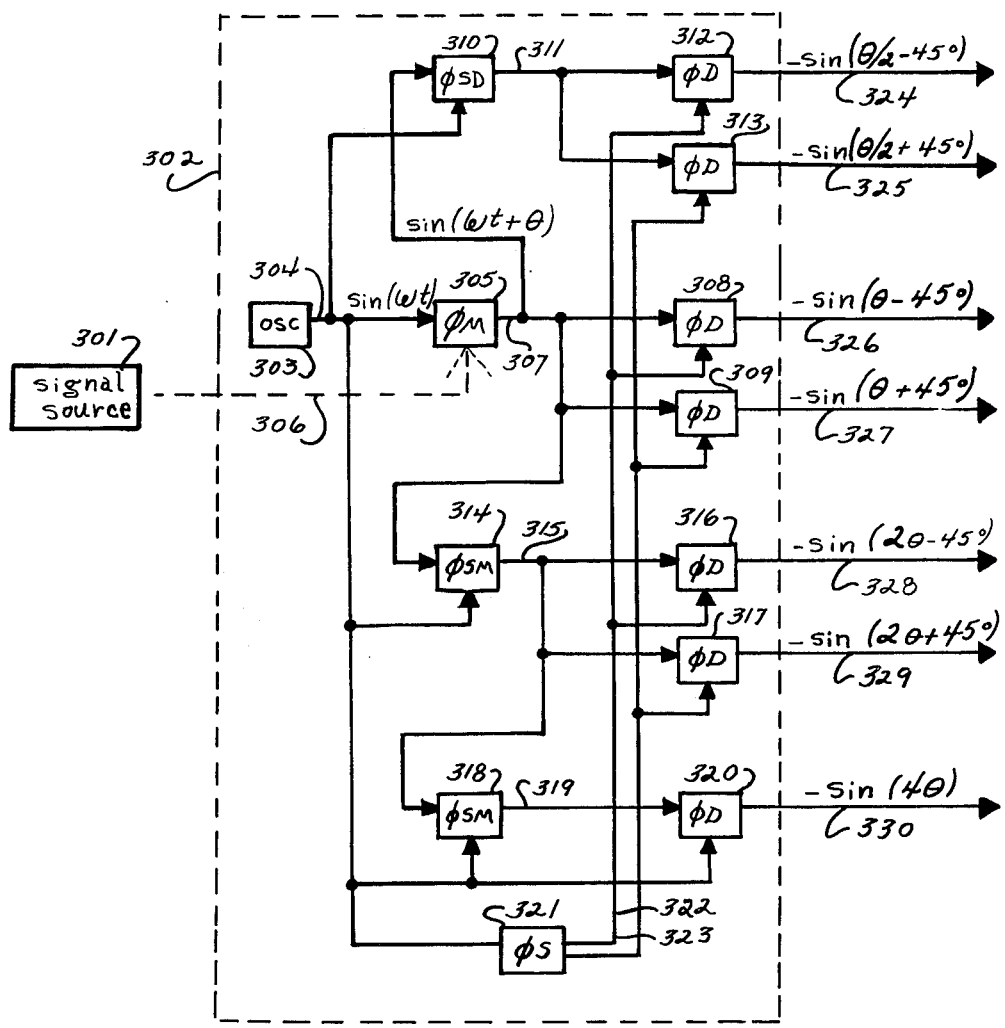
FIG. 11 is a diagrammatic illustration of a fifth form of phase shift multiplication section, incorporating a phase shift divider, which may be used for the phase shift multiplication section in the system of FIG. 1 and/or in other systems shown in this disclosure.

FIG. 11 is a diagrammatic illustration of a fifth form of phase shift multiplication section, incorporating a phase shift divider, which may be used for phase shift multiplication section 32 of FIG. 1 and/or in other systems shown in this disclosure. FIG. 11 includes a signal source 301 and a phase shift multiplication section 302. Within phase shift multiplication section 302, the output of oscillator 303 is connected via line 304 to a carrier signal input of phase modulator 305, to phase reference inputs of phase shift divider 310, phase shift multipliers 314 and 318, and phase detector 320 and to the input of phase shift 321. Signal source 301 is connected via link 306 to the modulation signal input of phase modulator 305. The output of phase modulator 305 is connected via line 307 to phase signal inputs of phase shift divider 310, phase detectors 308 and 309, and phase shift multiplier 314. The output of phase shift divider 310 is connected via line 311 to phase signal inputs of phase detectors 312 and 313. The output of phase shift multiplier 314 is connected via line 315 to phase signal inputs of phase detectors 316 and 317 and phase shift multiplier 318. The output of phase shift multiplier 318 is connected via line 319 to a phase signal input of phase detector 320. A first output of phase shift 321 is connected via line 322 to phase reference inputs of phase detectors 308, 312 and 316. A second output of phase shift 321 is connected via line 232 to phase reference inputs of phase detectors 309, 313 and 317. The outputs of phase detectors 312, 313, 308, 309, 316, 317 and 320 are connected to lines 324, 325, 326, 327, 328, 329 and 330, respectively.

The previously described systems have employed phase shift multipliers for the digital measurement of a phase shift angle over a 360° range. If the actual range of the phase shift or phase modulation does not exceed 360°, there will be no measurement ambiguity. However, certain types of phase modulators such as resolver type phase shifters are capable of shifting a signal phase through a number of complete 360° cycles. If such wide range phase modulators are used, a system such as that of FIG. 1 will provide a measurement of the phase shift angle on its 0° to 360° scale, but will not indicate directly how many complete 360° cycles the phase may have shifted from a reference value. If the rate of phase shift is not too high, a digital computer or other digital data receiver can perform appropriate cycle counting operations and determine the total phase shift from a reference value. However, in some instances, it may be desirable to provide such cycle counting capabilities in the analog-to-digital conversion system itself. FIG. 11 is an illustration of a system which employs a phase shift divider to provide such a cycle counting capability.

The arrangement and operation of phase shift multiplication section 302 of FIG. 11 generally resembles the arrangement and operation of phase shift multiplication section 32 of FIG. 1, except for the use of phase shift divider 310. The oscillator 303 output signal on line 304 may be expressed as $\sin(\omega t)$, where $\omega$ is the angular frequency. The phase modulator 305 output signal on line 307 is of the form $\sin(\omega t + \theta)$, where $\theta$ is the phase modulation angle corresponding to the signal from signal source 301. Signals corresponding to the functions $-\sin(\theta-45°)$, $-\sin(\theta+45°)$, $-\sin(2\theta-45°)$, $-\sin(2\theta+45°)$ and $-\sin(4\theta)$ are generated on lines 326, 327, 328, 329 and 330, respectively, in the general manner of phase shift multiplication section 32.

The output of phase shift divider 310 on line 311 is a signal of the form $\sin(\omega t + \theta/2)$. As shown in FIGS. 5, 6 and 7, phase shift multiplication at a particular frequency may be accomplished by a combination of frequency multiplication, to multiply both the frequency and the phase shift, and heterodyne conversion to shift the carrier frequency back to the original value. Phase shift division may be accomplished in a generally similar manner by a combination of frequency division, to divide the carrier frequency and the phase shift, and heterodyne frequency conversion to shift the carrier frequency to the original value. For example, a phase shift divider may be constructed generally along the lines of FIG. 5 with a frequency divider substituted for frequency doubler 113. The line 114 signal would then have half the frequency and half the angular phase shift of the terminal 111 signal. A reference signal of the form $\sin(\omega t/2)$ would be applied to terminal 116, so that the line 118 signal would include a component of frequency $\omega$ and phase shift $\theta/2$. This $\omega$ frequency component would be selected by filter 119, so that the terminal 121 output signal would be of the form $\sin(\omega t + \theta/2)$.

The outputs of phase detectors 312 and 313 on lines 324 and 325 will correspond to $-\sin(\theta/2-45°)$ and $-\sin(\theta/2+45°)$, respectively. Phase shift multiplication section 302 of FIG. 11 may be substituted for phase shift multiplication section 32 of FIG. 1. Lines 324 through 330 would be connected to lines 57 through 63. The system of FIG. 1 will then measure the phase shift introduced by phase modulator 305 over a digital range of 0 through 15 corresponding to a phase shift range of 0° to 720°. The systems of FIGS. 1 and 11 can thus provide a direct digital indication that the phase shift modulation has gone through one complete 360° cycle and is in a second 360° cycle.

A point which may be significant in systems using phase shift dividers is that phase shift division functions are, in general, multiple valued. For example, if a phase shift value of 40° is to be divided by two, the possible results are 20° and 200°. In general, for the division of a phase shift angle by two, the two possible phase shift values will always be 180° apart. The initial selection of a particular divided phase shift value may be made arbitrarily or on the basis of other considerations. For example, additional circuitry may be used to force the output of a phase shift divider into a particular state whenever the phase modulator output or variable phase signal passes through 0° or some other particular value.

FIG. 12 is a diagrammatic illustration of a second form of the invention, showing the analog-to-digital conversion of an analog input signal into a four-bit binary number and the use of an intermediate Gray code for the resolution of ambiguities. FIG. 12 includes a signal source 336, a phase shift multiplication section 337, a sampling section 338 and a digital computer system 339. Within phase shift multiplication section 337, the output of oscillator 340 is connected via line 341 to a carrier signal input of phase modulator 342, to phase reference inputs of phase shift multipliers 347 and 350, and to the input of phase shift 353. The output of signal source 336 is connected to terminal 343, which is connected to a modulation signal input of phase modulator 342. The output of phase modulator 342 is connected via line 344 to phase signal inputs of phase detectors 345 and 346, and phase shift multiplier 347. The output of phase shift multiplier 347 is connected via line 348 to phase signal inputs of phase detector 349 and phase shift multiplier 350. The output of phase shift multiplier 350 is connected via line 351 to a phase signal input of phase detector 352. A first output of phase shift 353 is connected via line 354 to a phase reference input of phase detector 345. A second output of phase shift 353 is connected via line 355 to phase reference inputs of phase detectors 346, 349 and 352. The outputs of phase detectors 345, 346, 349 and 352 are connected to lines 356, 357, 358 and 359, respectively. Within sampling section 338, lines 356, 357, 358 and 359 are connected to the signal inputs of latches 360, 361, 362 and 363, respectively. The output of latch 360 is connected via line 364 to terminal 365, and to a first input of EXCLUSIVE- OR gate 366. The output of latch 361 is connected via line 367 to a second input of EXCLUSIVE-OR gate 366. The output of EXCLUSIVE-OR gate 366 is connected to terminal 368, and to a first input of EXCLUSIVE-OR gate 369. The output of latch 362 is connected via line 370 to a second input of EXCLUSIVE-OR gate 369. The output of EXCLUSIVE-OR gate 369 is connected to terminal 371, and to a first input of EXCLUSIVE-OR gate 372. The output of latch 363 is connected via line 373 to a second input of EXCLUSIVE-OR gate 372. The output of EXCLUSIVE-OR gate 372 is connected to terminal 374. Terminals 365, 368, 371 and 374 are connected to signal inputs of digital computer system 339. A control signal output of computer system 339 is connected to terminal 375 and, via line 376, to control signal inputs of latches 360, 361, 362 and 363.

Signal source 336 is a source of an analog signal on terminal 343 which is to be converted into a digital number. The functions and operation of the system of FIG. 12 are generally similar to the functions and operation of the system of FIG. 1. The digital data output signals on terminals 365, 368, 371 and 374, and the response of the system to control signals on terminal 375, are similar to the digital data output signals on terminals 74, 80, 87 and 92 of FIG. 1 and the response of that system to control signals on terminal 98. The difference is primarily in the internal structure of phase shift multiplication section 337 and sampling section 338, and in the manner in which possible ambiguities between adjacent digital values are resolved.

The method used for ambiguity resolution in the system of FIG. 1 may be described as a two-phase code system. Two signals of differing angular phase are generated for each bit of the desired binary output number except the least significant bit. In the system of FIG. 1, a total of seven signals are generated by phase shift multiplication section 32 for subsequent conversion into a four-bit binary number. An advantage of the two-phase code system of FIG. 1 is that it is not necessary to provide a particularly exact synchronization of the relative angular phases of the output signals of phase detectors 41, 42, 45, 46, 49, 50 and 53. This facilitates the extension of the general system of FIG. 1 to a larger number of bits. A disadvantage of the two-phase code system is that it requires the generation of a number of signals which is almost twice the number of bits in the resulting binary number.

The system of FIG. 12 shows an alternate method of ambiguity resolution which is based on the Gray binary code. An advantage of the Gray code system of FIG. 12 is that a smaller number of signals and a smaller number of phase detectors and other circuit elements are required. A disadvantage of the Gray code system of FIG. 12 is that it is necessary to maintain a more exact synchronization of the relative angular phases of the output signals of phase detectors 345, 346, 349 and 352.

The outputs of phase detectors 345, 346, 349 and 352 are connected to the signal inputs of latches 360, 361, 362 and 363, respectively, whose outputs are logic level signals with values of zero (low) or one (high) in response to low or high values of the input signals at the time of sampling. The latches are controlled by the signals on terminal 375 and line 376 from computer system 339. The operation of latches 360 through 363 under the control of the terminal 375 signal from computer system 339 is in the general manner illustrated in FIG. 3 and described in connection with the system of FIG. 1. The network of logical gates between latches 360 through 363 and output terminals 365, 368, 371 and 374 resolves any ambiguities and generates a four-bit binary number signal on those output terminals. This digital number is transmitted to computer system 339. The most significant but signal is on terminal 365 and the least significant bit signal is on terminal 374. The latches and logical gates in the system of FIG. 12 may be, for example, standard 7400 series TTL integrated circuit devices.

FIGS. 13A through 13H illustrate the analog-to-digital conversion process of the system of FIG. 12 in greater detail. FIGS. 13A, 13B, 13C and 13D are plots of the logic level signals on lines 356, 357, 358 and 359, respectively, plotted as functions of the value of $\theta$, the phase shift introduced by phase modulator 342, over a 0° to 360° scale. The 0° to 360° scale is specifically marked on FIGS. 13A and 13E. The 0° to 360° range is also divided into 16 segments of 22.5° each. The individual segments are identified as segments 0 through 15 and are specifically marked on FIGS. 13B and 13F. The signals shown in FIGS. 13A through 13H are logic level signals which are normally either high or low and, in general, not of an intermediate value.

FIG. 13A is a plot of the logic level signal on line 356 which corresponds to the polarity of $-\sin(\theta)$ plotted as a function of $\theta$. FIG. 13A is also a plot of the signal on line 364, the output of latch 360, plotted as a function of the value of $\theta$ at the most recent time of sampling by latch 360. The plots of the line 356 and line 364 signals are identical in form. However, as in the case of the signals plotted in FIGS. 4A–4K, the significance of the horizontal scale is not exactly the same for the line 356 and 364 signals. Similarly, FIGS. 13B, 13C and 13D are plots of the line 357, 358 and 359 signals corresponding to the polarities of $-\cos(\theta)$, $-\cos(2\theta)$ and $-\cos(4\theta)$, respectively, plotted as functions of $\theta$. They are also plots of the line 367, 370 and 373 signals plotted as functions of the value of $\theta$ at the most recent time of sampling by latches 361, 362 and 363. FIG. 13E is a plot of the terminal 365 signal, the most significant bit of the four-bit binary number resulting from the analog-to-digital conversion. FIGS. 13F, 13G and 13H are plots of the terminal 368, 371 and 374 signals, the three less significant bits of the binary number.

Now consider the operation of the network of logical gates between latches 360 through 363, and terminals 365, 368, 371 and 374. Latch output line 364 is connected directly to data output terminal 365, so that the plots of FIGS. 13A and 13E are substantially identical. The line 364, terminal 365 signal plotted in FIGS. 13A and 13E is the most significant bit of the four-bit binary number resulting from the analog-to-digital conversion. Lines 364 and 367 are connected to the two inputs of EXCLUSIVE-OR gate 366. Hence, the terminal 368 signal plotted in FIG. 13F is the result of an EXCLUSIVE-OR operation upon the line 364 and line 367 signals plotted in FIGS. 13A and 13B. As may be seen, the signals plotted in FIGS. 13E and 13F follow the typical pattern of the two most significant bits of a binary number. In a similar manner, the terminal 371 and terminal 374 signals plotted in FIGS. 13G and 13H are generated as a result of EXCLUSIVE-OR operations in accordance with the connections shown in FIG. 12.

As may be seen, the line 364, 367, 370 and 373 signals plotted in FIGS. 13A through 13D follows the typical pattern of a Gray code representation of a binary number on a scale of 0 through 15. Similarly, the terminal 365, 368, 371 and 374 signals plotted in FIGS. 13E through 13H follow the typical pattern of a four-bit binary number over a range of 0 through 15.

As an example, consider the measurement of an analog signal with a value of slightly more than 6/16 of full scale at the time of sampling as indicated by dotted line 380 in FIGS. 13A through 13H. This is the same signal value as was used as an example for the description of the operation of the system of FIG. 1. The polarity of the $-\sin(\theta)$ function sensed by phase detector 345 will be negative, so that the logic level signal on line 364 will be low as indicated by FIG. 13A. The values of the logic level signals on lines 367, 370 and 373 will be as shown in FIGS. 13B, 13C and 13D, respectively.

The low value of the line 364 and terminal 365 signal gives a low or zero value for the $2^3$ or most significant bit of the binary number. The low signal on terminal 365, the high signal on line 367 and the EXCLUSIVE-OR operation performed by EXCLUSIVE-OR gate 366 cause the terminal 368 signal to be high as shown in FIG. 13F. This gives a high or one value for the $2^2$ or four bit of the binary number. The high value of the terminal 368 signal, the low value of the line 370 signal and the EXCLUSIVE-OR operation performed by EXCLUSIVE-OR gate 369 cause the terminal 371 signal to be high as shown in FIG. 13G. This gives a high or one value for the $2^1$ or two bit of the binary number. The high values of the terminal 371 and line 373 signals and the EXCLUSIVE-OR operation performed by EXCLUSIVE-OR gate 372 cause the terminal 374 signal to be low as shown in FIG. 13H. This gives a low or zero value for the $2^0$ or least signal bit of the binary number.

The digital number resulting from the measurement of the analog signal represented by dotted line 380 is binary 0110 or decimal 6. As may be seen in FIGS. 13B and 13F, dotted line 380 is in angular segment 6. Thus, the system of FIG. 12 has performed an analog-to-digital conversion of the signal represented by dotted line 380. As shown in FIGS. 13A through 13H, the system of FIG. 12 will generate digital numbers from 0 through 15 for analog inputs corresponding to phase shift values over a range of 0° to 360°.

In the two-phase code ambiguity resolution process, as illustrated in the system of FIG. 1, the selection of a signal for each bit of the output binary number, except the least significant bit, is controlled by the value of the adjacent less significant bit. In the Gray code ambiguity resolution process, as illustrated in the system of FIG. 12, the value of each bit of the resulting binary number, except the most significant bit, is controlled in part by the value of the adjacent more significant bit.

Although the system of FIG. 12 has the advantage of requiring fewer circuit elements than the system of FIG. 1, it is more subject to certain types of errors and is, in general, less suitable for extension to a large number of bits and a correspondingly high accuracy and/or resolution. However, as will be shown subsequently in FIG. 14, the general approach of the system of FIG. 12 can be useful in providing a moderate extension of the accuracy and/or resolution of a converter system constructed in accordance with the subject invention.

The nature of the Gray code and the operation of the system of FIG. 12 are such that only one of the four signals plotted in FIGS. 13A through 13D will change between any two adjacent digital values. Hence, if any one of the functions sensed by phase detectors 345, 346, 349 and 352 is near zero at the sampling time, and its sensed polarity and the value of the corresponding latch output signal are perhaps incorrect, it will at most cause an error of one in the resulting digital value. However, with the Gray code process, it is in general necessary that all of the logical signals, not just those associated with the least significant bit, be generated with an accuracy and resolution corresponding to the desired accuracy and/or resolution of analog-to-digital conversion.

As an example, consider the effects of a 1° error in the sensing of the polarity of the $-\sin(\theta)$ function by phase detector 345 and a corresponding 1° error in the 180° transition point of the line 364 signal plotted in FIG. 13A. This will cause a 1° error in the transition point of the output binary number between digital values 7 and 8. In the two-phase code system in FIG. 1, a moderate error in the generation of any logical function except the one associated with the least significant bit will not cause an error in the transition points of the output digital values. Hence, the two-phase code system of FIG. 1 is, in general, more suitable for high accuracy and/or resolution conversion systems.

Figure 14:
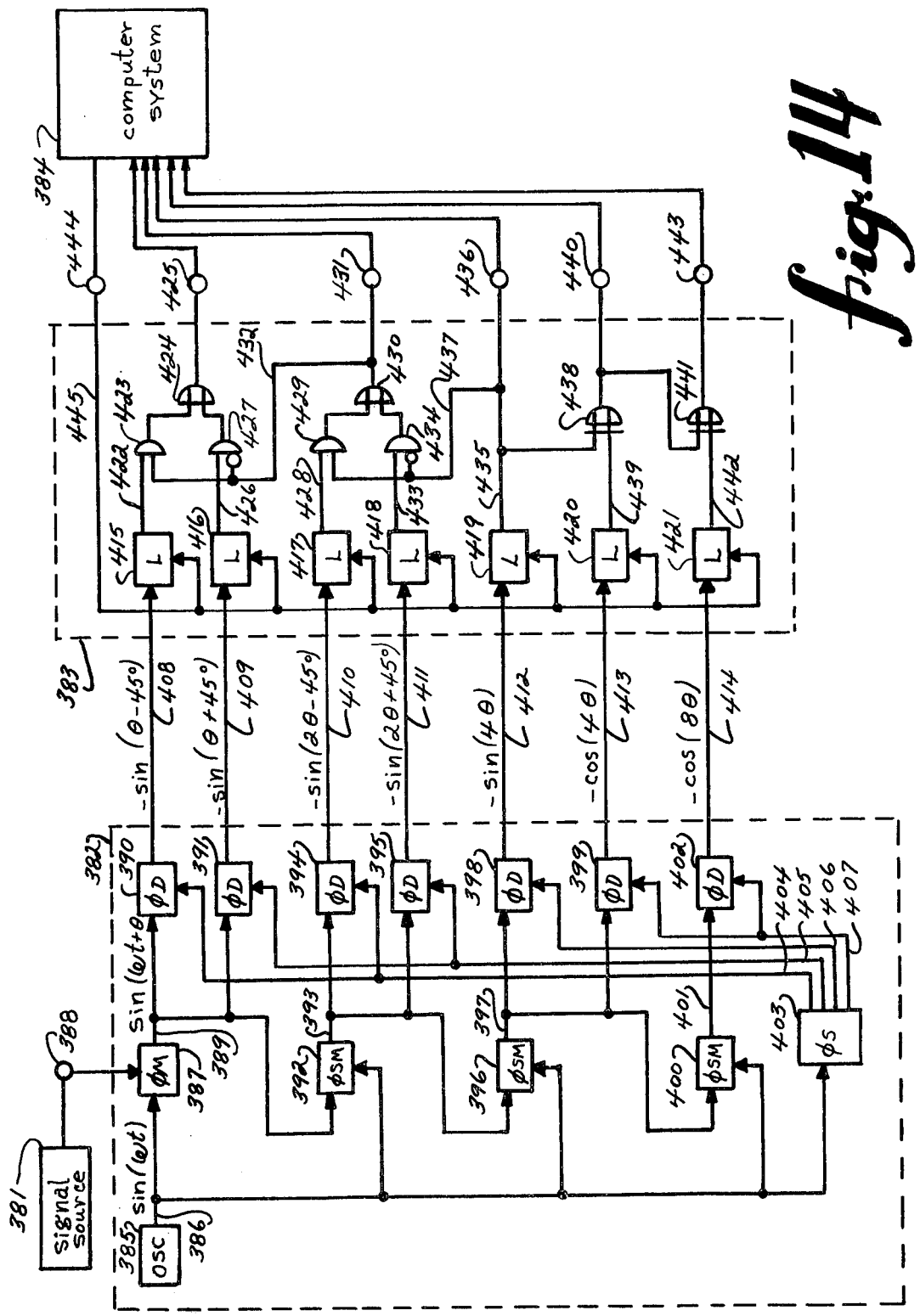
FIG. 14 is a diagrammatic illustration of a third form of the invention showing the analog-to-digital conversion of an analog signal into a five-bit binary number, and the use of a combination of two-phase and Gray intermediate codes.

FIG. 14 is a diagrammatic illustration of a third form of the invention, showing the analog-to-digital conversion of an analog signal into a five-bit binary number and the use of a combination of two-phase and Gray intermediate codes. FIG. 14 includes a signal source 381, a phase shift multiplication section 382, a sampling section 383 and a digital computer system 384. Within phase shift multiplication section 382, the output of oscillator 385 is connected via line 386 to the carrier signal input of phase modulator 387, to phase reference inputs of phase shift multipliers 392, 396 and 400, and to the input of phase shift 403. The output of signal source 381 is connected to terminal 388, which is connected to the modulation signal input of phase modulator 387. The output of phase modulator 387 is connected via line 389 to phase signal inputs of phase detectors 390 and 391, and phase shift multiplier 392. The output of phase shift multiplier 392 is connected via line 393 to phase signal inputs of phase detectors 394 and 395, and phase shift multiplier 396. The output of phase shift multiplier 396 is connected via line 397 to phase signal inputs of phase detectors 398 and 399, and phase shift multiplier 400. The output of phase shift multiplier 400 is connected via line 401 to a phase signal input of phase detector 402. A first output of phase shift 403 is connected via line 404 to phase reference inputs of phase detectors 390 and 394. A second output of phase shift 403 is connected via line 405 to phase reference inputs of phase detectors 391 and 395. A third output of phase shift 403 is connected via line 406 to the phase reference input of phase detector 398. A fourth output of phase shift 403 is connected via line 407 to phase reference input of phase detectors 399 and 402. The outputs of phase detectors 390, 391, 394, 395, 398, 399 and 402 are connected to lines 408, 409, 410, 411, 412, 413 and 414, respectively. Within sampling section 383, lines 408, 409, 410, 411, 412, 413 and 414 are connected to the signal inputs of latches 415, 416, 417, 418, 419, 420 and 421, respectively. The output of latch 415 is connected via line 422 to a first input of AND gate 423, whose output is connected to a first input of OR gate 424. The output of OR gate 424 is connected to terminal 425. The output of latch 416 is connected via line 426 to a first input of AND gate 427, whose output is connected to a second input of OR gate 424. The output of latch 417 is connected via line 428 to a first input of AND gate 429, whose output is connected to a first input of OR gate 430. The output of OR gate 430 is connected to terminal 431 and, via line 432, to second inputs of AND gates 423 and 427. The output of latch 418 is connected via line 433 to a first input of AND gate 434, whose output is connected to a second input of OR gate 430. The output of latch 419 is connected via line 435 to terminal 436, via line 437 to second inputs of AND gates 429 and 434, and to a first input of EXCLUSIVE-OR gate 438. The output of latch 420 is connected via line 439 to a second input of EXCLUSIVE-OR gate 438. The output of EXCLUSIVE-OR gate 438 is connected to terminal 440, and to a first input of EXCLUSIVE-OR gate 441. The output of latch 421 is connected via line 442 to a second input of EXCLUSIVE-OR gate 441. The output of EXCLUSIVE-OR gate 441 is connected to terminal 443. Terminals 425, 431, 436, 440 and 443 are connected to signal inputs of digital computer system 384. A control signal output of computer system 384 is connected to terminal 444 and, via line 445, to control signal inputs of latches 415, 416, 417, 418, 419, 420 and 421.

The operation of the system of FIG. 14 generally resembles the operation of the system of FIGS. 1 and 12. Signal source 381 is a source of an analog signal which is to be converted into a digital number. The response of sampling section 383 to a control signal on terminal 444 from digital computer system 384 is similar to the response of sampling section 33 of FIG. 1 to a control signal on terminal 98 from computer system 34, and to the response of sampling section 338 of FIG. 12 to a control signal on terminal 375 from computer system 339. Sampling section 383 generates a five-bit binary number on terminals 425, 431, 436, 440 and 443, with the most significant bit signal on terminal 425 and the least significant bit signal on terminal 443. This five-bit binary number is transmitted to computer system 384. The latch and gate elements shown in FIG. 14 may be, for example, standard 7400 series TTL integrated circuit devices.

Comparing the circuit of FIG. 14 with the circuit of FIG. 1, it may be seen that the signals generated on lines 408, 409, 410, 411 and 412, and the network of latches and logical gates between these lines and terminals 425, 431 and 436, closely parallels the arrangement of FIG. 1. The circuit of FIG. 14 uses substantially the same two-phase ambiguity resolution process to generate the three most significant bit signals on terminals 425, 431 and 436. The signals generated on lines 412, 413 and 414, and the network of latches 419, 420 and 421 and EXCLUSIVE-OR gates 438 and 441, closely parallels the arrangement of FIG. 12. The circuit of FIG. 14 uses substantially the same Gray code ambiguity resolution process to generate the two least significant bit signals on terminals 440 and 443.

Thus, the system of FIG. 14 takes advantage of the inherent accuracy of the two-phase code ambiguity resolution process shown in FIG. 1 to generate the most significant three bits of the output binary number and takes advantage of the relative circuit simplicity of the Gray code ambiguity resolution process shown in FIG. 12 for the generation of the two least significant bits of the output binary number. The result is a converter which provides the general overall accuracy of the two-phase code system of FIG. 1 without requiring quite as many circuit elements.

Figure 15:
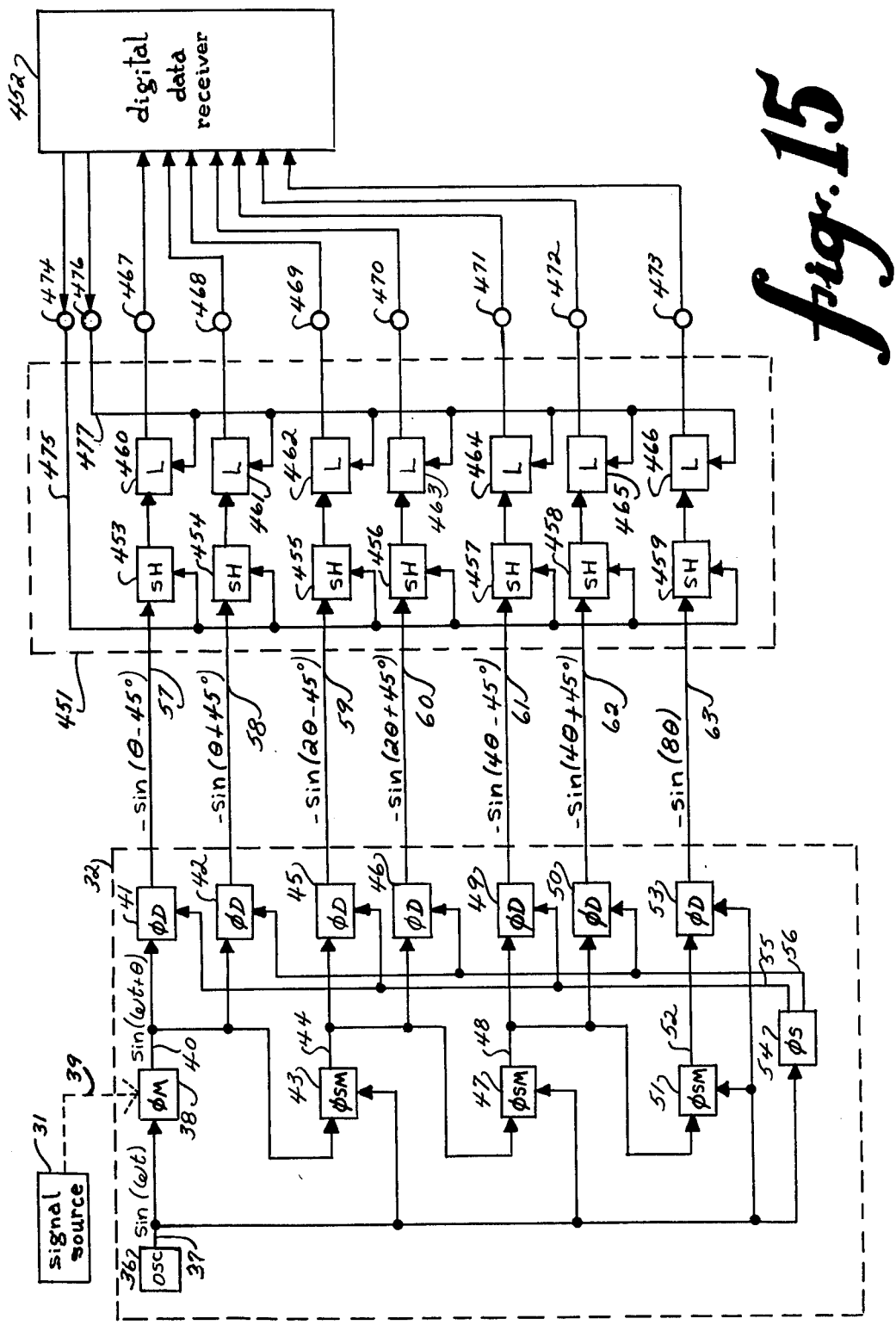
FIG. 15 is a diagrammatic illustration of a fourth form of the invention showing the analog-to-digital conversion of an analog signal into a set of two-phase code signals corresponding to a four-bit binary number, the use of analog sample-and-hold elements and the separation of the encoding and ambiguity resolution steps.

FIG. 15 is a diagrammatic illustration of a fourth form of the invention, showing the analog-to-digital conversion of an analog signal into a set of two-phase code signals corresponding to a four-bit binary number, illustrating the use of analog sample-and-hold elements and the separation of the encoding and ambiguity resolution steps. FIG. 15 includes a signal source 31, a phase shift multiplication section 32, a sampling section 451 and a digital data receiver 452. The arrangement of signal source 31, phase shift multiplication system 32, link 39, the elements within phase shift muliplication section 32 and lines 57 through 63 is the same as the arrangement of the similarly numbered elements in FIG. 1. Within sampling section 451, lines 57, 58, 59, 60, 61, 62 and 63 are connected to the signal inputs of sample-and-hold elements 453, 454, 455, 456, 457, 458 and 459, respectively, whose outputs are connected to the signal inputs of latches 460, 461, 462, 463, 464, 465 and 466, respectively. The outputs of latches 460, 461, 462, 463, 464, 465 and 466 are connected to terminals 467, 468, 469, 470, 471, 472 and 473, which are connected to signal inputs of digital data receiver 452. A first control signal output of digital data receiver 452 is connected to terminal 474 and, via line 475, to control signal inputs of sample-and-hold elements 453, 454, 455, 456, 457, 458 and 459. A second control signal output of digital data receiver 452 is connected to terminal 476 and, via line 477, to control signal inputs of latches 460, 461, 462, 463, 464, 465 and 466.

The operation of the system of FIG. 15 generally resembles the operation of the system of FIG. 1. The principal differences are the use of analog sample-and-hold elements in the sampling process, and the separation of the steps of digital encoding and ambiguity resolution. Signal source 31 is a source of an analog signal which is to be converted into a digital number. Phase shift multiplication section 32 of FIG. 15 is substantially identical in arrangement and operation to phase shift multiplication section 32 of FIG. 1. The control signal on terminal 476 and line 477 is of the form shown in FIG. 3, and controls the operation of latches 460 through 466 in the manner described for the control signal on terminal 98 of FIG. 1. The control signal on terminal 474 and line 475 is of the general form shown in FIG. 3, but slightly precedes the corresponding signal on terminal 476. Latches 460 through 466 may be, for example, standard 7400 series TTL integrated circuit devices.

Analog sample-and-hold devices are well known circuit elements and are frequently used, for example, in combination with various types of signal measuring devices. Sample-and-hold elements of several types are commercially available as circuit modules from a number of sources. Particular sample-and-hold elements may be designed and constructed to meet particular requirements. A typical analog sample-and-hold element will include an analog switch, which may be a field effect transistor, and a signal storage capacitor. Amplifiers are frequently used to reduce the loading effects of the signal storage capacitor. Active and/or passive delay elements may be employed in the switch control signal path(s) to allow precise control of the effective time of signal sampling. In operation, the analog switch of such a sample-and-hold element is closed for some period of time so that the signal on the signal storage capacitor will approach and become substantially equal to the input signal. The analog switch is then opened and the signal storage capacitor will retain the signal value at the instant that the switch was opened. One of the limitations of typical sample-and-hold elements is that the output signal will tend to drift with time after the sampling operation. However, sample-and-hold elements are typically used to hold an analog signal value for only a short period of time, such as a few microseconds to a few hundred microseconds, so such drifting is usually of little consequence.

Analog sample-and-hold elements can be constructed with a sampling time precision which is greater than that of many types of latch circuits. In the system of FIG. 15, the signal on line 57 is sampled by sample-and-hold element 453. The output of sample-and-hold element 453 is then sampled by latch 460. The result is that the line 57 signal is sampled with the time precision provided by sample-and-hold element 453, and the sampled $-\sin(\theta-45°)$ function polarity value is retained indefinitely, without drift, by latch 460. The other combinations of sample-and-hold and latch elements in sampling section 451 operate together in a similar cooperative manner.

Depending on the characteristics of phase detectors 41, 42, 45, 46, 49, 50 and 53, sample-and-hold elements 453 through 459, and latches 460 through 466, it may be desirable to limit the amplitudes of the output signals of sample-and-hold elements 453 through 459. Since only the polarities of the sampled phase angle function signals need be retained, such amplitude limiting need not introduce any error. Amplitude limiting may be accomplished, for example, by incorporating an output stage in each of sample-and-hold elements 453 through 459 which generates a logic level signal corresponding to the polarity of the sampled phase angle function signal. Such output stages may be generally along the lines of the output stages of the amplifier circuits of FIGS. 18, 19 and 20.

As mentioned previously, it is possible to introduce small delay circuits or elements within each of sample-and-hold elements 453 through 459 so as to slightly delay the individual times of sampling by controlled amounts. Because of time delays through certain circuit elements, such as the phase shift multipliers of phase shift multiplication section 32, the signals on lines such as lines 61, 62 and 63 may be slightly delayed relative to the signals on lines such as lines 57 and 58. By introducing small but progressively greater delays in the sampling control circuits of sample-and-hold elements 453 through 459, the progressive delays in the signals on lines 57 through 63 may be at least partially compensated. In such a compensated sampling operation, the effective sampling time of the signals on lines 57 and 58 will be first, the effective sampling time of the signals on lines 59 and 60 will be slightly later, and so on so that the effective sampling time of the line 63 signal will be last. A general effect of this staggering of the effective sampling times is to allow the converter system of FIG. 15 to follow more rapid variations of the analog input signal on link 39. Staggered sampling may also be performed in a generally similar manner with digital sampling devices, such as latches, or with combinations of analog and digital sampling devices.

Digital data receiver 452 may be a separate system which generates a binary number from the signal on terminals 467 through 473 in the manner shown in FIG. 1, or it may be a system which records the signals on terminals 467 through 473 for the later reproduction of those signals and the generation of the corresponding binary numbers at that time if so desired. In the latter case, the terminal 467 through 473 signals are recorded as received from sampling section 451 with little or no change. Control signal on terminals 474 and 476 are generated by data receiver 452 whenever a data group is to be recorded. The subsequently reproduced data signals, corresponding to signals on terminals 467 through 473, may be transmitted through a network of logical gates similar to that shown in FIG. 1 to provide the digital data in normal binary form at the time of reproduction.

Figure 16:
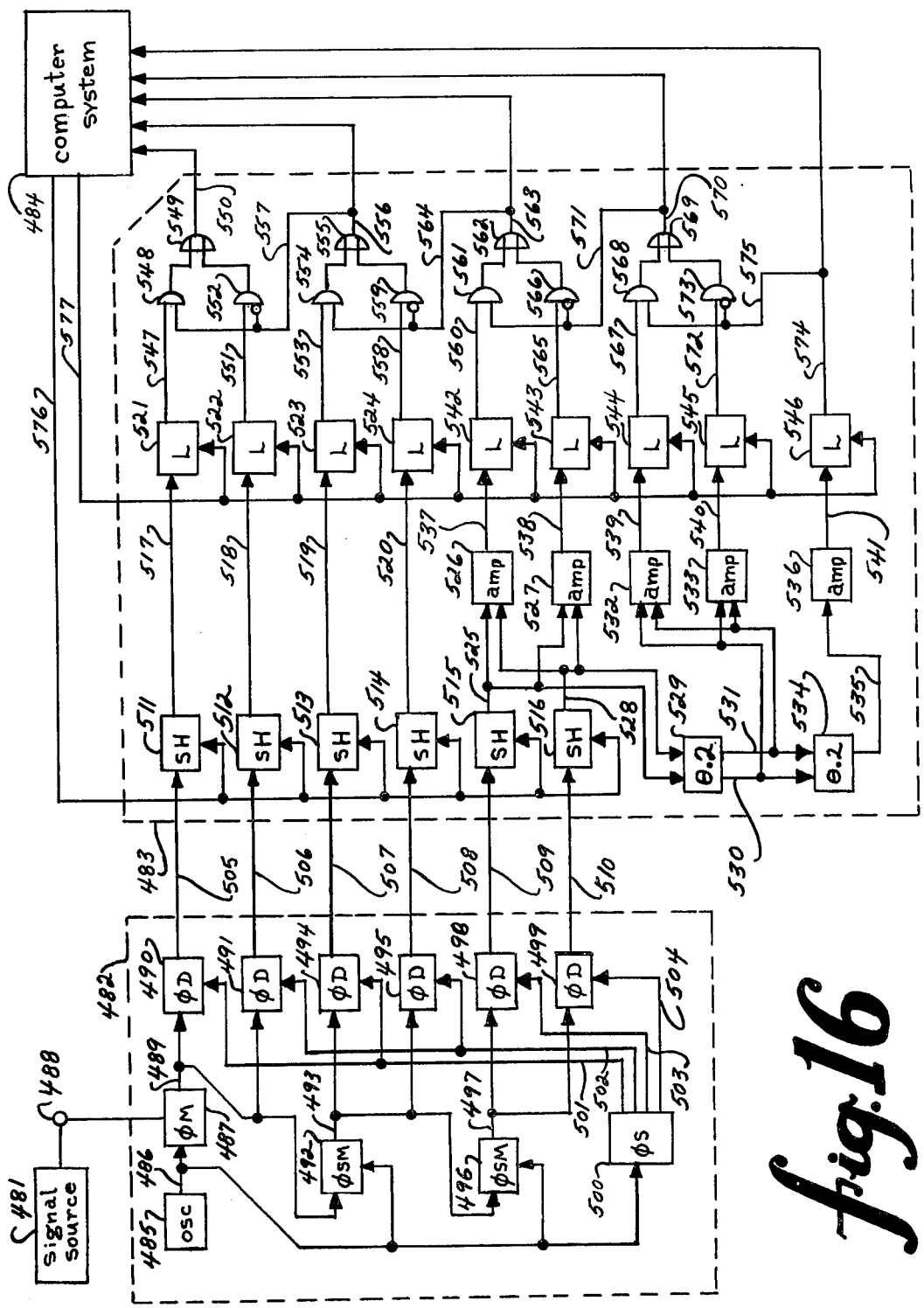
FIG. 16 is a diagrammatic illustration of a fifth form of the invention showing the analog-to-digital conversion of an analog signal into a five-bit binary number, and the use of the angle multiplication interpolation process to obtain a finer digital measurement resolution.

FIG. 16 is a diagrammatic illustration of a fifth form of the invention showing the analog-to-digital conversion of an analog signal into a five-bit binary number, and illustrating the use of an angle multiplication interpolation process to obtain a finer digital measurement resolution. FIG. 16 includes a signal source 481, a phase shift multiplication section 482, a sampling section 483 and a digital computer system 484. Within phase shift multiplication section 482, the output of oscillator 485 is connected via line 486 to a carrier signal input of phase modulator 487, to phase reference inputs of phase shift multipliers 492 and 496, and to the input of phase shift 500. The output of signal source 481 is connected to terminal 488, which is connected to the modulation signal input of phase modulator 487. The output of phase modulator 487 is connected via line 489 to phase signal inputs of phase detectors 490 and 491, and phase shift multiplier 492. The output of phase shift multiplier 492 is connected via line 493 to phase signal inputs of phase detectors 494 and 495, and phase shift multiplier 496. The output of phase shift multiplier 496 is connected via line 497 to phase signal inputs of phase detectors 498 and 499. A first output of phase shift 500 is connected via line 501 to phase reference inputs of phase detectors 490 and 494. A second output of phase shift 500 is connected via line 502 to phase reference inputs of phase detectors 491 and 495. Third and fourth outputs of phase shift 500 are connected via lines 503 and 504 to phase reference inputs of phase detectors 498 and 499, respectively. The outputs of phase detectors 490, 491, 494, 495, 498 and 499 are connected to lines 505, 506, 507, 508, 509 and 510, respectively. Within sampling section 483, lines 505, 506, 507, 508, 509 and 510 are connected to the signal inputs of sample-and-hold elements 511, 512, 513, 514, 515 and 516, respectively. The outputs of sample-and-hold elements 511, 512, 513, and 514 are connected via line 517, 518, 519 and 520, respectively, to the signal inputs of latches 521, 522, 523 and 524, respectively. The output of sample-and-hold element 515 is connected via line 525 to first inputs of amplifiers 526 and 527, and angle multiplier 529. The output of sample-and-hold element 516 is connected via line 528 to second inputs of amplifiers 526 and 527, and angle multiplier 529. The two outputs of angle multiplier 529 are connected via lines 530 and 531 to the two inputs of amplifier 532, the two inputs of amplifier 533 and the two inputs of angle multiplier 534. The output of angle multiplier 534 is connected via line 535 to the input of amplifier 536. The outputs of amplifiers 526, 527, 532, 533 and 536 are connected via lines 537, 538, 439, 540 and 541, respectively, to the signal inputs of latches 542, 543, 544, 545 and 546, respectively. The output of latch 521 is connected via line 547 to a first input of AND gate 548, whose output is connected to a first input of OR gate 549. The output of OR gate 549 is connected to line 550. The output of latch 522 is connected via line 551 to a first input of AND gate 552, whose output is connected to a second input of OR gate 549. The output of latch 523 is connected via line 553 to a first input of AND gate 554, whose output is connected to a first input of OR gate 555. The output of OR gate 555 is connected to line 556 and, via line 557, to second inputs of AND gates 548 and 552. The output of latch 524 is connected via line 558 to a first input of AND gate 559, whose input is connected to a second input of OR gate 555. The output of latch 542 is connected via line 560 to a first input of AND gate 561, whose input is connected to a first input of OR gate 562. The output of OR gate 562 is connected to line 563 and, via line 564, to second inputs of AND gates 554 and 559. The output of latch 543 is connected via line 565 to a first input of AND gate 566, whose output is connected to a second input of OR gate 562. The output of latch 544 is connected via line 567 to a first input of AND gate 568, whose output is connected to a first input of OR gate 569. The output of OR gate 569 is connected to line 570 and, via line 571, to second inputs of AND gates 561 and 566. The output of latch 545 is connected via line 572 to a first input of AND gate 573, whose output is connected to a second input of OR gate 569. The output of latch 546 is connected to line 574 and, via line 575, to second inputs of AND gates 568 and 573. Lines 550, 556, 563, 570 and 574 are connected to signal inputs of digital computer system 484. A first control signal output of computer system 484 is connected via line 576 to control signal inputs of sample-and-hold elements 511, 512, 513, 514, 515 and 516. A second control signal output of computer system 484 is connected via line 577 to control signal inputs of latches 521, 522, 523, 524, 542, 543, 544, 545 and 546.

FIG. 16 illustrates a form of interpolation to increase the digital measurement resolution of an analog-to-digital conversion system. In the system of FIG. 1, the most significant bit of the output binary number is generated from phase measurements of the output signal of phase modulator 38. Phase shift multipliers 43, 47 and 51 are used to generate multiplied phase shift signals for the generation of the three additional bits of the four-bit binary output number. In the system of FIG. 16, the outputs of phase modulator 487 and phase shift multipliers 492 and 496 are used to generate the three most significant bits of the five-bit binary number in a similar manner. The two least significant bits of the five-bit binary number are generated by interpolation.

Signal source 481 is a source of an analog signal on terminal 488 which is to be converted into a digital number. The functions and operation of the system of FIG. 16 have a general resemblance to the functions and operation of the system of FIG. 1. The signals generated by phase shift multiplication section 482 on lines 505 through 510 are sampled by sampling section 483 in response to control signals from digital computer system 484 on lines 576 and 577. After the sampling operation, a five-bit binary number is transmitted to computer system 484 on line 550, 556, 563, 570 and 574. The most significant bit signal is on line 550 and the least significant bit signal is on line 574. The sampling control signal on line 577 is of the form shown in FIG. 3 and described in connection with the system of FIG. 1. The control signal on line 576 is of the general form of the line 577 control signal, but slightly precedes it. The latches and gates of the system of FIG. 16 may be, for example, standard 7400 series TTL integrated circuit devices.

The output of oscillator 485 on line 486 is a signal of the form $\sin(\omega t)$, where $\omega$ is the angular frequency. The output of phase modulator 487 on line 489 is a signal of the form $\sin(\omega t + \theta)$, where $\theta$ is the phase modulation corresponding to the value of the input analog signal on terminal 488. The outputs of phase detectors 490 and 491 on lines 505 and 506 are signals corresponding to $-\sin(\theta - 45°)$ and $-\sin(\theta + 45°)$, respectively. The outputs of phase shift multipliers 492 and 496 on lines 493 and 497 are signals corresponding to $\sin(\omega t + 2\theta)$ and $\sin(\omega t + 4\theta)$, respectively. The outputs of phase detectors 494, 495, 498 and 499 on lines 507, 508, 509 and 510 are signals corresponding to $-\sin(2\theta - 45°)$, $-\sin(2\theta + 45°)$, $\cos(4\theta)$ and $\sin(4\theta)$, respectively. Only the polarity values of the $-\sin(\theta - 45°)$, $-\sin(\theta + 45°)$, $-\sin(2\theta - 45°)$ and $-\sin(2\theta + 45°)$ functions are used for the generation of the output binary number. Hence, the outputs of phase detectors 490, 491, 494 and 495 on lines 505 through 508 may be either logic level or analog signals representing the corresponding function polarity values. The interpolation process involves analog operations upon analog signals corresponding to the values of the $\cos(4\theta)$ and $\sin(4\theta)$ functions. Hence, the outputs of phase detectors 498 and 499 on lines 509 and 510 are analog signals representing the actual values of the corresponding functions.

Figure 17:
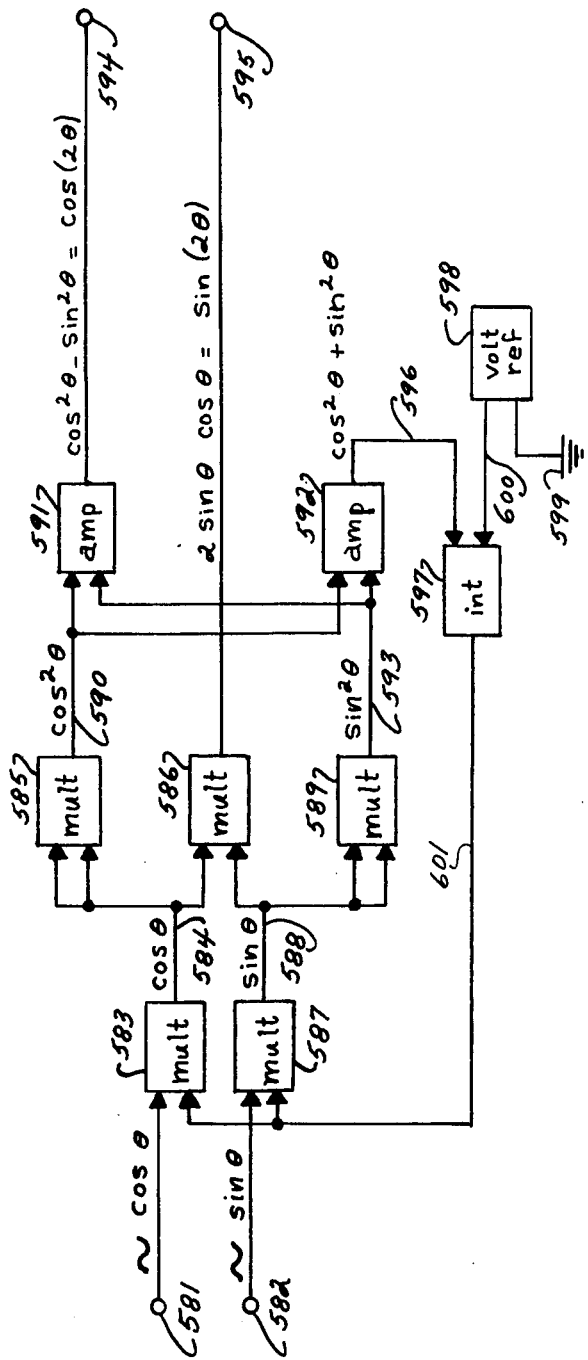
FIG. 17 is a diagrammatic illustration of an analog angle multiplier circuit, for the multiplication of analog angle signals by a factor of two, which may be used for the angle multipliers in the system of FIG. 16.

The line 505 through 510 signals are sampled by sample-and-hold 511 through 516 in response to a control signal on line 576. The line 517, 518, 519, 520, 525 and 528 signals then correspond to the values of the line 505 through 510 signals at the time of sampling. Angle multipliers 529 and 534 generate signals corresponding to $\cos(8\theta)$, $\sin(8\theta)$ and $\sin(16\theta)$ on lines 530, 531 and 535, respectively. A circuit which may be used for angle multipliers 529 and 534 is shown in FIG. 17 and will be described subsequently.

Figure 18:
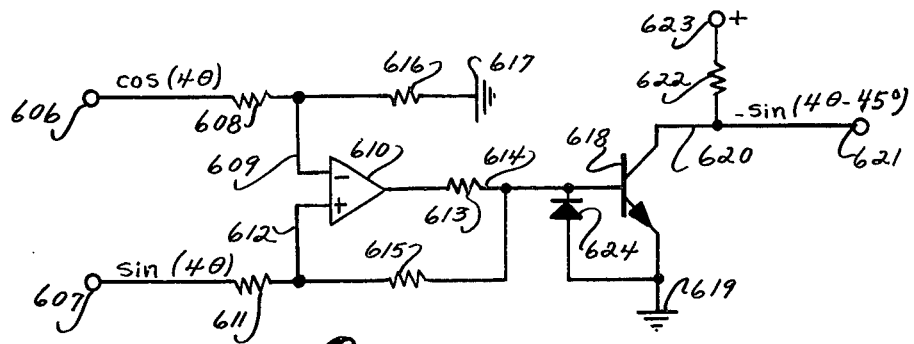
FIG. 18 is a diagrammatic illustration of a first form of polarity detection amplifier circuit, which may be used for certain amplifiers in the system of FIG. 16.
Figure 19:
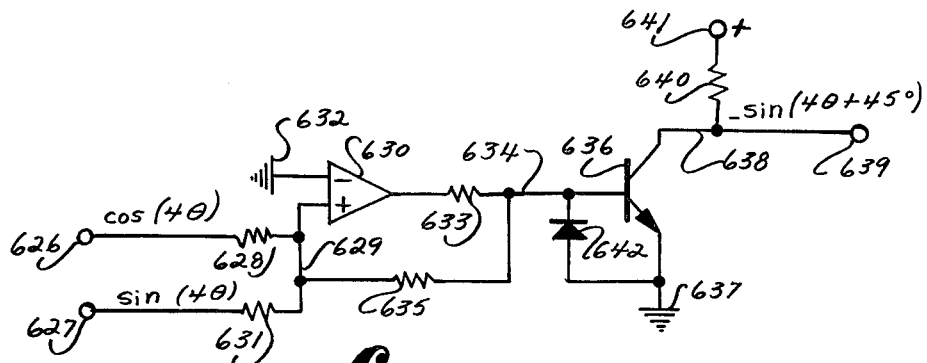
FIG. 19 is a diagrammatic illustration of a second form of polarity detection amplifier circuit, which may be used for certain amplifiers in the system of FIG. 16.
Figure 20:
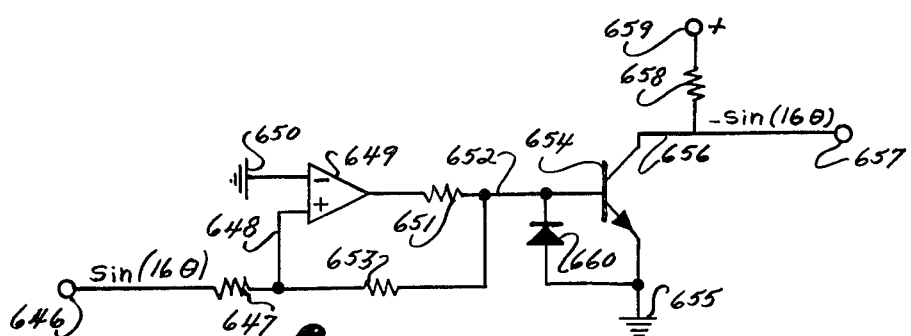
FIG. 20 is a diagrammatic illustration of a third form of polarity detection amplifier circuit, which may be used for an amplifier in the system of FIG. 16.

Given the two trigonometric functions $\cos(\theta)$ and $\sin(\theta)$, simple linear combinations of these two functions (i.e., weighted sums) may be used to generate any function of the form $\pm \sin(\theta \pm K)$ where K is any constant. In sampling section 483, amplifiers 526, 527, 532, 533 and 536 are used to generate logic level signals on lines 537 through 541 whose values correspond to the polarities of the functions $-\sin(4\theta - 45°)$, $-\sin(4\theta + 45°)$, $-\sin(8\theta - 45°)$, $-\sin(8\theta + 45°)$ and $-\sin(16\theta)$, respectively. Circuits which may be used for amplifiers 526, 527, 532, 533 and 536 are shown in FIGS. 18, 19 and 20, and will be described subsequently.

The $\cos(4\theta)$ and $\sin(4\theta)$ signals on lines 525 and 528 are connected to the inputs of amplifiers 526 and 527 which generate logic level signals on lines 537 and 538 corresponding to the polarities of $-\sin(4\theta - 45°)$ and $-\sin(4\theta + 45°)$, respectively. Similarly, the $\cos(8\theta)$ and $\sin(8\theta)$ signals on lines 530 and 531 are connected to the inputs of amplifiers 532 and 533 which generate logic level signals on lines 539 and 540 corresponding to the polarities of $-\sin(8\theta - 45°)$ and $-\sin(8\theta + 45°)$, respectively; and the $\sin(16\theta)$ signal on line 535 is connected to the input of amplifier 536 which generates a logic level signal on line 541 corresponding to the polarity of $-\sin(16\theta)$.

Thus, after the sampling operation by sample-and-holds 511 through 516, the signals on lines 517, 518, 519, 520, 537, 538, 539, 540 and 541 correspond to the polarities of $-\sin(\theta - 45°)$, $-\sin(\theta + 45°)$, $-\sin(2\theta - 45°)$, $-\sin(2\theta + 45°)$, $-\sin(4\theta - 45°)$, $-\sin(4\theta + 45°)$, $-\sin(8\theta - 45°)$, $-\sin(8\theta + 45°)$ and $-\sin(16\theta)$, respectively. These logic level signals are a two-phase code representation of a five-bit binary number corresponding to the analog signal on terminal 488, just as the signals on lines 57 through 63 of FIG. 1 form a two-phase code representation of a four-bit binary number corresponding to the analog signal on link 39. The sampling of the two-phase code signals on lines 517 through 520 and 537 through 541 by latches 521 through 524 and 542 through 546 under control of the line 577 control signal, and the conversion of the latch output signals into a five-bit binary number for transmission to computer system 484, generally follows the pattern of the sampling of the line 57 through 63 signals by latches 64 through 70 of FIG. 1 and the conversion of these latch output signals into a four-bit binary number for transmission to computer system 34. The time difference between the line 576 and 577 control signals should be sufficient so that the signals transmitted through angle multipliers 529 and 534, and amplifiers 526, 527, 532, 533 and 536 will have had sufficient time to stabilize at values corresponding to the sampled values of the line 509 and 510 signals.

Analog angle multiplication such as performed by angle multipliers 529 and 534 is not necessarily as exact an operation as phase shift multiplication. Hence, it may not be practical to extend the interpolation system of FIG. 16 for the generation of a digital word containing a large number of bits and for a correspondingly high accuracy and resolution as may be done with the system of FIG. 1. However, interpolation techniques can be quite useful to provide moderate extensions of the accuracy and/or resolution of an analog-to-digital conversion system.

FIG. 17 is a diagrammatic illustration of an angle multiplier circuit for the multiplication of an analog angle signal by a factor of two which may be used for angle multipliers 529 and 534 in the system of FIG. 16. FIG. 17 includes signal input terminals 581 and 582 and signal output terminals 594 and 595. Terminal 581 is connected to a first input of multiplier 583, whose output is connected via line 584 to the two inputs of multiplier 585 and to a first input of multiplier 586. Terminal 582 is connected to a first input of multiplier 587, whose output is connected via line 588 to a second input of multiplier 586 and to the two inputs of multiplier 589. The output of multiplier 585 is connected via line 590 to first inputs of summing amplifiers 591 and 592. The output of multiplier 589 is connected via line 593 to second inputs of summing amplifiers 591 and 592. The output of amplifier 591 is connected to terminal 594. The output of multiplier 586 is connected to terminal 595. The output of amplifier 592 is connected via line 596 to a first input of differential input integrator 597. Voltage reference 598 is connected to ground 599 and to line 600. Line 600 is connected to a second input of integrator 597. The output of integrator 597 is connected via line 601 to a second input of multiplier 583 and to a second input of multiplier 587.

Analog multipliers, in which the output signal is proportional to the product of two analog input signals, are well known. They are commercially available as circuit modules and as integrated circuit devices from a number of sources. The use of summing amplifiers to generate signals corresponding to linear combinations of two or more input signals is a well known practice, for example, in the analog computing field.

Analog multipliers 583 and 587 normalize the input signals in a manner which will be described subsequently. Analog multipliers 585, 586 and 589, and summing amplifier 591 are employed to mechanize the trigonometric relationships:

$$\sin(2\theta) = 2\sin(\theta)\cos(\theta)$$

$$\cos(2\theta) = \cos^2(\theta) - \sin^2(\theta)$$

In operation, the circuit of FIG. 17 will take two voltage signals, corresponding to the sine and cosine of an angle, and will generate two voltage signals corresponding to the sine and cosine of twice that angle.

Two input signals corresponding approximately to $\cos(\theta)$ and $\sin(\theta)$ are applied to terminals 581 and 582, respectively. Multiplier 583 is normally operated at a near unity gain such that its output on line 584 is nearly equal to the input signal on terminal 581. Multiplier 587 is similarly normally operated at a near unity gain such that the line 588 signal is nearly equal to the terminal 582 input signal. The multiplier 583 and 587 output signals on lines 584 and 588 correspond to $\cos(\theta)$ and $\sin(\theta)$, respectively. The output of multiplier 585 is a $\cos^2(\theta)$ signal and the output of multiplier 589 is a $\sin^2(\theta)$ signal. These two signals are combined by summing amplifier 591 into a $\cos^2(\theta) - \sin^2(\theta)$ signal which, from trigonometry, is identical to a $\cos(2\theta)$ output signal of amplifier 591 is connected to terminal 594. The output of multiplier 586 is a $2\sin(\theta)\cos(\theta)$ signal which, from trigonometry, is identical to a $\sin(2\theta)$ signal. The $\sin(2\theta)$ output signal of multiplier 586 is connected to terminal 595.

In mechanizing a set of equations with analog computing elements, it is generally necessary to consider the scale factors of multipliers and other non-linear elements. It is currently a common practice to design analog computing circuits with a full scale signal range of $\pm 10$ volts. Analog multipliers are often adjusted so that a full scale input signal on each of the two signal input lines will cause a full scale output signal. If the input and output signals are measured in terms of voltage, the equation for a multiplier element is:

$$W = XY/K$$

where $W$ is the multiplier output voltage, $X$ and $Y$ are the multiplier input voltages and $K$ is the voltage which corresponds to a value of one for the particular multiplier circuit. In a $\pm 10$ volt signal range system, $K$ might be, for example, 10 volts. For convenience, the scale factors are often omitted from equations corresponding to analog computing element circuits. This practice was followed for the equations describing the operation of the circuit of FIG. 17.

The combination of multipliers 585, 586 and 589, and summing amplifier 591 may be used as a simple angle multiplier circuit. In that case, the $\cos(\theta)$ and $\sin(\theta)$ input signals would be connected directly to lines 584 and 588. The double angle signal would be generated on terminals 594 and 595.

A practical limitation of the simple angle multiplier circuit including only multipliers 585, 586 and 589, and summing amplifier 591 is that the "length" of the output vector (that is, the square root of the sum of the squares of the output sine and cosine components) may not be exactly one. If a number of such simple angle multiplier circuits are connected in cascade, this vector magnitude error may become quite substantial and may cause poor performance of the latter stages. The circuit of FIG. 17 includes a vector magnitude correction circuit which substantially reduces the vector magnitude error problem.

The vector magnitude of an angle signal represented as sine and cosine components will be correct if the sum of the squares of the sine and cosine components is equal to one. That is, if the trigonometric identity:

$$\cos^2(\theta) + \sin^2(\theta) = 1$$

is satisfied. In the circuit of FIG. 17, summing amplifier 592 generates a $\cos^2(\theta) + \sin^2(\theta)$ signal which is compared with the output of voltage reference 598 by differential input integrator 597. If there is an error in the magnitude of the $\cos^2(\theta) + \sin^2(\theta)$ signal on line 596, integrator 597 will adjust the gains of multipliers 583 and 587 so as to substantially reduce that error. The gains of multipliers 583 and 587, for the $\cos(\theta)$ and $\sin(\theta)$ signals, will normally be quite close to one. They may be slightly less than one or slightly more than one, depending on the required vector magnitude correction. The use of an integrator in the feedback loop which controls the vector magnitude stabilizes the control process.

If the circuit of FIG. 17 is used for angle multiplier 529 of FIG. 16, terminals 581, 582, 594 and 595 would be connected to lines 525, 528, 530 and 531, respectively. If the circuit of FIG. 17 is used for angle multiplier 534, terminals 581, 582 and 595 would be connected to lines 530, 531 and 535, respectively.

FIG. 18 is a diagrammatic illustration of a first form of polarity detection amplifier circuit which may be used for amplifiers 526 and 532 in the system of FIG. 16. FIG. 18 includes signal input terminals 606 and 607, and signal output terminal 621. Terminal 606 is connected via resistor 608 to line 609, which is connected to the negative or inverting input of operational amplifier 610. Terminal 607 is connected via resistor 611 to line 612, which is connected to the positive or non-inverting input of amplifier 610. The output of amplifier 610 is connected via resistor 613 to line 614, which is connected via resistor 615 to line 612. Line 609 is connected via resistor 616 to ground 617. Line 614 is connected to the base of transistor 618, whose emitter is connected to ground 619. The collector of transistor 618 is connected to line 620, which is connected to terminal 621. Line 620 is connected via resistor 622 to power supply terminal 623. Diode 624 is connected between line 614 and ground 619.

If the circuit of FIG. 18 is used for amplifier 526 of FIG. 16, terminals 606, 607 and 621 would be connected to lines 525, 528 and 537, respectively. Amplifier 610 is a high gain, differential input operational amplifier, for example, of the type available as circuit modules and as integrated circuit devices from a number of sources. Since there is no negative feedback around amplifier 610, the output of amplifier 610 will tend to be a saturation or maximum magnitude signal whose polarity corresponds to the polarity of the differential input signal on lines 609 and 612.

Resistors 608 and 611 will normally be of substantially equal resistance values. Resistors 615 and 616 will normally have resistance values which are substantially equal and which are substantially higher than the values of resistors 608 and 611. When the circuit of FIG. 18 is used for amplifier 526 of FIG. 16, the terminal 606 and 607 signals will correspond to $\cos(4\theta)$ and $\sin(4\theta)$, respectively, where $\theta$ is the modulation phase angle generated by phase modulator 487. The signal on line 612 relative to line 609 will be approximately $\sin(4\theta) - \lambda \cos(4\theta)$, and the output of amplifier 610 will be a signal whose polarity corresponds to the polarity of the $\sin(4\theta) - \cos(4\theta)$ function.

From trigonometry:

$$\sin(4\theta) - \cos(4\theta) = \sqrt{2} \sin(4\theta - 45°)$$

Hence, the output of amplifier 610 will be a signal whose polarity corresponds to the polarity of the $\sin(4\theta - 45°)$ function. Resistor 613 is a current limiting resistor to limit the current drawn from the output of amplifier 610. When the output of amplifier 610 is positive, transistor 618 will be turned on, the voltage on line 620 will be pulled down to near ground, and the output signal on terminal 621 will have a low or zero value. When the output of amplifier 610 is negative, transistor 618 will be turned off, the voltage on line 620 will rise to approximately the voltage on power supply terminal 623, and the output signal on terminal 621 will have a high or one value.

Since the output signal of amplifier 610 is inverted as it passes through transistor 618, the circuit output signal on terminal 621 will be a logic level signal corresponding to the polarity of the $-\sin(4\theta - 45°)$ function. That is, a low or zero value of the terminal 621 signal will indicate that the polarity of the $-\sin(4\theta - 45°)$ function is negative, and a high or one value of the terminal 621 signal will indicate that the polarity of the $-\sin(4\theta - 45°)$ function is positive. The amplifier circuit of FIG. 18 will function in a generally similar manner when used for amplifier 532 of FIG. 16.

Diode 624 limits the magnitude of the negative voltage on line 614 to prevent damage to transistor 618. Resistor 615 provides a small amount of positive feedback around amplifier 610 to prevent oscillation when the differential input signal on lines 609 and 612 is near zero. Since there is no negative feedback around amplifier 610, and it is not used to generate a signal whose magnitude is proportional to the value of an input signal, most or all of the usual frequency compensation applied to operational amplifiers may be eliminated and the response of amplifier 610 can be quite fast. Resistor 616 is for the purpose of balancing the circuit. It provides essentially the same attenuation of the terminal 606 signal, between terminal 606 and line 609, as the attenuation of the terminal 607 signal between terminal 607 and line 612 due to the resistive loading of resistor 615. To provide output signals which will be compatible with standard 7400 series TTL integrated circuit devices, terminal 623 would be, for example, connected to a +5 volt power supply and resistor 622 would have a value typically in the range of a few hundred to a few thousand ohms.

FIG. 19 is a diagrammatic illustration of a second form of polarity detection amplifier circuit which may be used for amplifiers 527 and 533 in the system of FIG. 16. FIG. 19 includes signal input terminals 626 and 627, and signal output terminal 639. Terminal 626 is connected via resistor 628 to line 629, which is connected to the positive or non-inverting input of operational amplifier 630. Terminal 627 is connected via resistor 631 to line 629. The negative or inverting input of amplifier 630 is connected to ground 632. The output of amplifier 630 is connected via resistor 633 to line 634, which is connected via resistor 635 to line 629. Line 634 is connected to the base of transistor 636, whose emitted is connected to ground 637. The collector of transistor 636 is connected to line 638, which is connected to terminal 639. Line 638 is connected via resistor 640 to power supply terminal 641. Diode 642 is connected between line 634 and ground 637.

The operation of the circuit of FIG. 19 generally resembles the operation of the circuit of FIG. 18. The circuit of FIG. 19, from the output of amplifier 630 through output terminal 639, is substantially identical to the circuit of FIG. 18 from the output of amplifier 610 through output terminal 621. The difference is in the connections to the input of amplifier 630.

If the circuit of FIG. 19 is used for amplifier 527 of FIG. 16, terminals 626, 627 and 639 would be connected to lines 525, 528 and 538, respectively. If the circuit of FIG. 19 is used for amplifier 533, terminals 626, 627 and 639 would be connected to lines 530, 531 and 540, respectively. Resistors 628 and 631 are of substantially equal resistance values, and resistor 635 is of a substantially higher resistance value. When the circuit of FIG. 19 is used for amplifier 527 of FIG. 16, the terminal 626 and 627 signals will correspond to $\cos(4\theta)$ and $\sin(4\theta)$, respectively, where $\theta$ is the modulation phase angle generated by phase modulator 487. The signal on line 629 will be approximately $(0.5)(\sin(4\theta)+\cos(4\theta))$. Amplifier 630 is a high gain, differential input operational amplifier operated without negative feedback. Its output signal will tend to be a saturation signal of maximum magnitude whose polarity corresponds to the polarity of the line 629 signal. Hence, the output of amplifier 630 will be a signal whose polarity corresponds to the polarity of the $(0.5)(\sin(4\theta)+\cos(4\theta))$ function.

From trigonometry:

$$\sin(4\theta)+\cos(4\theta) = \sqrt{2}\sin(4\theta+45°)$$

Hence, the output of amplifier 630 will correspond to the polarity of the $\sin(4\theta+45°)$ function. The output signal of amplifier 630 is inverted in passing through transistor 636, so that the circuit output signal on terminal 639 is a logic level signal whose value corresponds to the polarity of the $-\sin(4\theta+45°)$ function.

Resistor 635 provides a small amount of positive feedback around amplifier 630, to prevent oscillation when the line 629 signal is near zero. The amplifier circuit of FIG. 19 will function in a generally similar manner when used for amplifier 533 of FIG. 16.

FIG. 20 is a diagrammatic illustration of a third form of polarity detection amplifier circuit which may be used for amplifier 536 in the system of FIG. 16. FIG. 20 includes signal input terminal 646 and signal output terminal 657. Terminal 646 is connected via resistor 647 to line 648, which is connected to the positive or non-inverting input of operational amplifier 649. The negative or inverting input of amplifier 649 is connected to ground 650. The output of amplifier 649 is connected via resistor 651 to line 652, which is connected via resistor 653 to line 648. Line 652 is connected to the base of transistor 654, whose emitter is connected to ground 655. The collector of transistor 654 is connected to line 656, which is connected to terminal 657. Line 656 is connected via resistor 658 to power supply terminal 659. Diode 660 is connected between line 652 and ground 655.

The operation of the circuit of FIG. 20 generally resembles the operation of the circuits of FIGS. 18 and 19. The circuit of FIG. 20, from the output of amplifier 649 through output terminal 657, is substantially identical to the circuit of FIG. 18 from the output of amplifier 610 through output terminal 621. The difference is in the connections to the input of amplifier 649.

If the circuit of FIG. 20 is used for amplifier 536 of FIG. 16, terminals 646 and 657 would be connected to lines 535 and 541, respectively. The line 535 and terminal 646 signal will correspond to $\sin(16\theta)$ where $\theta$ is the modulation phase angle generated by phase modulator 487. Resistor 653 will normally be of a resistance value substantially higher than that of resistor 647. Hence, the signal on line 648 will be approximately a $\sin(16\theta)$ signal. The circuit output signal on terminal 657 will be a logic level signal whose value corresponds to the polarity of the $-\sin(16\theta)$ function. Resistor 653 provides a small amount of positive feedback around amplifier 649, to prevent oscillation when the line 648 signal is near zero.

Figure 21:
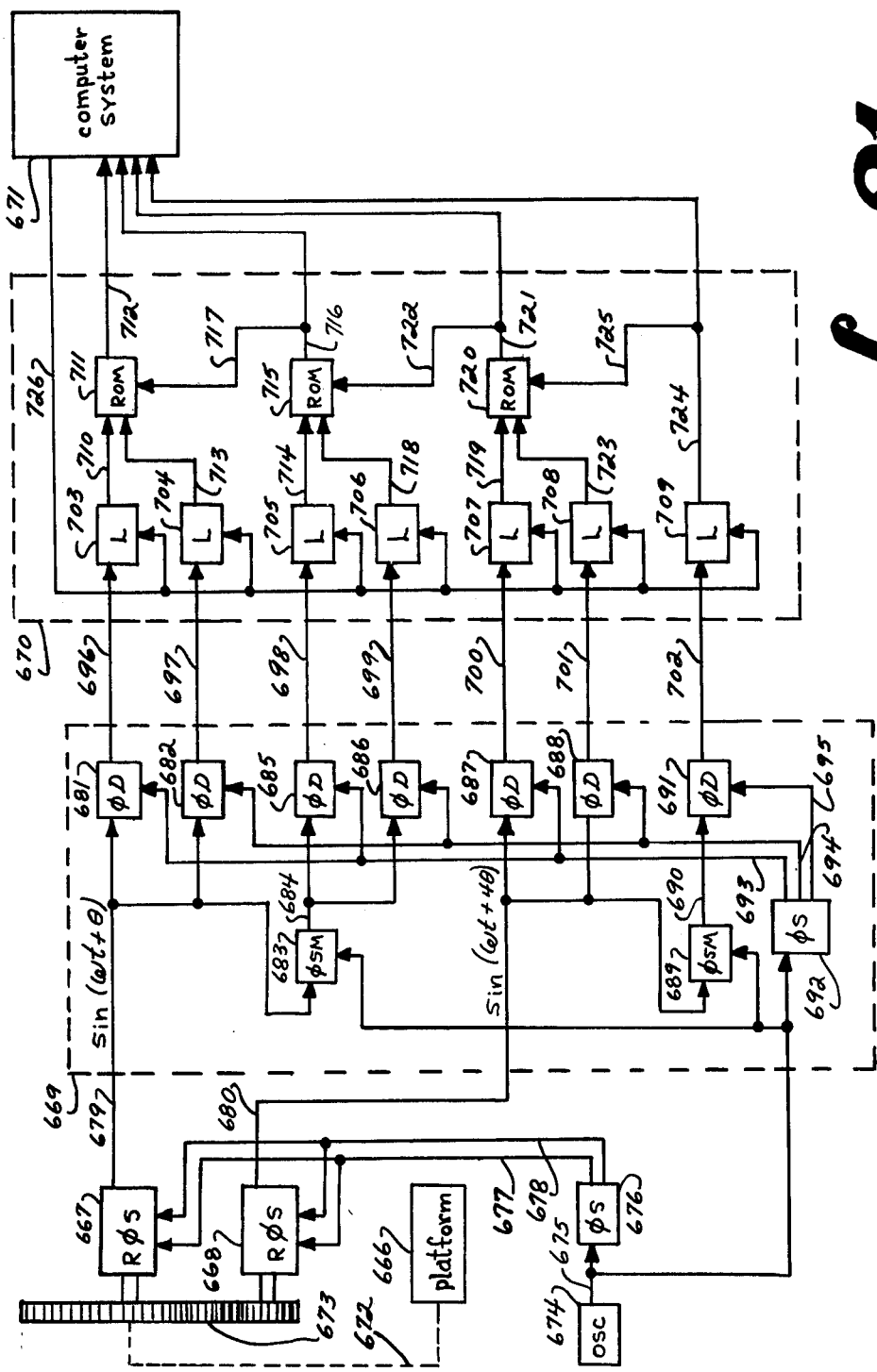
FIG. 21 is a diagrammatic illustration of a sixth form of the invention showing the analog-to-digital conversion of a two-speed pair of analog phase signals into a four-bit binary number, and the use of read-only memories in the ambiguity resolution process.

FIG. 21 is a diagrammatic illustration of a sixth form of the invention showing the analog-to-digital conversion of a two-speed pair of analog phase signals into a four-bit binary number, and the use of read-only memories in the ambiguity resolution process. FIG. 21 includes a platform 666, two resolver phase shifters 667 and 668, a phase shift multiplication section 669, a sampling section 670 and a digital computer system 671. Platform 666 is coupled via link 672 to the rotor of resolver phase shifter 667, which is coupled via gears 673 to the rotor of resolver phase shifter 668. The output of an oscillator 674 is connected via line 675 to the input of a phase shift 676, and to phase shift multiplication section 669 wherein it is connected to the input of phase shift 692 and to phase reference inputs of phase shift multipliers 683 and 689. The output of resolver phase shifter 667 is connected via line 679 to phase shift multiplication section 669 wherein it is connected to phase signal inputs of phase detectors 681 and 682, and phase shift multiplier 683. The output of resolver phase shifter 668 is connected via line 680 to phase shift multiplication section 669 wherein it is connected to phase signal inputs of phase detectors 687 and 688, and phase shift multiplier 689. Within phase shift multiplication section 669, the output of phase shift multiplier 683 is connected via line 684 to phase signal inputs of phase detectors 685 and 686. The output of phase shift multiplier 689 is connected via line 690 to a phase signal input of phase detector 691. A first output of phase shift 692 is connected via line 693 to phase reference inputs of phase detectors 681, 685 and 687. A second output of phase shift 692 is connected via line 694 to phase reference inputs of phase detectors 682, 686 and 688. A third output of phase shift 692 is connected via line 695 to a phase reference input of phase detector 691. The outputs of phase detectors 681, 682, 685, 686, 687, 688 and 691 are connected to lines 696, 697, 698, 699, 700, 701 and 702, respectively. Within sampling section 670, lines 696, 697, 698, 699, 700, 701 and 702 are connected to the signal inputs of latches 703, 704, 705, 706, 707, 708 and 709, respectively. The output of latch 703 is connected via line 710 to a first input of read-only memory 711, whose output is connected to line 712. The output of latch 704 is connected via line 713 to a second input of read-only memory 711. The output of latch 705 is connected via line 714 to a first input of read-only memory 715. The output of read-only memory 715 is connected to line 716 and, via line 717, to a third input of read-only memory 711. The output of latch 706 is connected via line 718 to a second input of read-only memory 715. The output of latch 707 is connected via line 719 to a first input of read-only memory 720. The output of read-only memory 720 is connected to line 721 and, via line 722, to a third input of read-only memory 715. The output of latch 708 is connected via line 723 to a second input of read-only memory 720. The output of latch 709 is connected to line 724 and, via line 725, to a third input of read-only memory 720. Lines 712, 716, 721 and 724 are connected to signal inputs of digital computer system 671. A control signal output of computer system 671 is connected via line 726 to control signal inputs of latches 703, 704, 705, 706, 707, 708 and 709.

It is a common practice to transmit angle signals such as synchro or resolver type signals in the form of multi-speed sets of related angle signals. For example, the angular position of a radar antenna may be transmitted as a pair of two-speed angle signals representing the angle values $\theta$ and $8\theta$, where $\theta$ is the angular position of the radar antenna. At the receiving point, measurements of the $8\theta$ signal provide a higher accuracy and resolution than would be possible if only the $\theta$ signal were transmitted. Measurements of the $\theta$ signal resolve the ambiguities which might otherwise occur if only the $8\theta$ signal were transmitted.

FIG. 21 illustrates a system for the analog-to-digital conversion of a pair of two-speed phase angle signals. Platform 666 is a platform whose angular position is to be measured. It may be, for example, the platform of a radar antenna. Resolver phase shifters 667 and 668 are each energized from the outputs of phase shift 676, so as to provide controlled phase signals on lines 679 and 680. Platform 666 is connected via link 672 to the rotor of resolver 667, so that the output signal of resolver 667 on line 679 is of the form $\sin(\omega t + \theta)$, where $\omega$ is the angular frequency of the output signal of oscillator 674 on line 675, and $\theta$ is the phase shift introduced by resolver 667 corresponding to the angular position of platform 666. The rotor of resolver 668 is coupled to the rotor of resolver 667 via gears 678 such that the resolver 668 rotor rotates at exactly four times the speed of the resolver 667 rotor. The output signal of resolver 668 on line 680 is of the form $\sin(\omega t + 4\theta)$. The latch elements within sampling section 670 may be, for example, standard 7400 series TTL integrated circuit devices. Read-only memories 711, 715 and 720 perform substantially the same functions as the networks of logical gates shown in previously described systems such as that of FIG. 1. The operation of these read-only memories will be described subsequently in greater detail. The read-only memories resolve possible ambiguities and generate a four-bit binary number on lines 712, 716, 721 and 724. The most significant bit signal is on line 712 and the least significant bit signal is on line 724.

The arrangement and operation of the system of FIG. 21 generally parallels the arrangement and operation of the system of FIG. 1. The two-phase code ambiguity resolution process of the system of FIG. 1 is also used for the system of FIG. 21. In each case, the selection of a signal for any particular bit except the least significant bit is controlled by the value of the adjacent less significant bit. The output signals of phase shift multiplication section 669 on lines 696 through 702 are logic level signals whose values correspond to the polarities of $-\sin(\theta-45°)$, $-\sin(\theta+45°)$, $-\sin(2\theta-45°)$, $-\sin(2\theta+45°)$, $-\sin(4\theta-45°)$, $-\sin(4\theta+45°)$ and $-\sin(8\theta)$, respectively, where $\theta$ is the angular position of platform 666. These are substantially the same output signals as provided by phase shift multiplication section 32 of FIG. 1, where $\theta$ is the phase modulation introduced by phase modulator 38. A major difference in the internal structure of phase shift multiplication section 669 is that the line 700, 701 and 702 signals are generated from the high speed phase angle signal on line 680, rather than by phase shift multiplication operations upon the low speed phase angle signal on line 679.

The low speed $\sin(\omega t+\theta)$ phase angle signal on line 679 is connected to phase detectors 681 and 682, which generate signals corresponding to $-\sin(\theta-45°)$ and $-\sin(\theta+45°)$ on lines 696 and 697, respectively. The line 679 signal is also connected to phase shift multiplier 683 which doubles the phase shift of that signal. The multiplied phase shift signal on line 684 is connected to phase detectors 685 and 686, which generate signals corresponding to $-\sin(2\theta-45°)$ and $-\sin(2\theta+45°)$ on lines 698 and 699, respectively. The high speed $\sin(\omega t+4\theta)$ phase shift signal on line 680 is connected to phase detectors 687 and 688, which generate signals corresponding to $-\sin(4\theta-45°)$ and $-\sin(4\theta+45°)$ on lines 700 and 701, respectively. The line 680 signal is also connected to phase shift multiplier 689 which doubles the phase shift of that signal. The multiplied phase shift signal on line 690 is connected to phase detector 691, which generates a signal corresponding to $-\sin(8\theta)$ on line 702.

Phase shift multiplication section 669 of FIG. 21 could be connected to sampling section 33 of FIG. 1, and the combination would form an operating analog-to-digital conversion system for the digital measurement of the two-speed phase angle signal set on lines 679 and 680. Sampling section 670 of FIG. 21 is functionally equivalent to sampling section 33 of FIG. 1, and illustrates the use of read-only memories in place of networks of logical gates for the ambiguity resolution process.

After the sampling of the line 696 thrugh 702 signals by latches 703 through 709, the signals on lines 710, 713, 714, 718, 719, 723 and 724 will be a two-phase intermediate code representation of a four-bit binary number corresponding to the angular position of platform 666 at the time of sampling. The conversion of this two-phase intermediate code representation into a four-bit normal binary number is performed in the general manner of the system of FIG. 1, except that read-only memories are used in place of a network of logical gates.

Table 1

| Data Values for Read-Only Memory 711 of FIG. 21. | | | |
|---|---|---|---|
| address input values | | | line 712 data |
| line 717 | line 710 | line 713 | output value |
| 0 | 0 | 0 | 0 |
| 0 | 0 | 1 | 1 |
| 0 | 1 | 0 | 0 |
| 0 | 1 | 1 | 1 |
| 1 | 0 | 0 | 0 |
| 1 | 0 | 1 | 0 |
| 1 | 1 | 0 | 1 |
| 1 | 1 | 1 | 1 |

Read-only memory 711 is a three-bit input (8 word), one-bit output read-only memory. Read-only memories which are compatible with standard TTL and other logic circuit families are available as integrated circuit devices from a number of sources, or may be constructed from discrete components. The data pattern which is stored in read-only memory 751 is shown in Table 1. Each of the eight possible combinations of the line 710, 713 and 717 data values will cause the generation of a predetermined data signal on line 712. As may be seen from Table 1, when the line 717 signal is low, the data output value is the same as the line 713 input signal and is independent of the line 710 signal. When the line 717 signal is high, the data output value is the same as the line 710 signal and is independent of the line 713 signal. Thus, the effective operation of read-only memory 711 is that when the line 717 signal is high, the line 710 signal is selected for transmission to line 712. When the line 717 signal is low, the line 713 signal is selected for transmission to line 712. This operation is identical to the operation of gates 72, 73 and 76 of FIG. 1, which select either the line 71 or the line 75 signal for transmission to terminal 74, depending on the value of the line 81 signal.

Hence, read-only memory 711 is a functional equivalent of the network of gates 72, 73 and 76. Read-only memories 715 and 720 have the same predetermined data pattern as read-only memory 711, and preform substantially the same signal selection process. The network of read-only memories 711, 715 and 720 is functionally equivalent to the network of logical gates shown in FIG. 1 for the ambiguity resolution and code conversion process, and performs the ambiguity resolution and code conversion operations in a corresponding manner.

Figure 22:
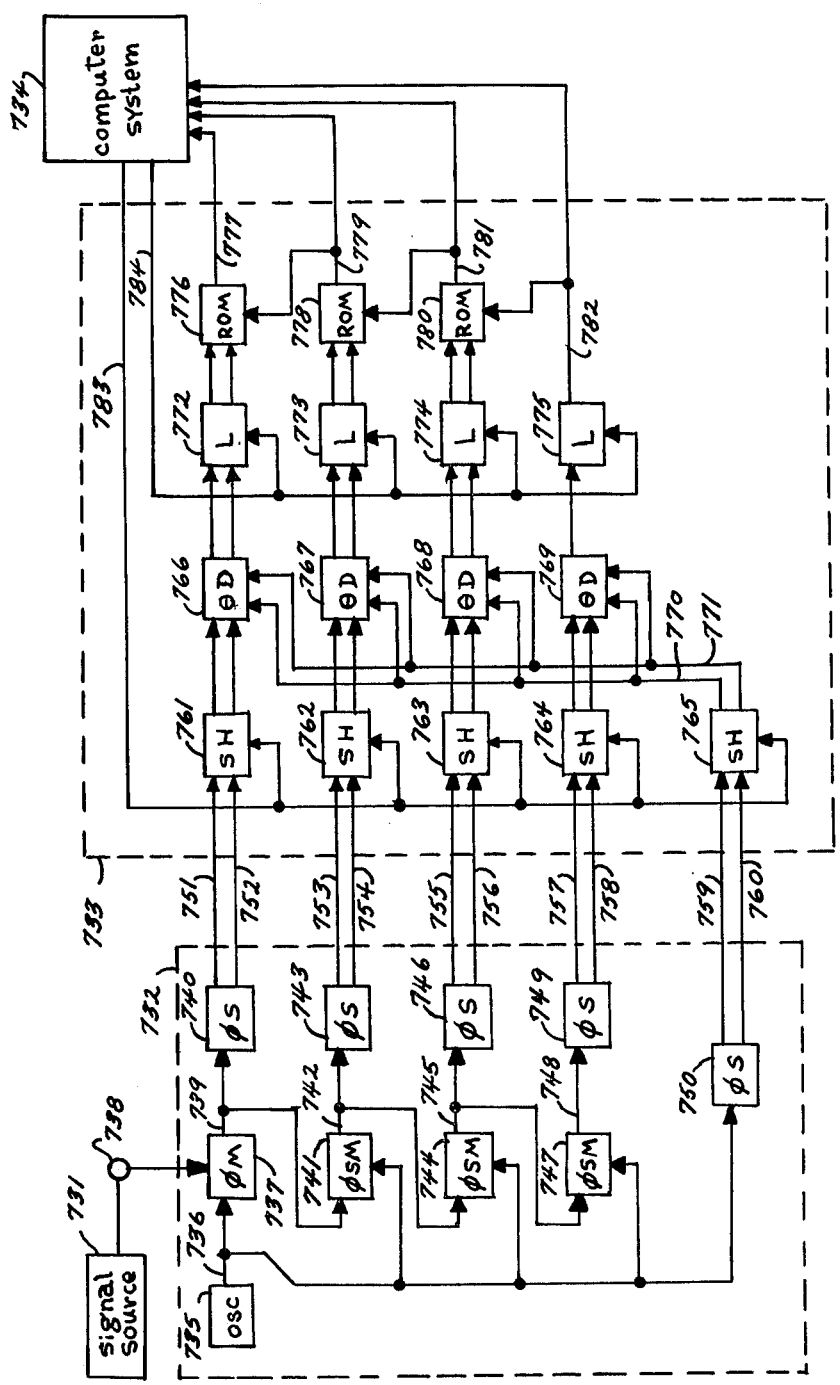
FIG. 22 is a diagrammatic illustration of a seventh form of the invention showing the analog-to-digital conversion of an analog signal into a four-bit binary number, the sampling of carrier frequency phase modulated signals and analog post-sampling phase detection.

FIG. 22 is a diagrammatic illustration of a seventh form of the invention showing the analog-to-digital conversion of an analog signal into a four-bit binary number, the sampling of carrier frequency phase modulated signals and analog post-sampling phase detection. FIG. 22 includes a signal source 731, a phase shift multiplication section 732, a sampling section 733 and a digital computer system 734. Within phase shift multiplication section 732, the output of oscillator 735 is connected via line 736 to the carrier signal input of phase modulator 737, to phase reference inputs of phase shift multipliers 741, 744 and 747, and to the input of phase shift 750. The output of signal source 731 is connected to terminal 738, which is connected to the modulation signal input of phase modulator 737. The output of phase modulator 737 is connected via line 739 to the input of phase shift 740 and to the phase signal input of phase shift multiplier 741. The output of phase shift multiplier 741 is connected via line 742 to the input of phase shift 743 and to the phase signal input of phase shift multiplier 744. The output of phase shift multiplier 744 is connected via line 745 to the input of phase shift 746 and to the phase signal input of phase shift multiplier 747. The output of phase shift multiplier 747 is connected via line 748 to the input of phase shift 749. The two outputs of phase shift 740 are connected to lines 751 and 752. Similarly, the two outputs of phase shift 743 are connected to lines 753 and 754, the two outputs of phase shift 746 are connected to lines 755 and 756, the two outputs of phase shift 749 are connected to lines 757 and 758, and the two outputs of phase shift 750 are connected to lines 759 and 760. Within sampling section 733, lines 751 and 752 are connected to the two signal inputs of dual sample-and-hold 761. Similarly, lines 753 and 754 are connected to the two signal inputs of dual sample-and-hold 762, lines 755 and 756 are connected to the two signal inputs of dual sample-and-hold 763, lines 757 and 758 are connected to the two signal inputs of dual sample-and-hold 764, and lines 759 and 760 are connected to the two signal inputs of dual sample-and-hold 765. The two outputs of dual sample-and-hold 761 are connected to first and second inputs of angle detector 766. Similarly, the two outputs of dual sample-and-hold 762 are connected to first and second inputs of angle detector 767, the two outputs of dual sample-and-hold 763 are connected to first and second inputs of angle detector 768, and the two outputs of dual sample-and-hold 764 are connected to first and second inputs of angle detector 769. A first output of dual sample-and-hold 765 is connected via line 770 to third inputs of angle detectors 766, 767, 768 and 769. A second output of dual sample-and-hold 765 is connected via line 771 to fourth inputs of angle detectors 766, 767, 768 and 769. The two outputs of angle detector 766 are connected to the two signal inputs of dual latch 772. Similarly, the two outputs of angle detector 767 are connected to the two signal inputs of dual latch 773, and the two outputs of angle detector 768 are connected to the two signal inputs of dual latch 774. The output of angle detector 769 is connected to the signal input of latch 775. The two outputs of dual latch 772 are connected to first and second inputs of read-only memory 776, whose output is connected to line 777. The two outputs of dual latch 773 are connected to first and second inputs of read-only memory 778, whose output is connected to line 779 and to a third input of read-only memory 776. The two outputs of dual latch 774 are connected to first and second inputs of read-only memory 780, whose output is connected to line 781 and to a third input of read-only memory 778. The output of latch 775 is connected to line 782 and to a third input of read-only memory 780. Lines 777, 779, 781 and 782 are connected to signal inputs of digital computer system 734. A first control signal output of computer system 734 is connected via line 783 to control signal inputs of dual sample-and-holds 761, 762, 763, 764 and 765. A second control signal output of computer system 734 is connected via line 784 to control signal inputs of dual latches 772, 773 and 774, and latch 775.

In the previously described systems, a number of phase shift signals corresponding to an analog input signal were connected to the phase signal inputs of a set of phase detectors. The outputs of the phase detectors were a set of cyclic signals corresponding to the analog input signal. The phase detector output signals were sampled and converted into a digital number in the desired form. A phase detector will frequently include low pass filtering to reduce the carrier and higher frequency components in its output signal. Hence, the phase detection process may intorduce a small time lag. For this and other reasons, it may be desirable to perform the phase detection operation after a sampling of the phase shift signals. FIG. 22 is an illustration of a system which incorporates analog post-sampling phase detection.

Phase shift multiplication section 732 generally resembles phase shift multiplication section 32 of FIG. 1, except that its output signals on lines 751 through 760 are carrier frequency phase shift signals rather than phase detector output signals. Signal source 731 is a source of an analog signal on terminal 738 which is to be converted into digital form. The output of oscillator 735 on line 736 corresponds to $\sin(\omega t)$, where $\omega$ is the angular frequency. The output of phase modulator 737 on line 739 corresponds to $\sin(\omega t + \theta)$, where $\theta$ is the phase modulation introduced by phase modulator 737 corresponding to the analog signal on terminal 738. Dual phase shift 740 generates signals corresponding to $\sin(\omega t + \theta - 45°)$ and $\sin(\omega t + \theta + 45°)$ on lines 751 and 752, respectively. The output of phase shift multiplier 741 on line 742 is a signal of the form $\sin(\omega t + 2\theta)$. The outputs of dual phase shift 743 are signals of the form $\sin(\omega t + 2\theta - 45°)$ and $\sin(\omega t + 2\theta + 45°)$ on lines 753 and 754, respectively. The output of phase shift multiplier 744 on line 745 is a signal of the form $\sin(\omega t + 4\theta)$. The two outputs of dual phase shift 746 are signals of the form $\sin(\omega t+4\theta-45°)$ and $\sin(\omega t+\theta+45°)$ on lines 755 and 756, respectively. The output of phase shift multiplier 747 on line 748 is a signal of the form $\sin(\omega t+8\theta)$. The output signals of dual phase shift 749 are signals of the form $\sin(\omega t+8\theta)$ and $\cos(\omega t+8\theta)$ on lines 757 and 758, respectively. The two outputs of dual phase shift 750 are signals of the form $\sin(\omega t)$ and $\cos(\omega t)$ on lines 759 and 760, respectively.

When an analog-to-digital conversion operation is to be performed, digital computer system 734 transmits control signals on lines 783 and 784 to initiate and control the sampling operations. The line 784 control signal is of the general form shown in FIG. 3 and described in connection with the system of FIG. 1. The line 783 control signal is of a form compatible with the characteristics of dual sample-and-holds 761 through 765, so that the sampling operation of dual sample-and-holds 761 through 765 slightly precedes the sampling operation by latches 772 through 775. After a sampling operation, the outputs of dual sample-and-hold 761 will be signals of the form $\sin(\omega t'+\theta-45°)$ and $\sin(\omega t'+\theta+45°)$, where $t'$ is the value of $t$ at the time of sampling by sample-and-holds 761 through 765. Similarly, the two outputs of dual sample-and-hold 762 will correspond to $\sin(\omega t'+2\theta-45°)$ and $\sin(\omega t'+2\theta+45°)$, the two outputs of dual sample-and-hold 763 will correspond to $\sin(\omega t'+4\theta-45°)$ and $\sin(\omega t'+4\theta+45°)$ and the two outputs of dual sample-and-hold 764 will correspond to $\sin(\omega t'+8\theta)$ and $\cos(\omega t'+8\theta)$. The two outputs of dual sample-and-hold 765 will be signals of the form $\sin(\omega t')$ and $\cos(\omega t')$ on lines 770 and 771, respectively.

Figure 23:
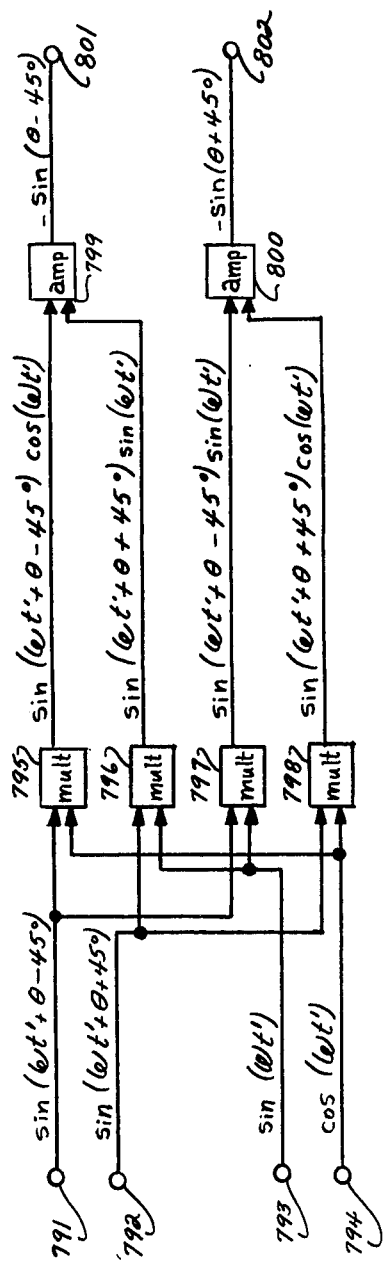
FIG. 23 is a diagrammatic illustration of an analog angle detector circuit, which may be used for the angle detectors in the circuit of FIG. 22.

Angle detector 766 subtracts the sampled phase angle of the line 759 and 760 signals from the sampled phase angle of the line 751 and 752 signals, and generates two logic level output signals corresponding to the polarities of $-\sin(\theta-45°)$ and $-\sin(\theta+45°)$. A circuit which may be used for angle detectors 766 through 769 is shown in FIG. 23 will be described subsequently in greater detail. Angle detector 767 generates two logic level output signals corresponding to the polarities of $-\sin(2\theta-45°)$ and $-\sin(2\theta+45°)$, angle detector 768 generates two logic level output signals corresponding to the polarities of $-\sin(4\theta-45°)$ and $-\sin(4\theta+45°)$ and angle detector 769 generates a logic level output signal corresponding to the polarity of $-\sin(8\theta)$. The seven output signals of angle detectors 766 through 769 correspond to the seven signals on lines 57 through 63 of FIG. 1, and on lines 696 through 702 of FIG. 21. The sampling of the angle detector 766 through 769 output signals by latches 772 through 775, and the conversion of the sampled signal values into a four-bit normal binary number via read-only memories 776, 778 and 780 is substantially similar to the sampling of the line 696 through 702 signals by latches 703 through 709 of sampling section 670 of FIG. 21, and the subsequent ambiguity resolution and conversion into a normal binary form via read-only memories 711, 715 and 720. A four-bit binary number is transmitted to computer system 734 via lines 777, 779, 781 and 782. The most significant bit signal is on line 777 and the least significant bit signal is on line 782.

Sample-and-holds 761 through 765 may be, for example, high speed analog sample-and-hold devices of the type used in sampling oscilloscopes. Because of the analog angle detection operations performed on the output signals of sample-and-holds 761 through 765, their output signals should represent the analog amplitudes of the input signals at the time of sampling with at least moderate accuracy. Latches 772 through 775 may be, for example, standard 7400 series TTL integrated circuit devices.

FIG. 23 is a diagrammatic illustration of an analog angle detector circuit, which may be used for angle detectors 766, 767, 768 and 769 of FIG. 22. FIG. 23 includes input terminals 791, 792, 793 and 794, and output terminals 801 and 802. Terminal 791 is connected to a first input of multiplier 795 and to a first input of multiplier 797. Terminal 792 is connected to a first input of multiplier 796 and to a first input of multiplier 798. Terminal 793 is connected to a second input of multiplier 796 and to a second input of multiplier 797. Terminal 794 is connected to a second input of multiplier 795 and to a second input of multiplier 798. The output of multiplier 795 is connected to a first input of amplifier 799, and the output of multiplier 796 is connected to a second input of amplifier 799. The output of multiplier 797 is connected to a first input of amplifier 800, and the output of multiplier 798 is connected to a second input of amplifier 800. The output of amplifier 799 is connected to terminal 801. The output of amplifier 800 is connected to terminal 802.

If the circuit of FIG. 23 is used for angle detector 766 of FIG. 22, terminals 791 and 792 would be connected to the two outputs of dual sample-and-hold 761, terminals 793 and 794 would be connected to lines 770 and 771, respectively, and terminals 801 and 802 would be connected to the two signal inputs of dual latch 772. The circuit of FIG. 23 subtracts the phase angle represented by the signals on terminals 793 and 794 from the phase angle represented by the signals on terminals 791 and 792, and generates the resulting difference angle signal as a pair of component signals on terminals 801 and 802. The terminal 801 and 802 signals are thus a measure of the phase angle of the terminal 791 and 792 signals relative to the terminal 793 and 794 signals.

The circuit of FIG. 23 mechanizes the trigonometric relationships:

$$-\sin(\omega t'+\theta-45°)\cos(\omega t')+\sin(\omega t'+\theta+45°)\sin(\omega t')$$

$$=-\tfrac{1}{2}(\sin(2\omega t'+\theta-45°)+\sin(\theta-45°))$$

$$+\tfrac{1}{2}(\sin(2\omega t'+\theta-45°)-\sin(\theta-45°))$$

$$=-\sin(\theta-45°)$$

and $$-\sin(\omega t'+\theta-45°)\sin(\omega t')-\sin(\omega t'+\theta+45°)\cos(\omega t')$$

$$=-\tfrac{1}{2}(-\sin(2\omega t'+\theta+45°)+\sin(\theta+45°))$$

$$-\tfrac{1}{2}(\sin(2\omega t'+\theta+45°)+\sin(\theta+45°))$$

$$=-\sin(\theta+45°)$$

The terminal 791 signal corresponds to $\sin(\omega t'+\theta-45°)$, the sampled value of the line 751 $\sin(\omega t+\theta-45°)$ signal. Similarly, the terminal 792 signal corresponds to $\sin(\omega t'+\theta+45°)$, the sampled value of the line 752 $\sin(\omega t+\theta+45°)$ signal. The terminal 793 $\sin(\omega t')$ signal is the sampled value of the line 759 $\sin(\omega t)$ signal and the terminal 794 $\cos(\omega t')$ signal is the sampled value of of the line 760 $\cos(\omega t)$ signal. The output of multiplier 795 is substantially proportional to the product of the two input signals and corresponds to $\sin(\omega t'+\theta-45°)\cos(\omega t')$. The output of multiplier 796 is similarly a signal corresponding to $\sin(\omega t'+\theta+45°-$ )sin(ωt'). The multiplier 795 and 796 output signals are summed by amplifier 795, in accordance with the previously given trigonometric relationships, giving a resultant signal corresponding to $-\sin(\theta - 45°)$. The output of amplifier 799 may be a logic level signal corresponding to the polarity of $-\sin(\theta - 45°)$, since only the polarity value is required for subsequent operations. Amplifier 799 may be, for example, generally along the lines of the amplifier circuits shown in FIGS. 18, 19 and 20. Amplifier 800 generates a logic level signal corresponding to the polarity of $-\sin(\theta + 45°)$ in a generally similar manner. The terminal 801 and 802 signals are the desired phase angle difference signal.

The connections and operation of the circuit of FIG. 23 will be generally similar when used for angle detectors 767 and 768 of FIG. 22. The $\theta$ terms in the signal expressions shown in FIG. 23 and in the previous description would be replaced by $2\theta$ and $4\theta$ terms for angle detectors 767 and 768, respectively.

Angle detector 769 differs slightly from angle detectors 766 through 768 in that only a single output is required. A circuit generally of the form shown in FIG. 23, but including only multipliers 795 and 796 and amplifier 799, may be used for angle detector 769. It will mechanize the trigonometric relationship:

$-\sin(\omega t' + 8\theta)\cos(\omega t') + \cos(\omega t' + 8\theta)\sin(\omega t')$ $= -\tfrac{1}{2}(\sin(2\omega t' + 8\theta) + \sin(8\theta)) + \tfrac{1}{2}(\sin(2\omega t' + 8\theta) - \sin(8\theta))$ $= -\sin(8\theta)$ The terminal 791 signal will correspond to $\sin(\omega t' + 8\theta)$, the sampled value of the line 757 $\sin(\omega t + 8\theta)$ signal. The terminal 792 signal will correspond to $\cos(\omega t' + 8\theta)$, the sampled value of the line 758 $\cos(\omega t + 8\theta)$ signal. The multiplier 795 output signal will correspond to $\sin(\omega t' + 8\theta)\cos(\omega t')$ and the multiplier 796 output signal will correspond to $\cos(\omega t' + 8\theta)\sin(\omega t')$. The multiplier 795 and 796 output signals are combined by summing amplifier 799 in accordance with the previously given trigonometric relationship, to generate a logic level signal on terminal 801 corresponding to $-\sin(8\theta)$.

Figure 24:
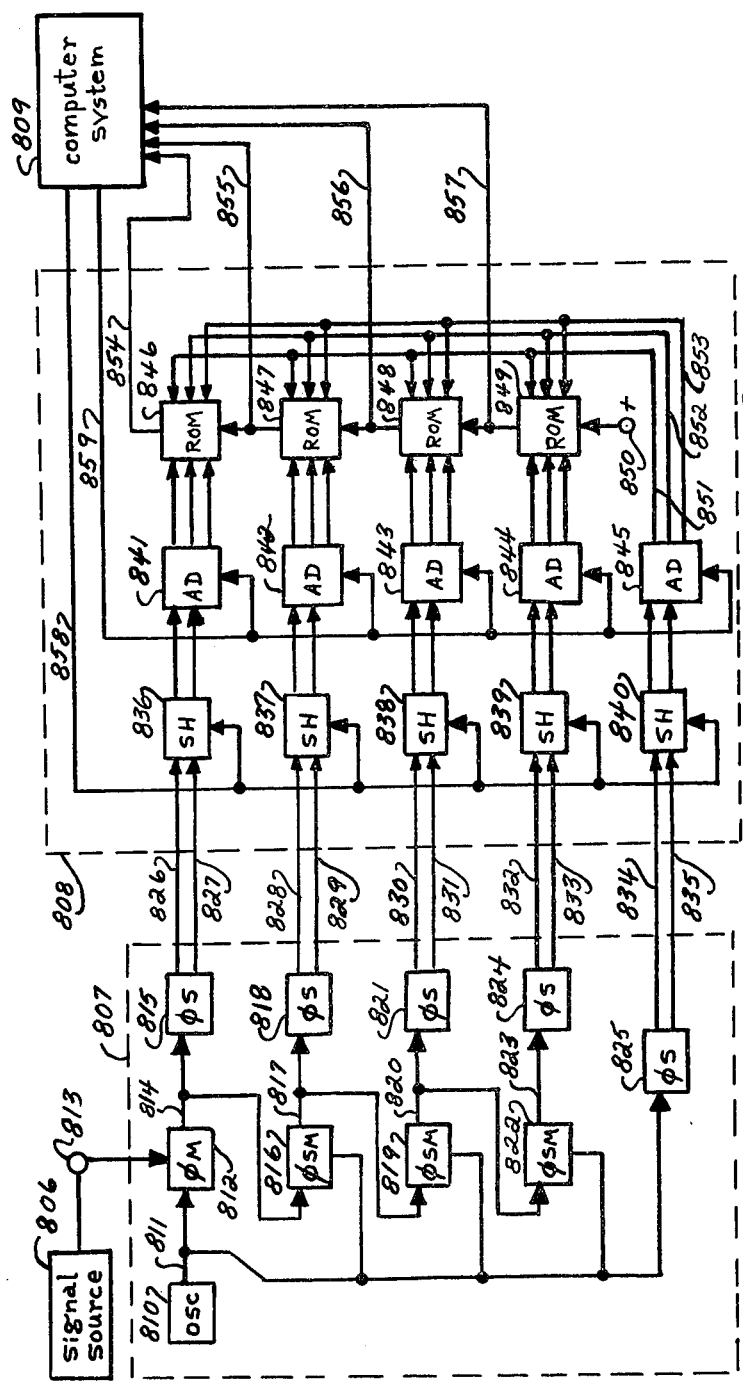
FIG. 24 is a diagrammatic illustration of an eighth form of the invention, showing the analog-to-digital conversion of an analog signal into a four-bit binary number, the sampling of phase modulated carrier frequency signals and digital post-sampling phase detection.

FIG. 24 is a diagrammatic illustration of an eighth form of the invention, showing the analog-to-digital conversion of an analog signal into a four-bit binary number, the sampling of phase modulated carrier frequency signals and digital post-sampling phase detection. FIG. 24 includes a signal source 806, a phase shift multiplication section 807, a sampling section 808 and a digital computer system 809. Within phase shift multiplication section 807, the output of oscillator 810 is connected via line 811 to the carrier signal input of phase modulator 812, to phase reference inputs of phase shift multipliers 816, 819 and 882, and to the input of phase shift 825. The output of signal source 806 is connected to terminal 813, which is connected to the modulation signal input of phase modulator 812. The output of phase modulator 812 is connected via line 814 to the input of phase shift 815 and to the phase signal input of phase shift multiplier 816. The output of phase shift multiplier 816 is connected via line 817 to the input of phase shift 818 and to the phase signal input of phase shift multiplier 819. The output of phase shift multiplier 819 is connected via line 820 to the input of phase shift 821 and to the phase signal input of phase shift multiplier 822. The output of phase shift multiplier 822 is connected via line 823 to the input of phase shift 824.

The two outputs of phase shift 815 are connected to lines 826 and 827. Similarly, the two outputs of phase shift 818 are connected to lines 828 and 829, the two outputs of phase shift 821 are connected to lines 830 and 831, the two outputs of phase shift 824 are connected to lines 832 and 833, and the two outputs of phase shift 825 are connected to lines 834 and 835. Within sampling section 808, lines 826 and 827 are connected to the two signal inputs of dual sample-and-hold 836. Similarly, lines 828 and 829 are connected to the two signal inputs of dual sample-and-hold 837, lines 830 and 831 are connected to the two signal inputs of dual sample-and-hold 838, lines 832 and 833 are connected to the two signal inputs of dual sample-and-hold 839, and lines 834 and 835 are connected to the two signal inputs of dual sample-and-hold 840. The two outputs of dual sample-and-hold 836 are connected to the two signal inputs of angle digitizer 841. Similarly, the two outputs of each of dual sample-and-holds 837, 838, 839 and 840 are connected to the two signal inputs of angle digitizers 842, 843, 844 and 845, respectively. The three outputs of angle digitizer 841 are connected to first, second and third inputs of read-only memory 846. Similarly, the three outputs of angle digitizer 842 are connected to first, second and third inputs of read-only memory 847, the three outputs of angle digitizer 843 are connected to first, second and third inputs of read-only memory 848, and the three outputs of angle digitizer 844 are connected to first, second and third inputs of read-only memory 849. Terminal 850 is connected to a fourth input of read-only memory 849, whose output is connected to line 857 and to a fourth input of read-only memory 848. The output of read-only memory 848 is connected to line 856 and to a fourth input of read-only memory 847. The output of read-only memory 847 is connected to line 855 and to a fourth input of read-only memory 846, whose output is connected to line 854. A first output of angle digitizer 845 is connected via line 851 to fifth inputs of read-only memories 846, 847, 848 and 849. Second and third outputs of angle digitizer 845 are connected via lines 852 and 853, respectively, to sixth and seventh inputs of read-only memories 846, 847, 848 and 849. Lines 854, 855, 856 and 857 are connected to signal inputs of digital computer system 809. A first control signal output of computer system 809 is connected via line 858 to control signal inputs of dual sample-and-holds 836, 837, 838, 839 and 840. A second control signal output of computer system 809 is connected via line 859 to control signal inputs of angle digitizers 841, 842, 843, 844 and 845.

FIG. 22 has shown a system in which analog angle detectors are used to measure the relative phases of the sampled values of carrier frequency signals after the sampling operation. The output signals of the analog angle detectors are used to generate logical and digital signals corresponding to the analog input signal at the effective time of sampling. The sampling, angle detection and digitizing operations need not be performed in that particular order. FIG. 24 is an illustration of a system in which phase detection operations are performed on digitized signals, after the sampling and digitizing operations.

Signal source 806 is a source of an analog signal on terminal 813 which is to be converted into a digital value. The output of oscillator 810 on line 811 corresponds to $\sin(\omega t)$, where $\omega$ is the angular frequency. The output of phase modulator 812 on line 814 corresponds to sin(ωt+θ), where θ is the phase modulation corresponding to the terminal 813 signal. The two outputs of phase shift 815 on lines 825 and 827 correspond to sin(ωt+θ) and cos(ωt+θ), respectively. The outputs of phase shift multipliers 816, 819 and 822 on lines 817, 820 and 823 correspond to sin(ωt+2θ), sin(ωt+4θ) and sin(ωt+8θ), respectively. The two outputs of phase shift 818 on lines 828 and 829 correspond to sin(ωt+2θ) and cos(ωt+2θ), the two outputs of phase shift 821 on lines 830 and 831 correspond to sin(ωt+4θ) and cos(ωt+4θ), the two outputs of phase shift 824 on lines 832 and 833 correspond to sin(ωt+8θ+45°) and cos(ωt+8θ+45°), and the two outputs of phase shift 825 on lines 834 and 835 correspond to sin(ωt+22.5°) and cos(ωt+22.5°).

Figure 25:
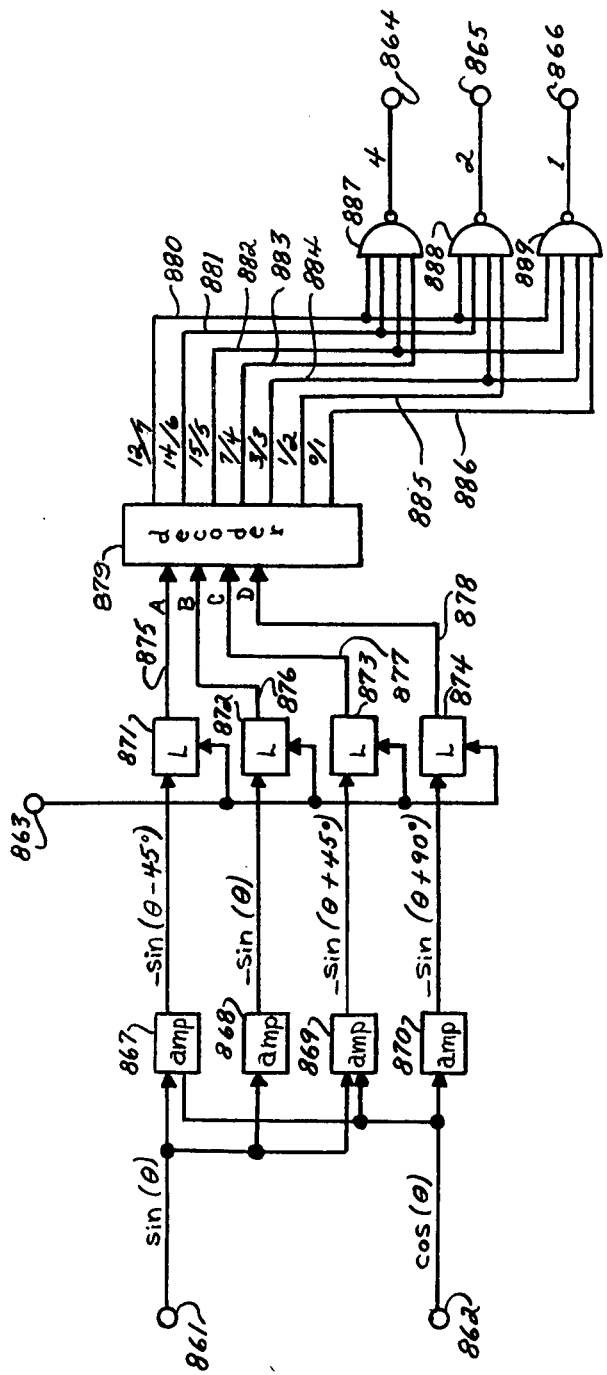
FIG. 25 is a diagrammatic illustration of an octal angle digitizer, which may be used for the angle digitizers in the system of FIG. 24.

When a sampling and analog-to-digital conversion is to be performed, digital computer system 809 transmits control signals on lines 858 and 859. The line 859 control signal controls the sampling operation of latches within angle digitizers 841 through 845. This line 859 control signal is of the general form shown in FIG. 3 and described in connection with the system of FIG. 1. The line 858 control signal slightly precedes the line 859 control signal, and causes sample-and-holds 836 through 840 to sample and hold the values of the line 826 through 835 signals at the desired sampling time. Angle digitizers 841 through 845 then digitize the sample-and-hold 836 through 840 output signals, and generate five octal or three-bit binary numbers corresponding to the analog outputs of sample-and-holds 836 through 840. A circuit which may be used for angle digitizers 841 through 845 is shown in FIG. 25 and will be subsequently described in greater detail. Read-only memories 846 through 849 process the digital signal outputs of angle digitizers 841 through 845 and generate a four-bit binary number on lines 854 through 857. This four-bit binary digital output is transmitted to computer system 809. The most significant bit signal is on line 854 and the least significant bit signal is on line 857. The operation of read-only memories 846 through 849 will be described subsequently in greater detail.

When a sampling and analog-to-digital conversion is to be performed, a control signal on line 858 from computer system 809 causes sample-and-holds 836 through 840 to sample and hold the carrier frequency signals on lines 826 through 835 at that time. The two outputs of dual sample-and-hold 836 will then correspond to sin(ωt'+θ) and cos(ωt'+θ) where t' is the time of sampling. Angle digitizer 841 receives these analog signals and generates a three-bit binary output number corresponding to the value of (ωt'+θ). Angle digitizer 841 will generate a digital value of octal 0 (binary 000) for values of (ωt'+θ) in the range of 0° to 45°, and will generate digital values of 1 (001), 2 (010), 3 (011), 4 (100), 5 (101), 6 (110) and 7 (111) for values of (ωt'+θ) in the ranges of 45° to 90°, 90° to 135°, 135° to 180°, 180° to 225°, 225° to 270°, 270° to 315° and 315° to 360°, respectively. Angle digitizers 842 and 843 similarly generate octal digital values corresponding to the values of (ωt'+2θ) and (ωt'+4θ).

The signals on lines 832 and 833 correspond to sin(ωt+8θ+45°) and cos(ωt+8θ+45°). After the sampling operation by dual sample-and-hold 839, the two outputs of dual sample-and-hold 839 will correspond to sin(ωt'+8θ+45°) and cos(ωt'+8θ+45°). The 45° phase shift in the signals on lines 832 and 833, and of the dual sample-and-hold 839 output signals is to allow the use of the same read-only memory data pattern for all four of read-only memories 846 through 849. The signals on lines 834 and 835 correspond to sin(ωt+22.5°) and cos(ωt+22.5°). After the sampling by dual sample-and-hold 840, the two outputs of dual sample-and-hold 840 will correspond to sin(ωt'+22.5°) and cos(ωt'+22.5°).

The 45° phase offset of the angle signal corresponding to the outputs of dual sample-and-hold 839 has the effect of offsetting the angle ranges corresponding to the angle digitizer 844 output values by 45° or one count. That is, a zero digital output of angle digitizer 845 will correspond to the value of (ωt'+8θ+45°) being in the range of 0° to 45°, and the value of (ωt'+8θ) being in the range of 315° to 360°. The 22.5° phase offset of the angle signal corresponding to the outputs of dual sample-and-hold 840 has the effect of shifting the angle ranges corresponding to the angle digitizer 845 output values by 22.5° or one half count. A zero digital output of angle digitizer 845 will correspond to the value of (ωt'+22.5°) being in the range of 0° to 45°, and the value of (ωt') being in the range 337.5° to 22.5° or −22.5° to +22.5°.

After the five angle signals represented by the outputs of dual sample-and-holds 836 through 840 have been converted into digital form by angle digitizers 841 through 845, the remaining steps are the comparison of the phase angles corresponding to the digital outputs of angle digitizers 841 through 844 with the reference signal output of angle digitizer 845, and the conversion of this relative phase information into an unambiguous four-bit binary number. These two steps may be performed separately via separate means, or together via combination means. In the system of FIG. 24, the phase angle comparison and the conversion into a normal binary number form are both accomplished via a single set of read-only memories.

Read-only memories 846 through 849 are substantially identical and contain the same data patterns. Each one is a seven-bit input (128 word), one bit output read-only memory. Read-only memory 846 is used as an example for a more detailed description of the operation of the read-only memory set. The data values stored in read-only memory 846 are listed in Table 2. Table 2 lists the 128 combinations of the seven binary signals consisting of the line 855 signal, the three-bit output of angle digitizer 845 and the three-bit output of angle digitizer 841. For each value, the resulting read-only memory 846 output signal on line 854 is listed. For convenience, the octal values corresponding to the three-bit binary outputs of angle digitizers 841 and 845 are also listed in Table 2.

Table 2

| Data Values for Read-Only Memory 846 of FIG. 24. | | | | | | | | |
|---|---|---|---|---|---|---|---|---|
| line 855 signal | AD 845 output | | | | AD 841 output | | | ROM 846 output |
| | 4 | 2 | 1 | oct | 4 | 2 | 1 | oct | |
| 0 | 0 | 0 | 0 | 0 | 0 | 0 | 0 | 0 | 0 |
| | | | | | 0 | 0 | 1 | 1 | 0 |
| | | | | | 0 | 1 | 0 | 2 | 0 |
| | | | | | 0 | 1 | 1 | 3 | 1 |
| | | | | | 1 | 0 | 0 | 4 | 1 |
| | | | | | 1 | 0 | 1 | 5 | 1 |
| | | | | | 1 | 1 | 0 | 6 | 1 |
| | | | | | 1 | 1 | 1 | 7 | 0 |
| | 0 | 0 | 1 | 1 | 0 | 0 | 0 | 0 | 0 |
| | | | | | 0 | 0 | 1 | 1 | 0 |
| | | | | | 0 | 1 | 0 | 2 | 0 |
| | | | | | 0 | 1 | 1 | 3 | 0 |
| | | | | | 1 | 0 | 0 | 4 | 1 |
| | | | | | 1 | 0 | 1 | 5 | 1 |
| | | | | | 1 | 1 | 0 | 6 | 1 |

Table 2-continued
Data Values for Read-Only Memory 846 of FIG. 24.

| line 855 signal | AD 845 output 4 | 2 | 1 | oct | AD 841 output 4 | 2 | 1 | oct | ROM 846 output |
|---|---|---|---|---|---|---|---|---|---|
|   |   |   |   |   | 1 | 1 | 1 | 7 | 1 |
|   | 0 | 1 | 0 | 2 | 0 | 0 | 0 | 0 | 1 |
|   |   |   |   |   | 0 | 0 | 1 | 1 | 0 |
|   |   |   |   |   | 0 | 1 | 0 | 2 | 0 |
|   |   |   |   |   | 0 | 1 | 1 | 3 | 0 |
|   |   |   |   |   | 1 | 0 | 0 | 4 | 0 |
|   |   |   |   |   | 1 | 0 | 1 | 5 | 1 |
|   |   |   |   |   | 1 | 1 | 0 | 6 | 1 |
|   |   |   |   |   | 1 | 1 | 1 | 7 | 1 |
|   | 0 | 1 | 1 | 3 | 0 | 0 | 0 | 0 | 1 |
|   |   |   |   |   | 0 | 0 | 1 | 1 | 1 |
|   |   |   |   |   | 0 | 1 | 0 | 2 | 0 |
|   |   |   |   |   | 0 | 1 | 1 | 3 | 0 |
|   |   |   |   |   | 1 | 0 | 0 | 4 | 0 |
|   |   |   |   |   | 1 | 0 | 1 | 5 | 0 |
|   |   |   |   |   | 1 | 1 | 0 | 6 | 1 |
|   |   |   |   |   | 1 | 1 | 1 | 7 | 1 |
| 0 | 1 | 0 | 0 | 4 | 0 | 0 | 0 | 0 | 1 |
|   |   |   |   |   | 0 | 0 | 1 | 1 | 1 |
|   |   |   |   |   | 0 | 1 | 0 | 2 | 1 |
|   |   |   |   |   | 0 | 1 | 1 | 3 | 0 |
|   |   |   |   |   | 1 | 0 | 0 | 4 | 0 |
|   |   |   |   |   | 1 | 0 | 1 | 5 | 0 |
|   |   |   |   |   | 1 | 1 | 0 | 6 | 0 |
|   |   |   |   |   | 1 | 1 | 1 | 7 | 1 |
|   | 1 | 0 | 1 | 5 | 0 | 0 | 0 | 0 | 1 |
|   |   |   |   |   | 0 | 0 | 1 | 1 | 1 |
|   |   |   |   |   | 0 | 1 | 0 | 2 | 1 |
|   |   |   |   |   | 0 | 1 | 1 | 3 | 1 |
|   |   |   |   |   | 1 | 0 | 0 | 4 | 0 |
|   |   |   |   |   | 1 | 0 | 1 | 5 | 0 |
|   |   |   |   |   | 1 | 1 | 0 | 6 | 0 |
|   |   |   |   |   | 1 | 1 | 1 | 7 | 0 |
|   | 1 | 1 | 0 | 6 | 0 | 0 | 0 | 0 | 0 |
|   |   |   |   |   | 0 | 0 | 1 | 1 | 1 |
|   |   |   |   |   | 0 | 1 | 0 | 2 | 1 |
|   |   |   |   |   | 0 | 1 | 1 | 3 | 1 |
|   |   |   |   |   | 1 | 0 | 0 | 4 | 1 |
|   |   |   |   |   | 1 | 0 | 1 | 5 | 0 |
|   |   |   |   |   | 1 | 1 | 0 | 6 | 0 |
|   |   |   |   |   | 1 | 1 | 1 | 7 | 0 |
|   | 1 | 1 | 1 | 7 | 0 | 0 | 0 | 0 | 0 |
|   |   |   |   |   | 0 | 0 | 1 | 1 | 0 |
|   |   |   |   |   | 0 | 1 | 0 | 2 | 1 |
|   |   |   |   |   | 0 | 1 | 1 | 3 | 1 |
|   |   |   |   |   | 1 | 0 | 0 | 4 | 1 |
|   |   |   |   |   | 1 | 0 | 1 | 5 | 1 |
|   |   |   |   |   | 1 | 1 | 0 | 6 | 0 |
|   |   |   |   |   | 1 | 1 | 1 | 7 | 0 |
| 1 | 0 | 0 | 0 | 0 | 0 | 0 | 0 | 0 | 1 |
|   |   |   |   |   | 0 | 0 | 1 | 1 | 0 |
|   |   |   |   |   | 0 | 1 | 0 | 2 | 0 |
|   |   |   |   |   | 0 | 1 | 1 | 3 | 0 |
|   |   |   |   |   | 1 | 0 | 0 | 4 | 0 |
|   |   |   |   |   | 1 | 0 | 1 | 5 | 1 |
|   |   |   |   |   | 1 | 1 | 0 | 6 | 1 |
|   |   |   |   |   | 1 | 1 | 1 | 7 | 1 |
|   | 0 | 0 | 1 | 1 | 0 | 0 | 0 | 0 | 1 |
|   |   |   |   |   | 0 | 0 | 1 | 1 | 1 |
|   |   |   |   |   | 0 | 1 | 0 | 2 | 0 |
|   |   |   |   |   | 0 | 1 | 1 | 3 | 0 |
|   |   |   |   |   | 1 | 0 | 0 | 4 | 0 |
|   |   |   |   |   | 1 | 0 | 1 | 5 | 0 |
|   |   |   |   |   | 1 | 1 | 0 | 6 | 1 |
|   |   |   |   |   | 1 | 1 | 1 | 7 | 1 |
|   | 0 | 1 | 0 | 2 | 0 | 0 | 0 | 0 | 1 |
|   |   |   |   |   | 0 | 0 | 1 | 1 | 1 |
|   |   |   |   |   | 0 | 1 | 0 | 2 | 1 |
|   |   |   |   |   | 0 | 1 | 1 | 3 | 0 |
|   |   |   |   |   | 1 | 0 | 0 | 4 | 0 |
|   |   |   |   |   | 1 | 0 | 1 | 5 | 0 |
|   |   |   |   |   | 1 | 1 | 0 | 6 | 0 |
|   |   |   |   |   | 1 | 1 | 1 | 7 | 1 |
|   | 0 | 1 | 1 | 3 | 0 | 0 | 0 | 0 | 1 |
|   |   |   |   |   | 0 | 0 | 1 | 1 | 1 |
|   |   |   |   |   | 0 | 1 | 0 | 2 | 1 |
|   |   |   |   |   | 0 | 1 | 1 | 3 | 1 |
|   |   |   |   |   | 1 | 0 | 0 | 4 | 0 |
|   |   |   |   |   | 1 | 0 | 1 | 5 | 0 |
|   |   |   |   |   | 1 | 1 | 0 | 6 | 0 |
|   |   |   |   |   | 1 | 1 | 1 | 7 | 0 |
|   | 1 | 0 | 0 | 4 | 0 | 0 | 0 | 0 | 0 |
|   |   |   |   |   | 0 | 0 | 1 | 1 | 1 |
|   |   |   |   |   | 0 | 1 | 0 | 2 | 1 |
|   |   |   |   |   | 0 | 1 | 1 | 3 | 1 |
|   |   |   |   |   | 1 | 0 | 0 | 4 | 1 |
|   |   |   |   |   | 1 | 0 | 1 | 5 | 1 |
|   |   |   |   |   | 1 | 1 | 0 | 6 | 0 |
|   |   |   |   |   | 1 | 1 | 1 | 7 | 0 |
|   | 1 | 0 | 1 | 5 | 0 | 0 | 0 | 0 | 0 |
|   |   |   |   |   | 0 | 0 | 1 | 1 | 0 |
|   |   |   |   |   | 0 | 1 | 0 | 2 | 1 |
|   |   |   |   |   | 0 | 1 | 1 | 3 | 1 |
|   |   |   |   |   | 1 | 0 | 0 | 4 | 1 |
|   |   |   |   |   | 1 | 0 | 1 | 5 | 1 |
|   |   |   |   |   | 1 | 1 | 0 | 6 | 0 |
|   |   |   |   |   | 1 | 1 | 1 | 7 | 0 |
|   | 1 | 1 | 0 | 6 | 0 | 0 | 0 | 0 | 0 |
|   |   |   |   |   | 0 | 0 | 1 | 1 | 0 |
|   |   |   |   |   | 0 | 1 | 0 | 2 | 0 |
|   |   |   |   |   | 0 | 1 | 1 | 3 | 1 |
|   |   |   |   |   | 1 | 0 | 0 | 4 | 1 |
|   |   |   |   |   | 1 | 0 | 1 | 5 | 1 |
|   |   |   |   |   | 1 | 1 | 0 | 6 | 1 |
|   |   |   |   |   | 1 | 1 | 1 | 7 | 0 |
|   | 1 | 1 | 1 | 7 | 0 | 0 | 0 | 0 | 0 |
|   |   |   |   |   | 0 | 0 | 1 | 1 | 0 |
|   |   |   |   |   | 0 | 1 | 0 | 2 | 0 |
|   |   |   |   |   | 0 | 1 | 1 | 3 | 0 |
|   |   |   |   |   | 1 | 0 | 0 | 4 | 1 |
|   |   |   |   |   | 1 | 0 | 1 | 5 | 1 |
|   |   |   |   |   | 1 | 1 | 0 | 6 | 1 |
|   |   |   |   |   | 1 | 1 | 1 | 7 | 1 |

In examining the operation of read-only memory 846, assume initially that the line 855 signal is low or zero, and that the value of ($\omega t'$) is in the range of +22.5° so that the output of angle digitizer 845 will be zero. From Table 2, the output of read-only memory 846 will be zero for angle digitizer 841 output values of 0 through 2. Since ($\omega t'$) is approximately zero, this corresponds to a range of $\theta$ of approximately 0° to 135°. The output of read-only memory 846 will be one for angle digitizer 841 outputs of 3 through 6, corresponding to a range of $\theta$ of approximately 135° through 315°. The output of read-only memory 846 will be zero for an angle digitizer 841 output value of 7, corresponding to a range of $\theta$ of approximately 315° to 360°. Referring to FIG. 4B, it may be seen that the read-only memory 846 output under these conditions follows the function plotted in FIG. 4B which is the polarity of $-\sin(\theta+45°)$. Hence, when the line 855 signal is low and the sampled value of ($\omega t'$) is approximately zero, the output of read-only memory 846 on line 854 will be substantially the same as the output of OR gate 73 of FIG. 1 on terminal 74. Similarly, when the line 855 signal is high, the output of read-only memory 846 on line 854 will be substantially the same as the $-\sin(\theta-45°)$ function plotted in FIG. 4A and will again correspond to the output of OR gate 73 on terminal 74. Thus, when the sampled value of ($\omega t'$) is near zero, the system of FIG. 24 will generate the most significant bit of the four-bit binary output number on line 854 in a manner similar to the generation of the most significant bit of a four-bit number by the system of FIG. 1.

For other values of angle digitizer 845 outputs, it may be seen from Table 2 that read-only memory 846 will generate output signals corresponding to the polarity of $-\sin(\theta'-45°)$ and $-\sin(\theta'+45°)$ for high and low values of the line 855 signal, where $\theta'$ is the difference between the angle corresponding to the angle digitizer 841 output and the angle digitizer 845 output.

Read-only memories 847 and 848 operate in a similar manner to generate the two middle bits of the four-bit binary number on lines 855 and 856. Terminal 850 is connected to a positive voltage source which serves as a constant high or binary one input on that line. The practice of tying inputs of TTL type logical devices to a zero voltage source for a constant low or binary zero input, and to a +5 volt source for a constant high or binary one signal is well known. In some instances, it is a preferred practice to make the connection to a +5 volt source through a resistor with a resistance value of the order of a few hundred to a thousand ohms. Since the line 832 and 833 signals are of the form $\sin(\omega t + 8\theta + 45°)$ and $\cos(\omega t + 8\theta + 45°)$, the output of angle digitizer 844 will correspond to $(\omega t' + 8\theta + 45°)$. With the constant high signal on terminal 850, read-only memory 849 will subtract the phase angle corresponding to the output of angle digitizer 845 and generate a logic level signal on line 857 corresponding to the polarity of $-\sin(8\theta')$. This is the least significant bit of the four-bit binary number corresponding to the sampled value of the terminal 813 signal.

The digitizing of the angle signals by angle digitizers 841 through 845 will introduce quantizing errors. For example, a value of zero from angle digitizer 841 indicates that the angle signal input to angle digitizer 841 is in the range of 0° to 45° or 22.5° ± 22.5°. Thus, the possible quantizing error is ±22.5°. There is a similar ±22.5° possible quantizing error in the digitizing of the output of dual sample-and-hold 840 by angle digitizer 845. The sum of these two quantizing errors gives a possible quantizing error of ±45° in the measurement of the relative phase angles by the comparison of the outputs of angle digitizers 841 through 845. These quantizing errors are equivalent to possible ±45° variations in the transition points of the functions plotted in FIGS. 4A through 4F. Because of the similarity of the operation of the set of read-only memories 846 through 849 to the two-phase ambiguity resolution and binary number generation process illustrated in FIG. 4, these quantizing errors are generally not significant. That is, they may cause the resulting binary number to be one count high or low but will not, in general, cause the generation of binary output values which differ greatly from a correct reading.

FIG. 25 is a diagrammatic illustration of an octal angle digitizer, which may be used for angle digitizers 841, 842, 843, 844 and 845 in the system of FIG. 24. FIG. 25 includes signal input terminals 861 and 862, control signal input terminal 863 and signal output terminals 864, 865 and 866. Terminal 861 is connected to a first input of amplifier 867, to the input of amplifier 868 and to a first input of amplifier 869. Terminal 862 is connected to second inputs of amplifiers 867 and 869, and to the input of amplifier 870. The outputs of amplifiers 867, 868, 869 and 870 are connected to the signal inputs of latches 871, 872, 873 and 874, respectively. Terminal 863 is connected to control signal inputs of latches 871, 872, 873 and 874. The outputs of latches 871, 872, 873 and 874 are connected via lines 875, 876, 877 and 878, respectively, to the four signal inputs of decoder 879. A first output of decoder 879 is connected via line 880 to first inputs of NAND gates 887, 888 and 889, a second output is connected via line 881 to second inputs of gates 887 and 888, a third output is connected via line 882 to a third input of gate 887 and to a second input of gate 889, a fourth output is connected via line 883 to a fourth input of gate 887, a fifth output is connected via line 884 to third inputs of gates 888 and 889, a sixth output is connected via line 885 to a fourth input of gate 888, and a seventh output is connected via line 886 to a fourth input of gate 889. The outputs of gates 887, 888 and 889 are connected to terminals 864, 865 and 866, respectively.

The circuit of FIG. 25 will convert an angle signal into a three-bit binary, or octal digital value. The angle signal is applied to terminals 861 and 862 in the form of $\sin(\theta)$ and $\cos(\theta)$ component signals, respectively, where $\theta$ is the angle to be digitized by the circuit of FIG. 25. The three-bit binary number is generated on terminals 864, 865 and 866. The most significant or four bit is on terminal 864, the middle or two bit is on terminal 865 and the least significant or one bit is on terminal 866. If the circuit of FIG. 25 is used for angle digitizer 841 of FIG. 24, terminals 861 and 862 would be connected to the two outputs of dual sample-and-hold 836, terminals 864, 865 and 866 would be connected to inputs of read-only memory 846, and terminal 863 would be connected to control signal line 859. Corresponding connections would be made when the circuit of FIG. 25 is used for angle digitizers 842 through 845.

Amplifiers 868 and 870 are of the form of the circuit of FIG. 20, and generate logic level signals corresponding to the polarities of $-\sin(\theta)$ and $-\sin(\theta + 90°)$, respectively. From trigonometry, $\sin(\theta + 90°)$ is equivalent to $\cos(\theta)$. Amplifier 867 is of the form of the circuit of FIG. 18, and generates a logic level signal corresponding to the polarity of $-\sin(\theta - 45°)$. Amplifier 869 is of the form of the circuit of FIG. 19, and generates a logic level signal corresponding to the polarity of $-\sin(\theta + 45°)$. The amplifier 867 through 870 output signals are sampled by latches 871 through 874 under the control of the terminal 863 signal, and are then converted into a three-bit binary number.

FIGS. 26A through 26D illustrate the angle digitizing process of the circuit of FIG. 25 in greater detail. FIGS. 26A, 26B, 26C and 26D are plots of the signals on lines 875, 876, 877 and 878, respectively. FIGS. 26A through 26D are plotted as functions of the value of the analog angle signal $\theta$ at the most recent time of sampling. They are plotted over a 0° to 360° range of $\theta$, which is specifically marked on FIG. 26A. The $\theta$ or angle variable scale is also divided into eight segments of 45° each. The individual segments are identified as segments 0 through 7, and are specifically marked on FIG. 26B. The signals shown in FIGS. 26A–26D are logic level signals which are normally either high or low and, in general, not of an intermediate value. As may be seen, the four signals of FIGS. 26A–26D uniquely identify the octal digital value corresponding to the value of $\theta$.

Figure 26A:
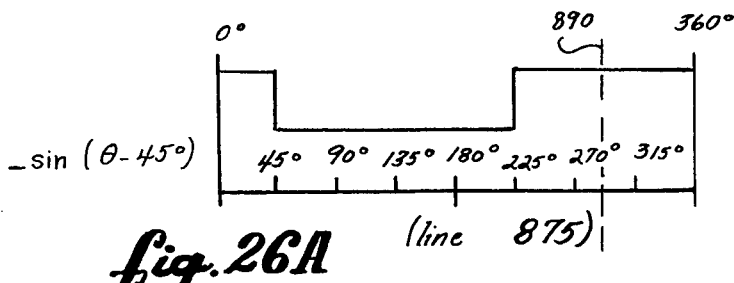
FIG. 26A through 26D are graphical illustrations of certain logic level signals within the octal digitizer circuit of FIG. 25, plotted as functions of the angle signal being measured by that digitizer circuit.
Figure 26B:
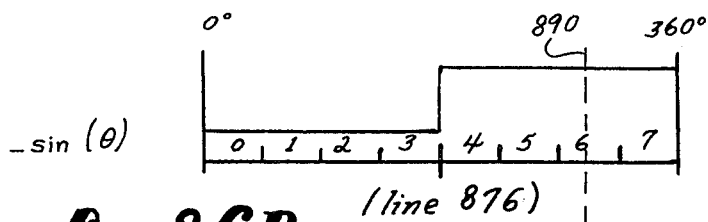
Figure 26C:
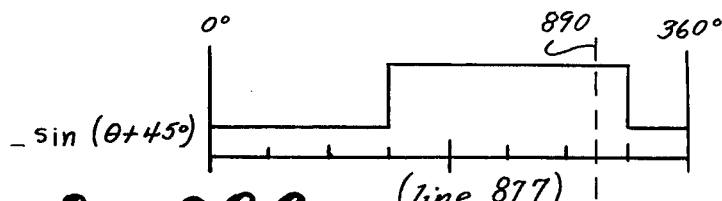
Figure 26D:
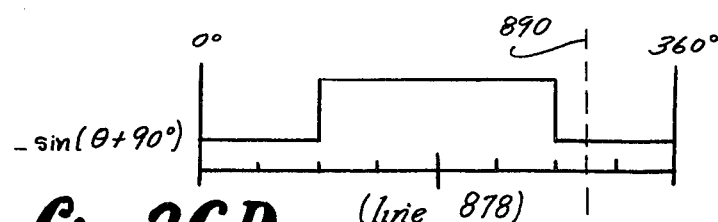

FIG. 26A is a plot of the line 875 signal, the output of latch 871 corresponding to the polarity of $-\sin(\theta - 45°)$ at the most recent time of sampling by latch 871. FIGS. 26B through 26D are similar plots of the line 876, 877 and 878 signals, corresponding to the polarities of $-\sin(\theta)$, $-\sin(\theta + 45°)$ and $-\sin(\theta + 90°)$ at the most recent time of sampling by latches 872, 873 and 874, respectively. The function of FIG. 26A is high in octal segment zero, low in octal segments 1 through 4, and high in octal segments 5 through 7. The functions of FIGS. 26B through 26D are similar in shape, but are staggered in phase relative to the plot of FIG. 26A.

Figure 27:
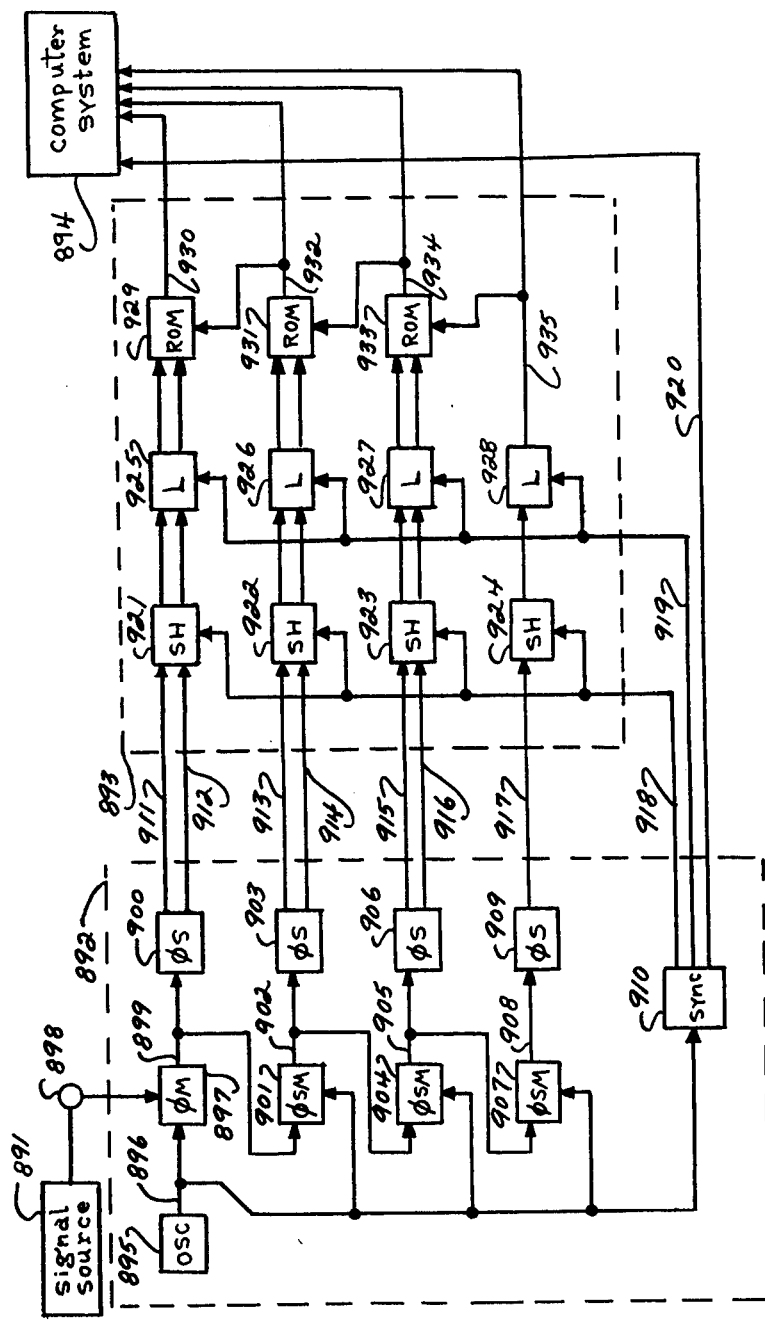
FIG. 27 is a diagrammatic illustration of a ninth form of the invention showing the analog-to-digital conversion of an analog signal into a four-bit binary number, and the sampling of phase modulated carrier frequency signals at a time which is synchronized with the unmodulated carrier signal.

The combination of decoder 879 and gates 887, 888 and 889 serve, in effect, as a read-only memory for the conversion of a four-bit "word address" signal on lines 875 through 878 into a three-bit data value on terminals 864 through 866. A four-bit input (16 word), three bit per word read-only memory could be used for this purpose. FIG. 27 illustrates an alternate approach for providing substantially the same function.

Decoder 879 is a four-bit input 16 line output decoder of the type available as a standard integrated circuit device in the 7400 series TTL integrated circuit family. For each set of binary signals applied to the four address input lines 875 through 878, a unique one of the 16 output lines will be pulled down to a low state. The other 15 output lines will be high. Line 875, input A is the most significant bit of the four-bit input signal to decoder 879, and line 878, input D is the least significant bit. In the circuit of FIG. 25, only seven of the 16 output lines of decoder 879 are used. The other nine lines are not connected and are not shown in FIG. 25.

The operation of decoder 879 of FIG. 25 and the associated gates 887 through 889 is illustrated in Table 3. Table 3 includes eight rows, one for each of the angular segments shown in FIGS. 26A–26D. For each angular segment, Table 3 lists the four input signals to decoder 879 on lines 875 through 878, identified as signals A through D, respectively, the corresponding decoded decimal value, and the gate output signals on terminals 864 through 866. The gate output signals on terminals 864, 865 and 866 are identified by the column headings 4, 2 and 1, respectively, the binary weighting values. Line 880 is identified in FIG. 25 as line 12/7. This is intended to indicate that it is the line normally identified as the 12 output line of decoder 879 and which is used to generate a digital value of 7 in the circuit of FIG. 25. Lines 881 through 886 are similarly marked.

Table 3
Operation of Decoder 879 of Fig. 25.

| angular segment No. | decoder 879 input signals | | | | decoded decimal value | gate output signals | | |
|---|---|---|---|---|---|---|---|---|
| | A | B | C | D | | 4 | 2 | 1 |
| 0 | 1 | 0 | 0 | 0 | 8 | 0 | 0 | 0 |
| 1 | 0 | 0 | 0 | 0 | 0 | 0 | 0 | 1 |
| 2 | 0 | 0 | 0 | 1 | 1 | 0 | 1 | 0 |
| 3 | 0 | 0 | 1 | 1 | 3 | 0 | 1 | 1 |
| 4 | 0 | 1 | 1 | 1 | 7 | 1 | 0 | 0 |
| 5 | 1 | 1 | 1 | 1 | 15 | 1 | 0 | 1 |
| 6 | 1 | 1 | 1 | 0 | 14 | 1 | 1 | 0 |
| 7 | 1 | 1 | 0 | 0 | 12 | 1 | 1 | 1 |

As an example, consider the digitizing of an angle signal with a value approximately midway between 270° and 315° at the time of sampling, as indicated by dotted line 890 in FIGS. 26A–26D. The line 875, 876 and 877 signals will be high as shown in FIGS. 26A, 26B and 26C. The line 878 signal will be low as shown in FIG. 26D. Referring to Table 3, this combination of signals corresponds to angular segment 6 and decoded decimal value 14. Hence, decoder 879 will generate a low signal on line 881, line 14/6. The low signal on line 881 will cause the outputs of NAND gates 887 and 888 to be high. Since line 881 is not connected to NAND gate 889, and all of the other line 880 through 886 outputs of decoder 879 are high, the output of NAND gate 889 will be low. The output signals on terminals 864 through 866 will be binary 110 or decimal 6. Thus, the system of FIG. 25 has performed an analog-to-digital conversion of the angle signal represented by dotted line 890. The system of FIG. 25 will generate three-bit binary or octal values from 000 (octal 0) through 111 (octal 7) for angle signal inputs over a range of 0° to 360°.

As may be seen from FIGS. 26A through 26D, an octal output of 0 on terminals 864 through 866 (binary 000) will correspond to a value of θ in the range of 0° to 45°. Similarly, octal values of 1 (001), 2 (010), 3 (011), 4 (100), 5 (101), 6 (110) and 7 (111) will correspond to angle signal ranges of 45° to 90°, 90° to 135°, 135° to 80°, 180° to 225°, 225° to 270°, 270° to 315° and 315° to 360°, respectively.

FIG. 27 is a diagrammatic illustration of a ninth form of the invention showing the analog-to-digital conversion of an analog signal into a four-bit binary number, and the sampling of phase modulated carrier frequency signals at a time which is synchronized with the unmodulated carrier signal. FIG. 27 includes a signal source 891, a phase shift multiplication section 892, a sampling section 893 and a digital computer system 894. Within phase shift multiplication section 892, the output of oscillator 895 is connected via line 896 to the carrier signal input of phase modulator 897, to phase reference inputs of phase shift multipliers 901, 904 and 907, and to the input of synchronizer 910. The output of signal source 891 is connected to terminal 898, which is connected to the modulation signal input of phase modulator 897. The output of phase modulator 897 is connected via line 899 to the input of phase shift 900 and to the phase signal input of phase shift multiplier 901. The output of phase shift multiplier 901 is connected via line 902 to the input of phase shift 903 and to the phase signal input of phase shift multiplier 904. The output of phase shift multiplier 904 is connected via line 905 to the input of phase shift 906 and to the phase signal input of phase shift multiplier 907. The output of phase shift multiplier 907 is connected via line 908 to the input of phase shift 909. The two outputs of phase shift 900 are connected to lines 911 and 912, the two outputs of phase shift 903 are connected to lines 913 and 914, the two outputs of phase shift 906 are connected to lines 915 and 916, and the output of phase shift 909 is connected to line 917. The three outputs of synchronizer 910 are connected to lines 918, 919 and 920. Within sampling section 893, lines 911 and 912 are connected to the two signal inputs of dual sample-and-hold 921, lines 913 and 914 are connected to the two signal inputs of dual sample-and-hold 922, lines 915 and 916 are connected to the two signal inputs of dual sample-and-hold 923, and line 917 is connected to the signal input of sample-and-hold 924. The two outputs of dual sample-and-hold 921 are connected to the two signal inputs of dual latch 925, whose two outputs are connected to first and second inputs of read-only memory 929. The output of read-only memory 929 is connected to line 930. The two outputs of dual sample-and-hold 922 are connected to the two signal inputs of dual latch 926, whose two outputs are connected to first and second inputs of read-only memory 931. The output of read-only memory 931 is connected to line 932 and to a third input of read-only memory 929. The two outputs of dual sample-and-hold 923 are connected to the two signal inputs of dual latch 927, whose two outputs are connected to first and second inputs of read-only memory 933. The output of read-only memory 933 is connected to line 934 and to a third input of read-only memory 931. The output of sample-and-hold 924 is connected to the signal input of latch 928, whose output is connected to line 935 and to a third input of read-only memory 933. Lines 930, 932, 934 and 935 are connected to signal inputs of digital computer system 894. Line 918 is connected to control signal inputs of dual sample-and-holds 921, 922 and 923, and sample-and-hold 924. Line 919 is connected to control signal inputs of dual latches 925, 926 and 927, and latch 928. Line 920 is connected to a control signal input of computer system 894.

FIGS. 22 and 24 have shown systems in which phase detection operations are performed upon the sampled values of carrier frequency phase modulated signals. In each case, the sampled phase modulated signal values were compared with the sampled values of an unmodulated carrier frequency reference signal. The sampling and conversion process was under the control of a digital computer system, not under the control of the analog-to-digital conversion system. Another approach is to synchronize the sampling of the phase modulated signals with a carrier frequency phase reference signal so that the sampling is always performed at substantially the same phase of the reference signal. There is then no need to sample a carrier frequency phase reference signal, as the sampled values thereof would always be substantially the same. In many instances, the use of such synchronized sampling can significantly simplify the post-sampling phase detection process. FIG. 27 is an illustration of such a synchronized sampling system.

Signal source 891 is a source of an analog signal on terminal 898 which is to be converted into a digital value. The output signal of oscillator 895 on line 896 corresponds to sin($\omega t$), where $\omega$ is the angular frequency. The output of phase modulator 897 on line 899 corresponds to sin($\omega t + \theta$), where $\theta$ is the phase modulation angle corresponding to the value of the terminal 898 signal. The two outputs of phase shift 900 on lines 911 and 912 correspond to $-\sin(\omega t + \theta - 45°)$ and $-\sin(\omega t + \theta + 45°)$, respectively. Because of the phase shift multiplications performed by phase shift multipliers 901, 904 and 907, the signals on lines 902, 905 and 908 will be of the form sin($\omega t + 2\theta$) and sin($\omega t + 8\theta$), respectively. The two outputs of phase shift 903 on lines 913 and 914 will correspond to $-\sin(\omega t + 2\theta - 45°)$ and $-\sin(\omega t + 2\theta + 45°)$, respectively. The two outputs of phase shift 906 on lines 915 and 916 will correspond to $-\sin(\omega t + 4\theta - 45°)$ and $-\sin(\omega t + 4\theta + 45°)$, respectively. The output of phase shift 909 on line 917 will correspond to $-\sin(\omega t + 8\theta)$.

Synchronizer 910 provides a set of control signals once each $n$ cycles of the line 896 carrier frequency signal, where $n$ is an integer greater than zero selected in accordance with the desired sampling and conversion rate. Each set of control signals includes a control signal on line 918 which causes sample-and-holds 921 through 924 to sample and hold the line 911 through 917 values at a time when the value of ($\omega t$) is effectively equal to zero. That is, when the value of sin($\omega t$) is substantially equal to zero and has a positive time derivative. The line 919 control signal follows shortly thereafter, and causes latches 925 through 928 to sample and hold a set of logical values corresponding to the polarities of the outputs of sample-and-holds 921 through 924. The third and last control signal on line 920 indicates to computer system 894 that a sampling and conversion has been completed, and that valid digital data is being transmitted on lines 930, 932, 934 and 935. The output data is transmitted as a four-bit binary number on lines 930, 932, 934 and 935. The most significant bit signal is on line 930 and the least significant bit signal is on line 935. The system of FIG. 27 differs from the previously described systems in that analog-to-digital conversions are performed periodically under the control of synchronizer 910, rather than upon command from digital computer system 894.

After a sampling operation has been performed by dual sample-and-hold 921, its output signals will correspond to $-\sin(\omega t' + \theta - 45°)$ and $-\sin(\omega t' + \theta + 45°)$, where $t'$ is the time of sampling. As previously mentioned, the sampling will be performed at a time such that the value of $\omega t'$ is effectively zero. Hence, the output signals of dual sample-and-hold 921 will correspond to $-\sin(\theta - 45°)$ and $-\sin(\theta + 45°)$. Similarly, the outputs of dual sample-and-hold 922 will correspond to $-\sin(2\theta - 45°)$ and $-\sin(2\theta + 45°)$, the two outputs of dual sample-and-hold 923 will correspond to $-\sin(4\theta - 45°)$ and $-\sin(4\theta + 45°)$, and the output of sample-and-hold 924 will correspond to $-\sin(8\theta)$. After the sampling by latches 925 through 928, their output signals will correspond to the polarities of $-\sin(\theta - 45°)$, $-\sin(\theta + 45°)$, $-\sin(2\theta - 45°)$, $-\sin(2\theta + 45°)$, $-\sin(4\theta - 45°)$, $-\sin(4\theta + 45°)$ and $-\sin(8\theta)$. These signals form a two-phase code representation of a four-bit binary number corresponding to the value of the terminal 898 analog signal at the effective time of sampling. This two-phase intermediate code representation is converted into a normal binary code representation by read-only memories 929, 931 and 933, in substantially the same manner as the conversion of a seven line two-phase intermediate code representation into a four-bit normal binary code by read-only memories 776, 778 and 780 of FIG. 22.

Figure 28:
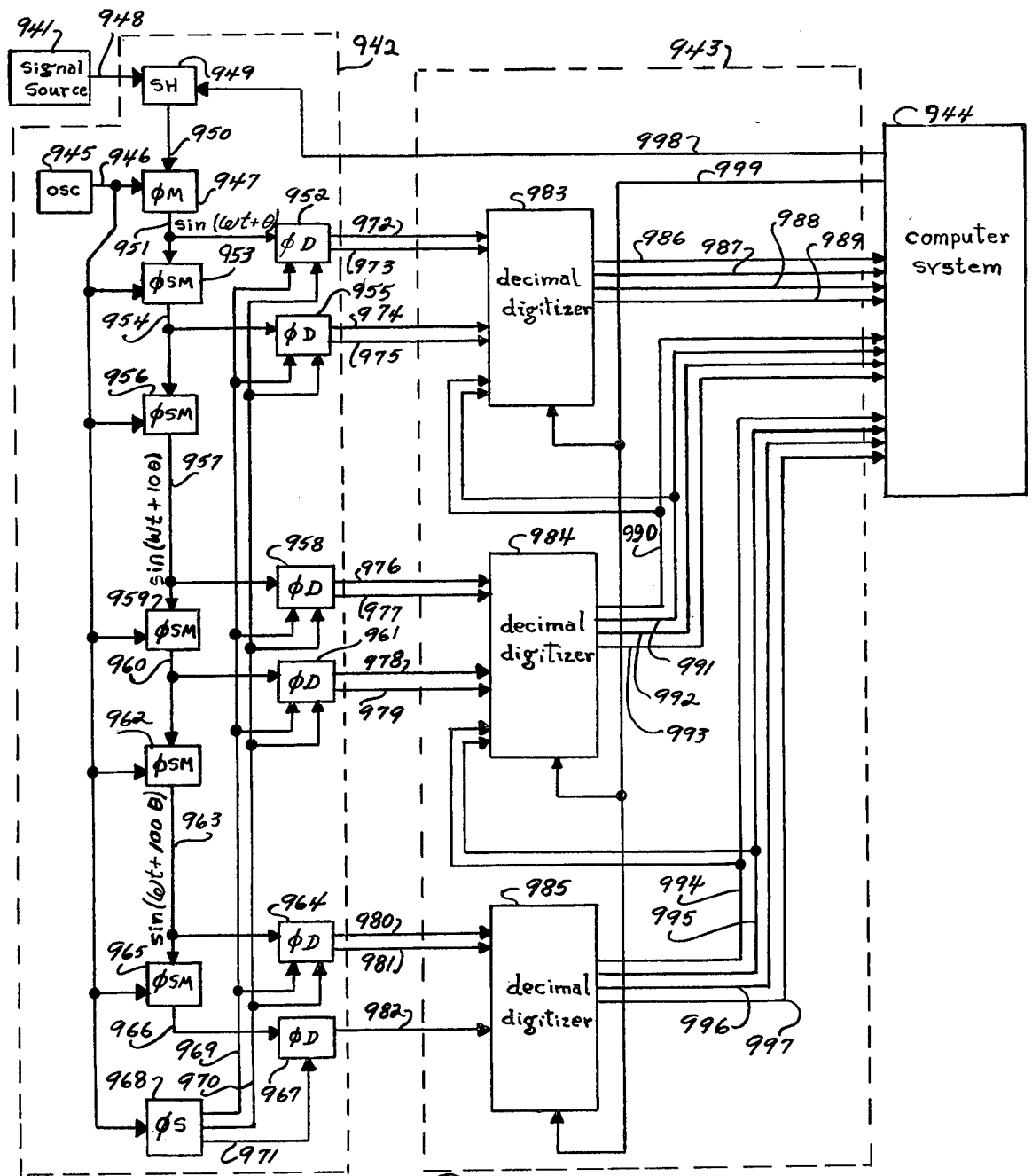
FIG. 28 is a diagrammatic illustration of a tenth form of the invention showing the analog-to-digital conversion of an analog signal into a three-digit decimal number.

FIG. 28 is a diagrammatic illustration of a tenth form of the invention showing the analog-to-digital conversion of an analog signal into a three-digit decimal number. FIG. 28 includes a signal source 941, a phase shift multiplication section 942, a sampling section 943 and a digital computer system 944. Within phase shift multiplication section 942, the output of oscillator 945 is connected via line 946 to the carrier signal input of phase modulator 947, to phase reference inputs of phase shift multipliers 953, 956, 959, 962 and 965, and to the input of phase shift 968. Signal source 941 is connected via line 948 to the signal input of sample-and-hold 949. The output of sample-and-hold 949 is connected via line 950 to the modulation signal input of phase modulator 947. The output of phase modulator 947 is connected via line 951 to phase signal inputs of dual phase detector 952 and phase shift multiplier 953. The output of phase shift multiplier 953 is connected via line 954 to phase signal inputs of dual phase detector 955 and phase shift multiplier 956. The output of phase shift multiplier 956 is connected via line 957 to phase signal inputs of dual phase detector 958 and phase shift multiplier 959. The output of phase shift multiplier 959 is connected via line 960 to phase signal inputs of dual phase detector 961 and phase shift multiplier 962. The output of phase shift multiplier 962 is connected via line 963 to phase signal inputs of dual phase detector 964 and phase shift multiplier 965. The output of phase shift multiplier 965 is connected via line 966 to the phase signal input of phase detector 967. A first and second output of phase shift 968 are connected via lines 969 and 970, respectively, to first and second phase reference inputs of dual phase detectors 952, 955, 958, 961 and 964. A third output of phase shift 968 is connected via line 971 to the phase reference input of phase detector 967. The two outputs of dual phase detector 952 are connected to lines 972 and 973, the two outputs of dual phase detector 955 are connected to lines 974 and 975, the two outputs of dual phase detector 958 are connected to lines 976 and 977, the two outputs of dual phase detector 961 are connected to lines 978 and 979, the two outputs of dual phase detector 964 are connected to lines 980 and 981, and the output of phase detector 967 is connected to line 982. Within sampling section 943, lines 972, 973, 974 and 975 are connected to first, second, third and fourth signal inputs of decimal digitizer 983. Lines 976, 977, 978 and 979 are connected to first, second, third and fourth signal inputs of decimal digitizer 984. Lines 980, 981 and 982 are connected to first, second and third signal inputs of decimal digitizer 985. The four outputs of decimal digitizer 983 are connected via lines 986, 987, 988 and 989 to first, second, third and fourth signal inputs of digital computer system 944. The four outputs of decimal digitizer 984 are connected via lines 990, 991, 992 and 993 to fifth, sixth, seventh and eighth inputs of computer system 944. Lines 990 and 991 are also connected to fifth and sixth signal inputs of decimal digitizer 983. The four outputs of decimal digitizer 985 are connected via lines 994, 995, 996 and 997 to ninth, tenth, eleventh and twelfth signal inputs of computer system 944. Lines 994 and 995 are also connected to fifth and sixth signal inputs of decimal digitizer 984. A first control signal output of computer system 944 is connected via line 998 to the control signal input of sample-and-hold 949. A second control signal output of computer system 944 is connected via line 999 to control signal inputs of decimal digitizers 983, 984 and 985.

The previously described analog-to-digital conversion systems have been arranged for the generation of the output data in a binary form. The binary digital output of a binary analog-to-digital converter can be converted into decimal or some other desired radix form by digital or logical operations upon the digital data. However, in some instances, it may be desirable to perform the analog-to-digital conversion itself in a nonbinary radix. FIG. 28 is an illustration of a form of the subject invention arranged as a decimal analog-to-digital conversion system.

Signal source 941 is a source of an analog signal on line 948 which is to be converted into a digital number. Sample-and-hold 949 samples and holds the line 948 signal under the control of line 998 control signal from digital computer system 944. The line 950 signal then corresponds to the value of the line 948 signal at the time of sampling by sample-and-hold 949. Phase shift multipliers 956 and 962 each multiply the phase shift of their input signal by a factor of two, and may be of the form shown in FIGS. 5, 6 and 7. Phase shift multipliers 953, 959 and 965 each multiply the phase shift of their input signal by a factor of five. A circuit for the multiplication of a phase shift signal by a factor of five may be constructed generally along the lines of the circuits of FIGS. 5, 6 and 7. The frequency and phase shift are multiplied by a factor of five by a frequency multiplication operation. A subsequent heterodyne frequency conversion then generates a multiplied phase shift signal with a phase shift of five times the input signal and of the same carrier frequency. Decimal digitizers 983 and 984 are shown in greater detail in FIG. 31 and will be subsequently described further. Decimal digitizer 985 is shown in greater detail in FIG. 29 and will be subsequently described further.

The operation of the latches within decimal digitizers 983, 984 and 985, under the control of the line 999 control signal from computer system 944, is in the general manner illustrated in FIG. 3 and described in connection with the system of FIG. 1. Computer system 944 provides a control signal on line 998, slightly preceding the line 999 control signal, to control the sampling operation of sample-and-hold 949. The time difference between the line 998 control signal and the line 999 control signal is such that the outputs of the phase shift multipliers and phase detectors within phase shift multiplication section 942, and the amplifiers within decimal digitizers 983, 984 and 985, will have had time to stabilize at values corresponding to the sampled value of the line 948 input signal before the sampling operation of the latches within decimal digitizers 983, 984 and 985 under the control of the line 999 signal.

The oscillator 945 output signal on line 946 corresponds to $\sin(\omega t)$, where $\omega$ is the angular frequency. The output of phase modulator 947 may be represented as $\sin(\omega t + \theta)$, where $\theta$ is the phase modulation corresponding to the line 950 signal and the value of the line 948 signal at the time of sampling by sample-and-hold 949. The multiplied phase shift signals on lines 954, 957, 960, 963 and 966 will correspond to $\sin(\omega t + 5\theta)$, $\sin(\omega t + 10\theta)$, $\sin(\omega t + 50\theta)$, $\sin(\omega t + 100\theta)$ and $\sin(\omega t + 500\theta)$, respectively. The phase detector 952, 955, 958, 961, 964 and 967 output signals on lines 972, 973, 974, 975, 976, 977, 978, 979, 980, 981 and 982 will correspond to $\cos(\theta)$, $\sin(\theta)$, $\cos(5\theta)$, $\sin(5\theta)$, $\cos(10\theta)$, $\sin(10\theta)$, $\cos(50\theta)$, $\sin(50\theta)$, $\cos(100\theta)$, $\sin(100\theta)$ and $\sin(500\theta)$, respectively. The line 972 through 982 signals are analog signals representing the amplitudes of the various trigonometric functions as well as their polarities.

When an analog-to-digital conversion is to be performed, computer system 944 transmits control signals on lines 998 and 999. Phase shift multiplication section 942 samples the line 948 input signal via sample-and-hold 949, and shortly thereafter provides analog signals on lines 972 through 982. Sampling section 943 processes the line 972 through 982 signals, samples a set of related signals and generates a three-digit decimal number corresponding to the sampled value of the line 948 analog input signal. The three-digit decimal number is in the form of three binary coded decimal digits on twelve lines. The most significant decimal digit is transmitted to computer system 944 on lines 986, 987, 988 and 989, with the most significant bit signal on line 986 and the least significant bit signal on line 989. Similarly, the middle decimal digit is transmitted on lines 990, 991, 992 and 993, with the most significant bit signal on line 990 and the least significant bit signal on line 993, and the least significant decimal digit is transmitted on lines 994, 995, 996 and 997, with the most significant bit signal on line 994 and the least significant bit signal on line 997. For part of the ambiguity resolution process, the line 990 and 991 signals are connected to inputs of decimal digitizer 983, and the line 994 and 995 signals are connected to inputs of decimal digitizer 984.

Figure 29:
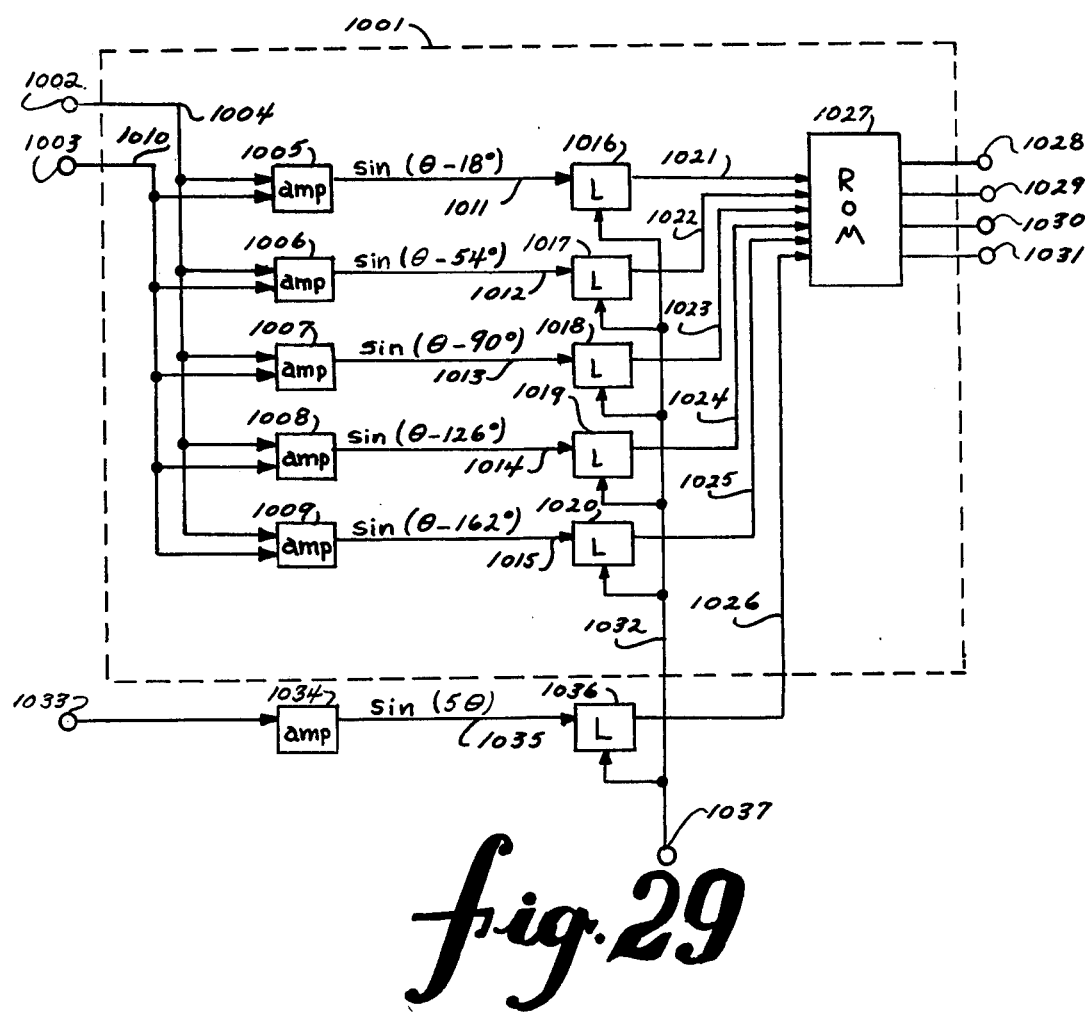
FIG. 29 is a diagrammatic illustration of a first form of decimal angle digitizer circuit which may be used for a decimal digitizer in the system of FIG. 28.

FIG. 29 is a diagrammatic illustration of a first form of decimal digitizer circuit, which may be used for decimal digitizer 985 of FIG. 28. FIG. 29 includes digitizer section 1001, signal input terminals 1002, 1003 and 1033, control signal input terminal 1037 and output terminals 1028, 1029, 1030 and 1031. Terminal 1002 is connected via line 1004 to a first input of each of amplifiers 1005, 1006, 1007, 1008 and 1009. Terminal 1003 is connected via line 1010 to a second input of each of amplifiers 1005, 1006, 1007, 1008 and 1009. The outputs of amplifiers 1005, 1006, 1007, 1008 and 1009 are connected via lines 1011, 1012, 1013, 1014 and 1015, respectively, to the signal inputs of latches 1016, 1017, 1018, 1019 and 1020, respectively. The outputs of latches 1016, 1017, 1018, 1019 and 1020 are connected via lines 1021, 1022, 1023, 1024 and 1025 to first, second, third, fourth and fifth inputs, respectively, of read-only memory 1027. The four signal outputs of read-only memory 1027 are connected to terminals 1028, 1029, 1030 and 1031. Terminal 1033 is connected to the input of amplifier 1034, whose output is connected via line 1035 to a signal input of latch 1036. The output of latch 1036 is connected to line 1026, which is connected to a sixth input of read-only memory 1027. Terminal 1037 is connected to a control signal input of latch 1036 and, via line 1032, to control signal inputs of each of latches 1016, 1017, 1018, 1019 and 1020.

When the circuit of FIG. 29 is used for decimal digitizer 985 of FIG. 28, input terminals 1002, 1003 and 1033 would be connected to lines 980, 981 and 982, respectively. Output terminals 1028, 1029, 1030 and 1031 would be connected to lines 994, 995, 996 and 997, respectively. Control signal terminal 1037 would be connected to control line 999. Amplifiers 1005, 1006, 1007, 1008, 1009 and 1034 may be of the general form of FIGS. 18, 19 and 20. The input signals on terminals 1002, 1003 and 1033 correspond to $\cos(\theta)$, $\sin(\theta)$ and $\sin(5\theta)$, respectively, where $\theta$ is the angle to be converted into a decimal digit by the circuit of FIG. 29. The functions of amplifiers 1005, 1006, 1007, 1008, 1009 and 1034 are to generate logic level signals corresponding to the polarities of the $\sin(\theta-18°)$, $\sin(\theta-54°)$, $\sin(\theta-90°)$, $\sin(\theta-126°)$, $\sin(\theta-162°)$ and $\sin(5\theta)$ functions, respectively. Latches 1016, 1017, 1018, 1019, 1020 and 1036 may be, for example, standard 7400 series TTL integrated circuit devices.

From trigonometry:

$$\sin(x+y) = \cos(y)\sin(x) + \sin(y)\cos(x)$$

$$\sin(\theta-18°) = \cos(-18°)\sin(\theta) + \sin(-18°)\cos(\theta)$$

$$\sin(\theta-18°) = 0.951 \sin(\theta) - 0.309 \cos(\theta)$$

Hence, generating a logic level signal corresponding to the polarity of the $(0.951 \sin(\theta) - 0.309 \cos(\theta))$ function is equivalent to generating a logic level signal corresponding to the polarity of the $\sin(\theta-18°)$ function. If the circuit of FIG. 18 is used for amplifier 1005, a $\sin(\theta)$ signal would be applied to terminal 606, a $\cos(\theta)$ signal would be applied to terminal 607, and the resistance values of resistors 608 and 611 would have a ratio of substantially 0.309 to 0.951 to provide the desired relative weighting of the sine and cosine components of the signals. Table 4 lists the corresponding sine function relationships for the five functions whose polarities are sensed by amplifiers 1005, 1006, 1007, 1008 and 1009.

Table 4

| Sine Function Relationships for FIG. 29. | | |
|---|---|---|
| $\sin(\theta-18°)$ | = | .951 $\sin(\theta)$ − .309 $\cos(\theta)$ |
| $\sin(\theta-54°)$ | = | .588 $\sin(\theta)$ − .809 $\cos(\theta)$ |
| $\sin(\theta-90°)$ | = | −$\cos(\theta)$ |
| $\sin(\theta-126°)$ | = | −.588 $\sin(\theta)$ − .809 $\cos(\theta)$ |
| $\sin(\theta-162°)$ | = | −.951 $\sin(\theta)$ − .309 $\cos(\theta)$ |

Amplifier 1034 generates a logic level signal corresponding to the polarity of the $\sin(5\theta)$ function. Amplifier 1034 may be, for example, of the general form of the circuit of FIG. 18, with the terminal 1033 signal connected to terminal 606 and terminal 607 being grounded. Read-only memory 1027 is a six-bit input (64 word), four-bit output read-only memory. Suitable read-only memories, compatible with 7400 series TTL integrated circuit devices, are commercially available from a number of semiconductor device suppliers. The data pattern in read-only memory 1027 will be described subsequently.

When an analog-to-digital conversion is to be performed, a control signal pulse from computer system 944 on line 999 and terminal 1037 will cause latches 1016, 1017, 1018, 1019, 1020 and 1036 to sample and hold their respective signal input values. Read-only memory 1027 converts the logic level signals on lines 1021 through 1026 into a four-bit binary coded decimal digit on terminals 1028 through 1031. Read-only memory 1027 performs a function which is similar to that of the network of logical gates between latches 64 through 70 and binary data output terminals 74, 80, 87 and 92 of FIG. 1. That is, it resolves any ambiguities and generates the desired digital number in the desired form.

FIGS. 30A through 30F illustrate the analog-to-digital conversion process of the circuit of FIG. 29 in greater detail. FIGS. 30A, 30B, 30C, 30D, 30E and 30F are plots of the signals on lines 1021, 1022, 1023, 1024, 1025 and 1026, respectively, of FIG. 29. FIGS. 30A-30F are plotted as functions of the value of the analog angle signal $\theta$ at the most recent time of sampling. For the description of the operation of the digitizer circuit of FIG. 29, $\theta$ is the angle signal on lines 980 and 981 of FIG. 28, not the angle signal on lines 972 and 973 of FIG. 28. FIGS. 30A-30F are plotted over a 0° to 360° range of $\theta$, which is specifically marked on FIG. 30A. The $\theta$ or analog variable scale is also divided into ten segments of 36° each. The individual segments are identified as segments 0 through 9, and are specifically marked on FIG. 30B. The signals shown in FIGS. 30A through 30F are logic level signals which are normally either high or low and, in general, not of an intermediate value.

Figure 30:
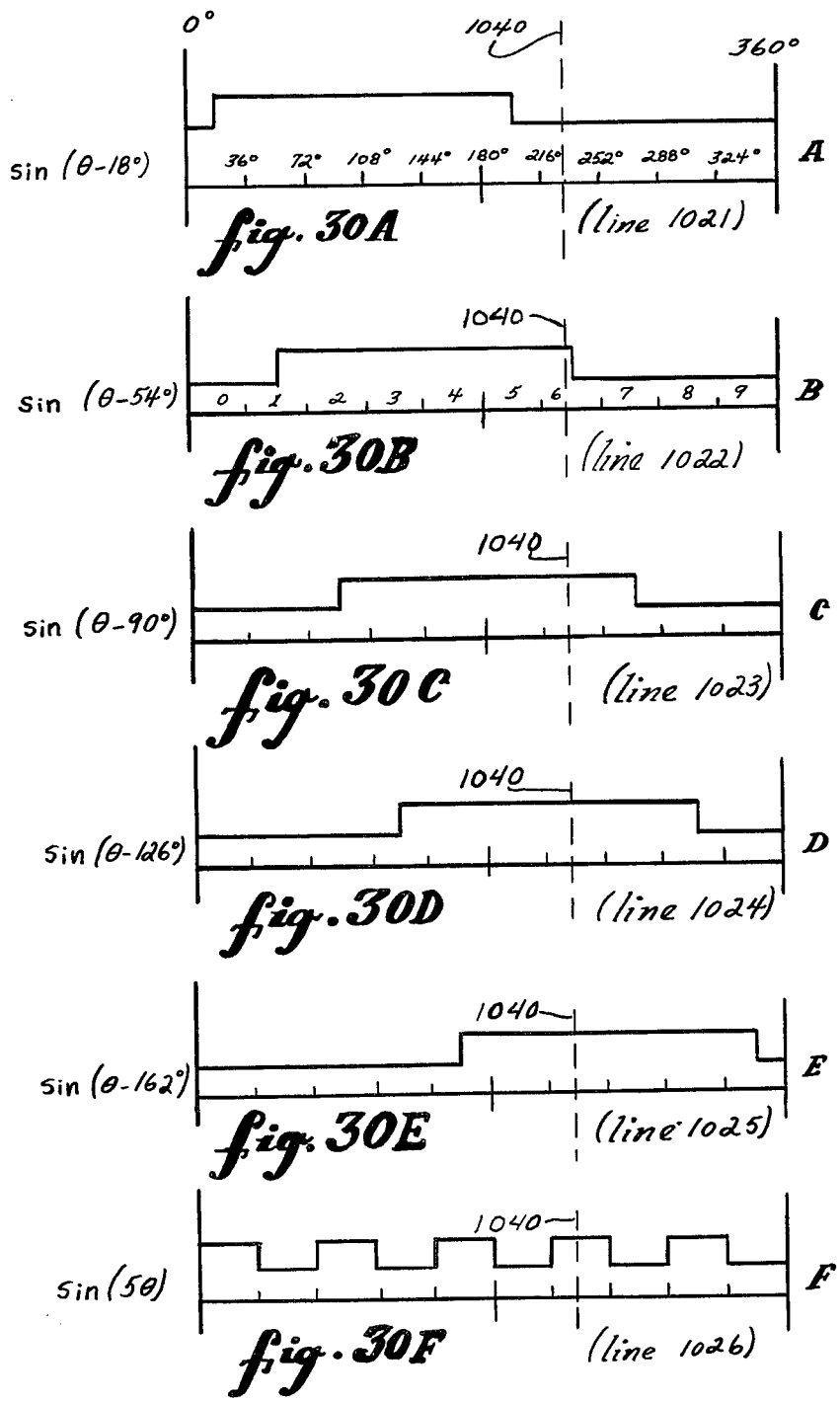
FIGS. 30A through 30F are graphical illustrations of certain logic level signals within the decimal digitizer circuit of FIG. 29, plotted as functions of the angle being measured by that digitizer circuit.

FIG. 30A is a plot of the line 1021 signal, the output of latch 1016, corresponding to the polarity of the $\sin(\theta-18°)$ function at the most recent time of sampling. FIGS. 30B through 30F are similar plots of the line 1022 through 1026 signals, corresponding to the polarities of the $\sin(\theta-54°)$, $\sin(\theta-90°)$, $\sin(\theta-126°)$, $\sin(\theta-162°)$ and $\sin(5\theta)$ functions at the most recent time of sampling by latches 1017, 1018, 1019, 1020 and 1036, respectively. The function of FIG. 30A is low through the midpoint of segment 0, high through the midpoint of segment 5, and then low through the end of the plot. The function of FIG. 30B is low through the midpoint of segment 1, high through the midpoint of segment 6, and then low for the remainder of the plot. The functions of FIGS. 30C, 30D and 30E are similarly high for an interval of approximately five segments, with the individual transition points being staggered as shown in FIGS. 30A through 30E. FIG. 30F is a plot of the line 1026 signal, corresponding to the polarity of the $\sin(5\theta)$ function, and has a transition at the end of each of the 36° angular segments.

The overall process of the conversion of the FIG. 30A through 30F signals into decimal digital values is synchronized by the FIG. 30F $\sin(5\theta)$ signal. The data values which are set into read-only memory 1027 of FIG. 29 are listed in Table 5. Only 20 of the 64 possible input value combinations are listed in Table 5. This is because, in normal operation, only these 20 combinations will occur. The angular segment numbers listed in Table 5 correspond to the angular segment numbers plotted in FIG. 30B. Address input values A, B, C, D, E and F correspond to the functions plotted in FIGS. 30A through 30F and the signals on lines 1021 through 1026, respectively. The data output value columns labeled 8, 4, 2 and 1 correspond to output terminals 1028, 1029, 1030 and 1031, respectively. The headings of the data output value columns are the weightings given to the particular bits in the binary coded decimal pattern.

Table 5
Data Values for Read-Only Memory 1027 of FIG. 29.

| angular segment number | address input values | | | | | | data output values | | | |
|---|---|---|---|---|---|---|---|---|---|---|
| | A | B | C | D | E | F | 8 | 4 | 2 | 1 |
| 0 | 0 | 0 | 0 | 0 | 0 | 1 | 0 | 0 | 0 | 0 |
|   | 1 | 0 | 0 | 0 | 0 | 1 |   |   |   |   |
| 1 | 1 | 0 | 0 | 0 | 0 | 0 | 0 | 0 | 0 | 1 |
|   | 1 | 1 | 0 | 0 | 0 | 0 |   |   |   |   |
| 2 | 1 | 1 | 0 | 0 | 0 | 1 | 0 | 0 | 1 | 0 |
|   | 1 | 1 | 1 | 0 | 0 | 1 |   |   |   |   |
| 3 | 1 | 1 | 1 | 0 | 0 | 0 | 0 | 0 | 1 | 1 |
|   | 1 | 1 | 1 | 1 | 0 | 0 |   |   |   |   |
| 4 | 1 | 1 | 1 | 1 | 0 | 1 | 0 | 1 | 0 | 0 |
|   | 1 | 1 | 1 | 1 | 1 | 1 |   |   |   |   |
| 5 | 1 | 1 | 1 | 1 | 1 | 0 | 0 | 1 | 0 | 1 |
|   | 0 | 1 | 1 | 1 | 1 | 0 |   |   |   |   |
| 6 | 0 | 1 | 1 | 1 | 1 | 1 | 0 | 1 | 1 | 0 |
|   | 0 | 0 | 1 | 1 | 1 | 1 |   |   |   |   |
| 7 | 0 | 0 | 1 | 1 | 1 | 0 | 0 | 1 | 1 | 1 |
|   | 0 | 0 | 0 | 1 | 1 | 0 |   |   |   |   |
| 8 | 0 | 0 | 0 | 1 | 1 | 1 | 1 | 0 | 0 | 0 |
|   | 0 | 0 | 0 | 0 | 1 | 1 |   |   |   |   |
| 9 | 0 | 0 | 0 | 0 | 1 | 0 | 1 | 0 | 0 | 1 |
|   | 0 | 0 | 0 | 0 | 0 | 0 |   |   |   |   |

As an example, consider the measurement of an analog signal with a value of slightly more than 6/10 of full scale at the time of sampling as indicated by dotted line 1040 in FIGS. 30A–30F. The line 1021 signal will be low as shown in FIG. 30A, and the line 1022 through 1026 signals will be high as shown in FIGS. 30B through 30F. Referring to Table 5, this combination of address input values corresponds to angular segment number 6, and will generate data output values of 0110, a binary coded decimal 6. Thus, the system of FIG. 29 has performed an analog-to-digital conversion of the signal represented by dotted line 1040. The system of FIG. 29 will generate binary coded decimal values from 0 through 9 for angle signal inputs over a range of 0° to 360°.

The system of FIG. 29 has several similarities to the two-phase code ambiguity resolution process shown in FIG. 1 and to the two-speed angle signal concept shown in FIG. 21. The FIG. 30A through 30E, line 1021 through 1025 signals are a "low speed" signal set while the FIG. 30F, line 1026 signal is a "high speed" signal. The only one of the FIG. 30A through 30E signals which changes value within angular segment 6 is the FIG. 30B, line 1022 signal. As may be seen from Table 5, the value of address input B, the FIG. 30B and line 1022 signal, does not affect the data output of read-only memory 1027 when the other input signals correspond to angular segment 6. In general, the exact transition points of the FIG. 30A through 30E signals will not affect the exact transition points between adjacent digital values. The transition points between adjacent digital values are determined by the transitions of the "high speed" FIG. 30F, line 1026 signal.

When the circuit of FIG. 29 is used for decimal digitizer 985 of FIG. 28, the angle signal which it converts into a decimal digit is 100 times the angle signal on lines 972 and 973. Hence, decimal digitizer 985 will provide the least significant digit of a three-digit decimal number corresponding to the signal on line 948 at the time of sampling.

Figure 31:
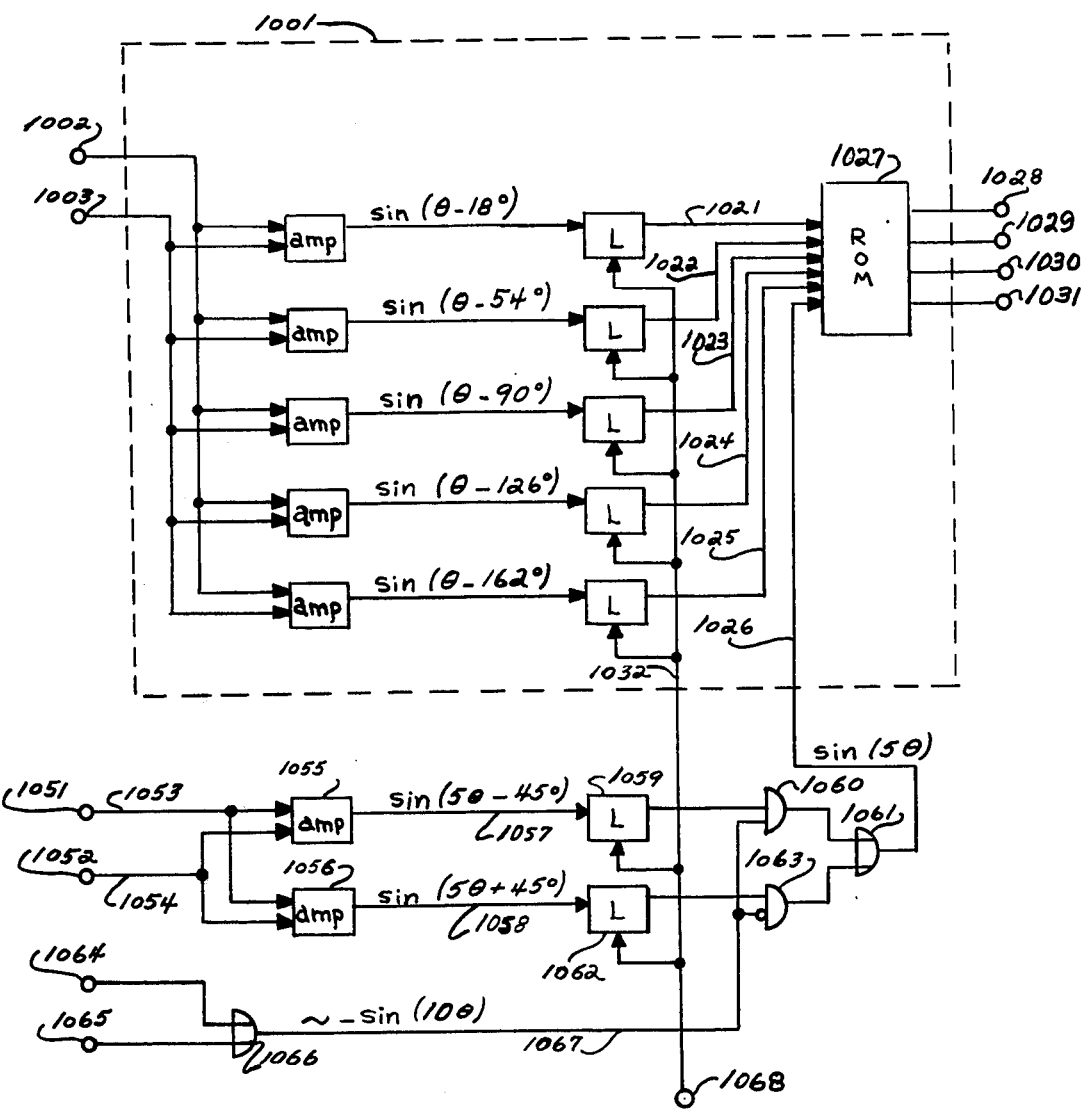
FIG. 31 is a diagrammatic illustration of a second form of decimal angle digitizer circuit, which may be used for certain decimal digitizers in the system of FIG. 28.

FIG. 31 is a diagrammatic illustration of a second form of decimal digitizer circuit, which may be used for decimal digitizers 983 and 984 in the system of FIG. 28. FIG. 31 includes digitizer section 1001, signal input terminals 1002, 1003, 1051, 1052, 1064 and 1065, control signal input terminal 1068 and signal output terminals 1028, 1029, 1030 and 1031. Digitizer section 1001 is identical to digitizer section 1001 of FIG. 29, and operates in a substantially identical manner. Signal input terminals 1002 and 1003, lines 1021 through 1026, read-only memory 1027, terminals 1028 through 1031 and line 1032 are equivalent to the similarly numbered elements of digitizer section 1001 of FIG. 29. Terminal 1051 is connected via line 1053 to a first input of amplifier 1055 and to a first input of amplifier 1056. Terminal 1052 is connected via line 1054 to a second input of amplifier 1055 and to a second input of amplifier 1056. The output of amplifier 1055 is connected via line 1057 to a signal input of latch 1059, whose output is connected to a first input of AND gate 1060. The output of AND gate 1060 is connected to a first input of OR gate 1061, whose output is connected to line 1026. The output of amplifier 1056 is connected via line 1058 to a signal input of latch 1062, whose output is connected to a first input of AND gate 1063. The output of AND gate 1063 is connected to a second input of OR gate 1061. Terminals 1064 and 1065 are connected to the two inputs of OR gate 1066, whose output is connected via line 1067 to a second input of AND gates 1060 and 1063. Terminal 1068 is connected to control signal inputs of latches 1059 and 1062 and, via line 1032, to control signal inputs of each of the five latches of digitizing section 1001.

If the circuit of FIG. 31 is used for decimal digitizer 983 of FIG. 28, input terminals 1002, 1003, 1051, 1052, 1064 and 1065 would be connected to lines 972, 973, 974, 975, 990 and 991, respectively. Output terminals 1028, 1029, 1030 and 1031 would be connected to lines 986, 987, 988 and 989, respectively, and control signal terminal 1068 would be connected to control line 999. If the circuit of FIG. 31 is used for decimal digitizer 984 of FIG. 28, input terminals 1002, 1003, 1051, 1052, 1064 and 1065 would be connected to lines 976, 977, 978, 979, 994 and 995, respectively. Output terminals 1028, 1029, 1030 and 1031 would be connected to lines 990, 991, 992 and 993, respectively, and control signal terminal 1068 would be connected to control line 999.

The arrangement and operation of the circuit of FIG. 31 generally resembles the arrangement and operation of the circuit of FIG. 29. In both cases, the object is to convert an angle signal $\theta$, which is applied to $\cos(\theta)$ and $\sin(\theta)$ component signals to input terminals 1002 and 1003, into a corresponding decimal digit. The principal difference of the circuit of FIG. 31 is that it includes additional circuits whereby the transitions between the various decimal values are synchronized with the transitions between the values of 9 and 0 of a similar decimal digitizer circuit used for generating the adjacent less significant decimal digit. Digitizer section 1001 of FIG. 31 is substantially identical to digitizer section 1001 of FIG. 29. All of the elements numbered below 1050 are substantially identical to the like numbered elements in FIG. 29. Only the elements numbered 1051 and above are unique to FIG. 31.

In the circuit of FIG. 29, a $\sin(5\theta)$ signal is applied to terminal 1033. A corresponding logic level signal is generated on line 1026 to synchronize the operation of digitizer section 1001. In the circuit of FIG. 31, a logic level signal whose value corresponds to the polarity of the $\sin(5\theta)$ function is generated on line 1026 in such a manner that the transitions of this signal are controlled by the 9 through 0 transitions of the adjacent less significant decimal digit. The terminal 1064 signal is the 8 bit of the adjacent less significant decimal digit, and the terminal 1065 signal is the 4 bit of the adjacent less significant digit. The output of OR gate 1066 on line 1067 will be a logic level signal which will be low when the value of the adjacent less significant decimal digit is 0 through 3, and high when the adjacent less significant digit is 4 through 9. This signal generally corresponds to the polarity of the $-\sin(10\theta)$ function. The high to low transition of the line 1067 signal, for an increasing value of $\theta$, corresponds exactly to the positive to negative transition of the $-\sin(10\theta)$ function. The low to high transition of the line 1067 signal occurs slightly earlier than the negative to positive transition of the $-\sin(10\theta)$ function.

The terminal 1051 and 1052 signals correspond to $\cos(5\theta)$ and $\sin(5\theta)$, respectively. Amplifiers 1055 and 1056 may be of the general form of the circuits shown in FIGS. 18 and 19, and generate signals corresponding to $\sin(5\theta-45°)$ and $\sin(5\theta+45°)$ on lines 1057 and 1058, respectively. The output signals of latches 1059 and 1062 are logic level signals whose values correspond to the polarities of the line 1057 $\sin(5\theta-45°)$ and line 1058 $\sin(5\theta+45°)$ signals. The network of gates 1060, 1061 and 1063 selects one of the latch 1059 or latch 1062 output signals, in accordance with the value of the line 1067 signal, for transmission to line 1026. The general operation of this gate network is similar to the operation of the similar gate networks of FIG. 1. The result is the generation of a $\sin(5\theta)$ signal on line 1026 whose transitions are synchronized with the low going transitions of the line 1067 signal, for an increasing value of $\theta$. This synchronizes the line 1026 signal with the 9 through 0 transitions of the adjacent less significant decimal digit. That the high going transitions of the line 1067 signal, for an increasing value of $\theta$, are not precisely between the low going transitions is not of great significance. The value of the line 1026 signal will normally change only upon the low going transitions of the line 1067 signal.

If the circuit of FIG. 31 is used for decimal digitizer 984 of FIG. 28, it will generate the middle digit of a three-digit decimal number corresponding to the analog signal on line 948 at the time of sampling. Transitions between digital values generated by digitizer 984 will be synchronized with the 9 through 0 transitions of the digital value generated by decimal digitizer 985. The circuit of FIG. 31 may be similarly used for decimal digitizer 983 of FIG. 28. It will then generate the most significant digit of a three-digit decimal number corresponding to the analog signal on line 948 at the time of sampling. The digital value generated by digitizer 983 will be synchronized with the 9 through 0 transitions of the digital value generated by decimal digitizer 984 and, hence, with the 9 through 0 transitions of the digital value generated by decimal digitizer 985.

The preceding disclosure has shown features of the subject invention arranged in various specific combinations. Other combinations of such features may be devised to meet particular requirements. For example, FIG. 16 shows a form of interpolation in combination with a particular form of the invention. Other forms of the invention may also be used with various forms of interpolation. Some of the possible variations of the subject invention are described below. These variations may be applied to the subject invention individually and/or in combination.

For convenience and clarity of illustration, the analog-to-digital conversion systems shown and described herein have generally been limited to relatively short digital word lengths and correspondingly low conversion accuracies and resolutions. The general techniques may be readily adapted for the design and construction of converters for other digital word lengths and, in particular, may be extended for longer digital word lengths and correspondingly higher conversion accuracies and resolutions.

The preceding disclosure has shown analog-to-digital conversion systems in which phase shifts are multiplied by two and five and divided by two for the generation of sets of phase shift signals. Other phase shift multiplication and/or division ratios may be used in other forms of the subject invention.

The preceding disclosure has shown a number of systems for analog-to-digital conversion into binary and decimal coded digital values. The general features of the subject invention may be used for analog-to-digital conversion into digital values coded in other radices as may be desired. For example, the general arrangement of FIG. 28 may be used as a guide for the design of an analog-to-digital converter providing a digital output in such radix as may be desired.

The preceding disclosure has shown a number of analog-to-digital conversion systems in which the digital output values are coded in a normal binary or binary coded decimal form, and in which the digital output values may vary over a range from zero through some upper limit. Similar systems may be devised in which the digital output values are coded in some other desired form, for example, a Gray code, a 4-2-2-1 code, an excess three code, a two out of five code or a biquinary code. Similar systems may be devised in which the digital output values may vary through a range of negative values, in addition to or in place of a range of positive values, or a range which does not include zero.

Negative digital output values may be coded in complement, sign and magnitude or other form as may be desired. In a simple form, an extension to include a range of negative digital values may not require any change in the physical analog-to-digital conversion system. Considering a four-bit binary number as a two's complement value, a value of $-1$ is represented as 1111, $-2$ as 1110, etc. The entire range of a four-bit, two's complement representation is 1000 through 0111 or, in decimal, $-8$ through $+7$. The system of FIG. 1 has been described as a system for the conversion of a phase shift signal over a range of 0° to 360°, with digital output values of 0 through 15. Using the two's complement representation described above, the system of FIG. 1 can also be used for the conversion of a phase shift signal over a range of $-180°$ to $+180°$, with digital output values of $-8$ through $+7$.

The preceding disclosure has mentioned from time to time that standard 7400 series TTL integrated circuit devices may be used for various logical and digital elements in implementations of the subject invention. These references to 7400 series TTL devices are because of the present wide usage and common availability of these devices. The subject invention is not limited to implementations with 7400 series TTL devices, or similar devices, and may be implemented with various types of present and/or future logical and digital elements and devices as may be desired.

At the present time, logical and digital elements and devices are predominantly of a binary or two-state nature. That is, the input and output signals are normally of one of two possible values and, in general, not of intermediate or other values. Some logical elements and devices have been devised which operate with more than two possible normal signal values. The concepts of the subject invention may be implemented with non-binary or non-two-state digital and logical elements and devices if so desired.

The preceding disclosure has shown and described analog multiplier, linear amplifier, integrator and polarity detection circuit elements. Other present and/or future analog circuit elements and devices may be used to provide analog signal operations for the subject invention.

Signal sampling devices such as used in the systems shown and described in this disclosure are generally either digital sampling devices for the sampling of digital signals, or analog sampling devices for the sampling of analog signals. A digital sampling element such as a latch circuit can typically retain only binary or two-state signals that are either low or high, but can generally retain such signal values for an indefinitely long period of time. Analog sampling devices are typically capable of sampling and holding an analog signal which may have any value within a range, for example, ±10 volts. However, after the sampling has been performed and the sampled value is being held, the output signal is generally subject to drift. There are two principal purposes for which sampling may be employed in the subject invention. For the first purpose, to facilitate the ambiguity resolution process, digital sampling will frequently be preferred. For the second purpose, the sampling and holding of analog input signals which may be rapidly changing, analog sampling will frequently be preferred.

FIGS. 1, 12, 14, 15, 16, 21, 22, 24, 25, 27, 28, 29 and 31 show the use of digital sampling devices to sample and hold the value of an intermediate code representation of a digital number while it is being converted into a normal binary or other desired output form. In many instances, such as when an analog-to-digital converter is used as an input device for a digital computer and/or as part of a digital control system, it is important that a valid digital output value be obtained each and every time that the computer or digital control system requires a digital value. If there is any uncertainty, such as may be caused by the value of the analog signal being on a boundary between two adjacent digital values, it is important that the converted digital value be one of these two adjacent values and not some quite different value.

The process of sampling and holding the intermediate code representation values allows the subsequent conversion of the intermediate code representation into the desired output form without ambiguity or error, which might otherwise occur if the intermediate code representation were changing at or slightly before the time that the output digital value is transferred into the digital computer or other data receiver. This sampling process, or its equivalent, is in general desirable in any applications in which it is important that each and every digital number transferred into a computer or other data receiver be a valid value.

In some instances, such as when the digital output of an analog-to-digital converter is used only to drive a visible display, occasional ambiguities or flickerings between adjacent digital values may not be unacceptable. In such instances, the latches or other sampling devices shown for the sampling and holding of intermediate code representation values may be deleted. For example, in the system of FIG. 1, computer system 34 may be deleted and sampling section 33 used only to provide digital data for digital display 35. In that case, latches 64 through 70 may be deleted. Lines 57, 58, 59, 60, 61, 62 and 63 would be connected to lines 71, 75, 77, 82, 84, 89 and 91, respectively. Similar delections of sampling devices may be made in other systems shown in this disclosure when permitted by the application.

FIG. 28 shows the use of an analog sample-and-hold element to sample and hold the analog input signal. The use of analog sample-and-hold elements at the input of an analog-to-digital converter is often particularly useful as it allows the sampling and subsequent conversion of input signals which are rapidly changing. Analog sample-and-hold elements may be similarly used with other forms of the subject invention.

The process of recording and subsequently reproducing digital data via a digital data recorder can, in effect, provide a form of sampling operation. For example, as mentioned in the description of the system of FIG. 15, digital data receiver 452 can be a digital data recorder which from time to time samples and records the data values on terminals 467 through 473. When this data is subsequently reproduced, the data values will be held for a period of time which is at least in part determined by the characteristics of the digital data reproducer. This sampling by recording process can be useful in addition to or in place of sampling with analog and/or digital sampling elements as described previously. For example, if digital data receiver 452 is a suitable digital data recorder, sample-and-hold elements 453 through 459 and latches 460 through 466 may be deleted. Line 57 would be connected to terminal 467 and a signal input of digital data receiver 452. Lines 58 through 63 would be similarly connected to terminals 468 through 473 and corresponding signal inputs of digital data receiver 452. Digital data receiver 452 would then record the values of the terminal 467 through 473 signals from time to time as determined by its internal operation and/or by external control means.

In the description of FIG. 15 it was mentioned that it may be desirable to slightly stagger the effective sampling times of individual analog and/or digital sampling elements in a conversion system. Similar sampling time staggering techniques may be used in other forms of the subject invention.

Staggered sampling techniques may be used in systems which include the sampling of carrier frequency phase modulated signals to reduce the number and/or complexity of the phase shift elements and the number of signal output lines of a phase shift multiplication section. For example, in the system of FIG. 22, phase shifts 740, 743, 746, 749 and 750 may be simplified by eliminating the line 752, 754, 756, 758 and 760 outputs. The line 751, 753, 755, 757 and 759 signals would correspond, as before, to $\sin(\omega t+\theta-45°)$, $\sin(\omega t+2\theta-45°)$, $\sin(\omega t+4\theta-45°)$, $\sin(\omega t+8\theta)$ and $\sin(\omega t)$, respectively. Line 751 would be connected to both signal inputs of sample-and-hold 761. Similarly, lines 753, 755, 757 and 759 would be connected to both signal inputs of sample-and-holds 762, 763, 764 and 765, respectively. The sampling control signal to the second sampling section of dual sample-and-hold 761, the section originally connected to line 752, would be delayed by a time corresponding to 90° or one-quarter cycle of the $\sin(\omega t)$ oscillator 735 output signal on line 736. The sampling control signal to the second sampling sections of dual sample-and-holds 762 through 765 would be similarly delayed by a substantially equal time. A single time delay element may be used to provide a delayed sampling control signal for all five of dual sample-and-holds 761 through 765.

In operation, the line 783 sampling control signal would cause the immediate sampling of the line 751 $\sin(\omega t + \theta - 45°)$ signal by the first sample-and-hold section of dual sample-and-hold 761. The output of this first section would then correspond to $\sin(\omega t' + \theta - 45°)$, as in the previously described operation of the system of FIG. 22. The second section of dual sample-and-hold 761 would sample the line 751 signal one-quarter cycle later so that the second output of dual sample-and-hold 761 would correspond to $\sin(\omega t' + \theta - 45° + 90°)$ or $\sin(\omega t' + \theta + 45°)$. Hence, the two outputs of dual sample-and-hold 761 would be the same as in the previously described operation of FIG. 22, even though phase shift multiplication section 732 no longer generated a $\sin(\omega t + \theta + 45°)$ line 752 output signal. The delayed samplings of the line 753, 755, 757 and 759 signals by the second sections of dual sample-and-holds 762 through 765 will generate signals corresponding to those generated by the direct sampling of the line 754, 756, 758 and 760 signals in the system of FIG. 22. The operation of the modified system of FIG. 22 would be otherwise in accordance with the previously described operation of the system of FIG. 22. Thus, staggered sampling may be used to provide substantially the same results as the simultaneous sampling of a number of signals of the same frequency but of different phases. Other forms of staggered sampling systems may be devised to meet particular requirements.

FIG. 16 has shown a system in which angle multiplication techniques are used to provide a form of interpolation to increase the analog-to-digital conversion resolution. The interpolation is performed by a form of analog-to-digital conversion of the sampled values of the line 509 and 510 signals. Other forms of analog-to-digital conversion may be similarly used to provide increased resolution, and such interpolation techniques may be applied to other forms of the invention in addition to that shown in FIG. 16. The increase in the analog-to-digital conversion resolution obtained via interpolation may be greater than, equal to, or less than that shown in FIG. 16.

Interpolation techniques may be used with forms of the invention which include the sampling of carrier frequency phase shift signals and post-sampling phase detection. For example, after sampling, the two outputs of angle detector 766 of FIG. 22 correspond to the two outputs of sample-and-holds 511 and 512 of FIG. 16. Similarly, the two outputs of angle detector 767 correspond to the two outputs of sample-and-holds 513 and 514 and the two outputs of angle detector 768 correspond to the two outputs of sample-and-holds 515 and 516. Thus, the six outputs of angle detectors 766 through 768 may be used in an interpolation system generally similar to that shown in FIG. 16. If the interpolation circuit of FIG. 16 were used with the circuits of FIG. 22, phase shift 756 would be adjusted so that the two output signals of angle detector 768 would correspond to $\sin(4\theta)$ and $\cos(4\theta)$, rather than $\sin(4\theta - 45°)$ and $\sin(4\theta + 45°)$ as in the original form of the system of FIG. 22.

The general arrangements shown for analog-to-digital conversion have included the generation of an intermediate digital code representation of the input analog signal, and the conversion of this intermediate code signal into the desired output digital value in, for example, a normal binary or binary coded decimal form. A reason for the use of this intermediate digital code is that it allows ambiguities and errors which might otherwise occur to be automatically resolved. FIG. 1 shows the use of a two-phase binary intermediate code, FIG. 12 shows the use of a Gary binary intermediate code and FIG. 28 shows the use of a form of multi-speed intermediate code. Other forms of the invention shown generally use the two-phase or Gray intermediate codes or a combination thereof. The specific intermediate codes shown and described are not the only intermediate codes which may be used for the subject invention. In general, a suitable intermediate code will be one in which it is not necessary for two or more intermediate code signal values to change simultaneously between two adjacent digital values.

FIG. 1, 12, 14 and 16 show the use of networks of logical gates to convert an intermediate code representation of the converted digital value into the desired digital output form, for example, a normal binary code. FIGS. 21, 22, 24, 27, 29 and 31 show the use of read-only memories for the similar purpose of converting an intermediate code representation into a desired digital output code. In general, networks of logical gates, read-only memories, and/or other means as may be desired, may be used for such code conversions. Given a set of input data lines to a logical gate network or device, a set of output data lines thereof, and a desired relationship between the input and output data values, there are in general many gate networks and/or logical devices that can provide the desired relationship.

Logical gate networks other than those shown in FIGS. 1, 12, 14 and 16 may be devised to perform substantially the same functions. A logical gate network could be used in place of read-only memory 1027 of FIG. 29. The network would have six data input lines, four data output lines, and would implement the data relationships shown in Table 5. The output data values for input data values not listed in Table 5 will not normally be significant, as they will not occur in the normal operation of the system of FIG. 29.

One or more read-only memories may be substituted for the network of logical gates shown in FIG. 1. If a single read-only memory were used, it would be a seven-bit input (128 word), four-bit output read-only memory. The seven address input lines would be connected to lines 71, 75, 77, 82, 84, 89 and 91. The four data output lines would be connected to terminals 74, 80, 87 and 92. A suitable set of data values for the read-only memory may be determined by making a table of the 128 possible combinations of the seven address line signals, and noting the output data values which would be generated by the logical gate network shown in FIG. 1. Other logical gate networks shown in other figures may be similarly replaced by a read-only memory.

As shown in FIG. 21, the code conversion process in a particular system may be implemented with more than one read-only memory. As a further example, the code conversion process in the system of FIG. 16 could be implemented with a single nine-bit input (512 word), four-bit output read-only memory. The nine address input lines would be connected to lines 547, 551, 553, 558, 560, 565, 567, 572 and 574. The four data output lines would be connected to lines 550, 556, 563 and 570. Line 574 would, as before, be connected directly to computer system 484. The code conversion process in FIG. 16 could also be implemented with two read-only memories, each having five address input lines (32 words) and two data output lines. In this case, the address input lines of a first read-only memory would be connected to lines 547, 551, 553, 558 and 563, and its two data output lines would be connected to lines 550 and 556. The address input lines of the second read-only memory would be connected to lines 560, 565, 567, 572 and 574, and its data output lines would be connected to lines 563 and 570. In this example, each of the two read-only memories is replacing a group of six gates. An advantage of the multiple read-only memory approach is that the total number of bits in the read-only memories is generally less. For example, a single nine-bit input (512 word), four-bit output read-only memory will contain a total of 2048 bits. Two read-only memories, each five-bit input (32 word), two-bit output, will contain a total of 128 bits.

The code conversion process in the system of FIG. 16 could be implemented with four read-only memories, each three-bit input (8 word), and one-bit output, of the type used in the system of FIG. 21. The total number of bits in the four read-only memories would be 32 bits.

If desired, mixed code conversion systems may be devised using combinations of logical gate networks, read-only memories and/or other means as may be desired. For example, in the system of FIG. 16, a five-bit input, two-bit output, read-only memory may be used to replace gates 548, 549, 552, 554, 555 and 559, while retaining the other gates shown in FIG. 16.

In FIG. 1, oscillator 37 and phase modulator 38 are within phase shift multiplication section 32 and the system operates as an analog-to-digital converter for the analog signal on link 39. Most of the other systems shown in this disclosure also incorporate carrier frequency oscillators and phase modulators, and accept an analog input signal which is applied to a phase modulator. In FIG. 21, oscillator 674 and resolver phase shifters 667 and 668 are external to phase shift multiplication section 669. The combination of phase shift mutiplication section 669 and sampling section 670 operates as a digital phase meter for the phase measurement of the signals on lines 679 and 680 relative to the phase reference signal from oscillator 674 on line 675. Other forms of the invention may also be arranged with a carrier wave oscillator, phase modulator and/or variable phase source external to the analog-to-digital conversion system.

For example, the system of FIG. 1 may be modified for use as a digital phase meter by deleting oscillator 36 and phase modulator 38 from phase shift multiplication section 32. A phase reference signal from an external oscillator would be connected to line 37 and the phase reference inputs of phase shift multipliers 43, 47 and 51 and phase detector 53, and the input of phase shift 54. The variable phase input signal would be connected to line 40 and the phase signal inputs of phase detectors 41 and 42, and phase shift multiplier 43. The operation of the system of FIG. 1 would otherwise be as previously described. It will generate a digital number corresponding to the phase of the line 40 signal relative to the phase of the line 37 phase reference signal. In some instances, it may be desirable to have only the carrier frequency oscillator or phase reference signal source, or only the phase modulator or variable phase signal source be external. Other forms of the invention may be similarly modified for operation with an external carrier wave oscillator or phase reference signal source and/or phase modulator or variable phase signal source.

As in the case of other forms of phase measurement systems, the designations of phase reference and variable phase signals is somewhat arbitrary. The phase measurement is primarily of a phase difference, or differences, between two or more signals. Any number of these signals may be variable in phase relative to other phase or time references.

The system of FIG. 1 and most of the other systems shown in this disclosure have been arranged for operation with a phase modulator which is capable of phase modulation over a 360° range. In particular systems, the phase modulator or variable phase signal source may have a range of more or less than 360°. If the phase modulator or variable phase signal source has a range of less than 360°, the various systems of this disclosure may be used as shown although their range of signal output values will be correspondingly reduced. In some instances, it may be desirable to delete some of the circuitry associated with higher order bits whose values will not change. For example, if phase modulator 38 of FIG. 1 is capable of phase modulation over a 0° to 180° range, the most significant bit output signal on terminal 74 will always be low or zero. Hence, phase detectors 41 and 42, latches 64 and 65, gates 72, 73 and 76, terminal 74 and line 94 may be deleted with no significant loss of output data. A conceptually related approach is to use a phase shift multiplier, which is not otherwise connected to digital output circuits, between the output of phase modulator 38 and line 40. For example, if phase modulator 38 has a phase modulation range of 0° to 90°, a phase shift multiplier may be connected between the output of phase modulator 38 and line 40 to multiply the phase shift by a factor of 4 and generate a variable phase signal with a range 0° to 360° on line 40.

If the phase modulator has a phase modulator range of greater than 360°, various means may be used to digitize or count the number of complete 360° cycles. FIG. 11 shows a phase shift multiplication section with a single phase shift divider stage which is capable of digitizing a variable phase signal on line 307 over a range of 720° or two complete 360° cycles. For phase modulation or phase shift ranges of greater than 720°, additional phase shift divider stages may be used in a generally similar manner to digitize or count the entire phase variation range. FIG. 21 shows a system in which the variable phase signal on line 680 may vary over a range of four complete 360° cycles, or a total range of 1440°. Systems generally similar to that of FIG. 21 may be used for other phase ranges of the high speed phase shift signal, for other phase shift ratios between the high and low speed phase shift signals and/or for sets of more than two multi-speed phase shift signals.

The preceding disclosure has shown and described phase shift multipliers and dividers in which the frequency of a phase shift signal is multiplied or divided, and then shifted back to substantially its original frequency by heterodyne conversion. The frequency multiplication or division and heterodyne conversion operations may be performed in either order. For example, a phase shift doubler may be constructed in which heterodyne conversion is first used to convert the input signal into a signal of substantially half the original carrier frequency, which is then frequency doubled to generate a signal of substantially the original carrier frequency and with twice the original phase shift. In general, phase shift multiplication can be performed by heterodyne conversion to reduce the carrier frequency followed by frequency multiplication to multiply the phase shift and return the carrier frequency to substantially the original value or whatever other carrier frequency may be desired. Similarly, phase shift division may be performed by heterodyne conversion to increase the carrier frequency followed by frequency division.

FIGS. 1, 12, 14, 15 and 21 shows systems using phase detectors which generate substantially binary logical signals corresponding to the polarities of certain phase values. FIG. 16 and 28 show the use of analog output phase detectors in which the phase detector output signals are analog functions of certain phase values. Generally similar systems may be implemented using binary output phase detectors, non-binary logical and digital output phase detectors, analog output phase detectors, and/or combinations thereof.

FIGS. 22, 24 and 27 show binary implementations of post-sampling phase detection systems. Generally similar post-sampling phase detection systems may be implemented in other and non-binary radices.

The preceding disclosure has shown a number of systems in which oscillator, phase shift multiplier and other carrier frequency signals were of a generally sine wave form. Some of the commercially available integrated circuit oscillators used in phase locked loop systems use current integration techniques, and normally generate triangular and/or rectangular waveforms. In particular systems, it may be desirable to generate, phase modulate and/or otherwise process carrier wave signals of sine, triangular, rectangular and/or other waveforms.

The preceding disclosure has shown a number of systems in which phase modulated signals are measured in terms of the polarities and/or analog values of functions of the general form $\pm\sin(N\theta)$, $\pm\cos(N\theta)$ and $\pm\sin(N\theta\pm45°)$, where $\theta$ is a phase modulation signal. The use of sine functions of these particular phases is convenient but not necessary. Functions generally of the form $\pm\sin(N\theta\pm A)$, where A is an appropriate phase angle, may be employed in implementations of the subject invention.

The preceding disclosure has shown a number of systems in which a phase modulation or phase shift variable is represented by a pair of sine and cosine form phase detector output or component signals. The use of two such component signals to measure a phase shift angle is generally convenient, as two is normally the minimum number of continuous periodic signals that may be used to represent an angle or cyclic variable. However, if desired, it is possible to represent phase shift variables by sets of more than two phase detector output or component signals. For example, a phase shift variable may be represented by a three-phase set of component signals corresponding to $\sin(\theta)$, $\sin(\theta+120°)$ and $\sin(\theta-120°)$, where $\theta$ is the phase shift angle being measured. The various operations of phase angle detection, interpolation and the generation of intermediate code and output digital signals may be performed on such sets of more than two component signals.

The preceding disclosure has shown a number of systems in which sets of one, two, four or five different phase detector output signals or component signals corresponding to a particular phase shift signal are converted into sets of logical or digital values as part of an analog-to-digital conversion process. Other systems may be devised which are generally similar to the forms of the invention shown, but which may include the use of sets of component signals corresponding to phase shift signals and which contain other than one, two, four or five component signals.

The preceding disclosure has shown systems in which a phase shift signal is measured in terms of sine and cosine type functions or component signals of the phase shift angle. The measurement of a phase shift angle via such sine and cosine type signals is convenient but by no means necessary for the purposes of the subject invention. Other waveforms and functions may be used as component signals. In general, a phase shift signal may be measured via a plurality of individual component signals which are functions of the phase shift angle, generally subject to the requirements that the component signals be simple periodic functions of the phase shift angle and that a particular set of values of the component signals must imply a unique value of the phase shift angle within one complete cycle.

The effective analog-to-digital conversion speed of a system incorporating the subject invention, and its ability to follow and digitize rapidly changing analog input signals, are determined in part by the carrier frequency or frequencies used for the phase reference and phase shift signals. To achieve short conversion times and to be able to digitize rapidly changing signals, it is generally necessary to use high carrier frequencies. The preceding description has been in terms of electronic circuit elements connected by lines. At high frequencies, various functions such as signal generation, phase modulation, phase shift multiplication and phase detection may be performed by distributed devices and/or means which may perform functions corresponding to more than one individual block in the Figures of this disclosure. The connecting signal lines may be coaxial cables or other forms of transmission lines for the connecting of high frequency carrier signals.

The subject invention may be implemented with electromagnetic wave signals rather than simple electrical signals connected via simple conducting lines. For example, the various circuit elements of phase shift multiplication section 32 of FIG. 1 may be microwave oscillators, microwave phase modulators, microwave phase shift multipliers, microwave phase detectors and microwave phase shifts. Connecting lines 37, 40, 44, 48, 52, 55 and 56 may be wave guides for the connecting of electromagnetic wave signals.

Higher frequency electromagnetic wave signals, such as may be referred to as optical signals, may be used for implementations of the subject invention. An optical implementation need not necessarily be with visible light. Many forms of optical devices can operate on infrared, visible and/or ultraviolet radiation. In an optical implementation, a continuous wave laser may be used as a signal source to provide a beam of coherent light of substantially constant frequency. A partially reflecting mirror may be used to split the laser beam in two parts, one of which is phase modulated and the other used as a phase reference signal. Phase modulation may be performed by a number of means such as varying the effective path length (perhaps by only a few millionths of an inch) or by having a variable refractive index gas, liquid or solid element in the path of the light beam to be phase modulated.

Nonlinear optical materials have been used for frequency multiplication and heterodyne frequency conversion of laser and optical signals. In such frequency multiplications and heterodyne conversions, color selective or frequency selective optical filters are used to select the output light beam component with the desired frequency.

Such optical frequency multiplication and heterodyne frequency conversion operations may be used for the multiplication of the phase shift of a phase modulated light beam in substantially the same manner as the phase shift multiplication of an alternating electric wave signal. Losses in the frequency multiplication and/or heterodyne conversion processes may be made up by amplfication in one or more amplifying lasers. Phase sensitive demodulation may be achieved by mixing the phase shift multiplied phase modulated beam and a reference unmodulated beam, and measuring the amplitude of the resultant light signal. This mixing process in effect converts a substantially constant amplitude phase modulated light signal to an amplitude modulated light signal whose amplitude is a simple function of the phase modulation angle. For example, ordinary photoelectric tubes may be used as detectors of such resultant amplitude modulated signals. The sampling and ambiguity resolution steps may be performed by electronic means on the output signals of optical phase detectors in the general manner shown in figures.

In many instances, the analog input variable may be one which is inherently adaptable to optical phase shift modulation. For example, the measurement of the pressure or density of a gas may be performed by using a variable pressure or density gas optical phase modulator. Electro-optical phase modulators may be used to generate optical phase shifts corresponding to electrical input signals, and hence for the analog-to-digital conversion of electrical analog signals.

In one form of optical implementation of the system of FIG. 1, oscillator 36 would be a laser oscillator providing a beam of substantially coherent light at substantially a single constant frequency. Phase modulator 38 would be a variable effective refractive index element, whose effective refractive index corresponds to an analog input signal on link 39. Phase shift multipliers 46, 47 and 51 would be generally similar to the previously described phase shift multipliers, except that the frequency multiplication and heterodyne frequency conversion operations would be preformed on electromagnetic waves in the optical frequency region. Phase shift 54 can provide a differential phase shift between the line 55 and 56 signals by providing connections thereto over paths with different effective lengths and corresponding propagation times. Phase detectors 41, 42, 45, 46, 49, 50 and 53 may be optical phase detectors in which an input phase shift signal is mixed with a reference phase signal, and the resultant amplitude compared with the amplitude of the reference signal. Lines 37, 40, 44, 48, 52, 55 and 56 are optical connecting paths. Where an optical signal is connected from a single source to a plurality of destinations, partially reflecting mirrors and/or fiber optic beam splitters may be used to direct the beam to the plurality of destinations.

Many of the techniques used for phase detection of low and moderate frequency alternating electric signals are inappropriate or inconvenient for the phase detection of electromagnetic wave or optical signals. As mentioned previously, the process of mixing a phase modulated signal and a phase reference signal, and the measurement of the amplitude of the resultant signal may be used for phase measurements of microwave, electromagnetic wave, optical and other signals.

As an example, consider the phase detection of a signal of the form $\sin(\omega t + \theta)$ via mixing with a phase reference signal of the form $\sin(\omega t)$. From trigonometry:

$$\sin(\omega t + \theta) + \sin(\omega t) = 2\sin(\omega t + \theta/2)\cos(\theta/2)$$

A logic level signal is then generated with a value of 1 if the amplitude of the composite carrier wave signal exceeds $\sqrt{2}$, corresponding to the absolute value of $\cos(\theta/2)$ exceeding $\sqrt{\frac{1}{2}}$, and a value of 0 if the amplitude of the composite signal is less than $\sqrt{2}$, corresponding to an absolute value of $\cos(\theta/2)$ of less than $\sqrt{\frac{1}{2}}$. The absolute value of $\cos(\theta/2)$ is greater than $\sqrt{\frac{1}{2}}$ for $\theta$ values of 0° to 90°, 270° to 450° and 630° to 720°. The absolute value of $\cos(\theta/2)$ is less than $\sqrt{\frac{1}{2}}$ for $\theta$ values of 90° to 270° and 450° to 630°. The resulting logic level signal will be high for $\theta$ values from 0° to 90°, low for 90° to 270°, high for 270° to 360° and will be periodic with a period of 360°. This logic level signal corresponds to the polarity of $\cos(\theta)$. Hence, a logic level signal corresponding to $\theta$ may be generated via a mixing and amplitude comparison process. Other functions of $\theta$, generally of the form $\pm\sin(\theta \pm A)$ where A is an angle constant, may be generated by mixing the phase shift signal with a phase reference signal of an appropriate phase.

In some instances, such as when the digital output of an analog-to-digital converter is to be further processed via electro-optical, optical or electromagnetic wave signal processing means, it may be desirable to provide a digital output in the form of a plurality of logical electro-optical, optical or electromagnetic wave signals. For example, substantially all of the operations of the functional elements shown in FIG. 1 may be implemented via electro-optical, optical or electromagnetic wave devices providing substantially equivalent functions. In such instances, the output signals on lines 94 through 97 would be electromagnetic wave or optical signals. Various signal lines including signal input lines 94 through 97 would be electromagnetic wave guides or optical signal paths.

Many types of signals have the property of a phase angle. For example, acoustical waves, periodic mechanical vibrations and many other types of signals as well as electrical, electromagnetic and optical signals may be characterized in part by a phase angle. Hence, the general concepts of the subject invention may be implemented with many types of signals and with a correpondingly wide variety of means and techniques.

For example, the subject invention may be implemented with acoustical or mechanical vibration techniques. Acoustical waves in gases, liquids and/or solids, and/or on the surfaces of liquids and/or solids may be generated, phase modulated, frequency multiplied, heterodyne frequency converted and phase demodulated to provide signals of the general type generated by the various systems shown in the figures. If desired, frequency multiplications and/or heterodyne frequency conversions may be by means of auxiliary electrical transducers and circuits for the conversion of acoustical waves to and from electrical signals, with the frequency multiplication and/or heterodyne frequency conversion operation(s) being performed on the corresponding electrical signals.

In an acoustical wave implementation of the system of FIG. 1, oscillator 36 may be an acoustical wave oscillator or signal source. The various other elements within phase shift multiplication section 32 may be an acoustical phase modulator, acoustical phase shift multipliers, acoustical phase detectors and acoustical phase shifts. Lines 37, 40, 44, 48, 52, 55 and 56 may be acoustical wave guides or other means for the transmission of acoustical vibration signals.

In the claims, the term alternating signal is intended to imply a signal which has a sinesoidal, triangular, rectangular or other waveform, whose value effectively repeats in a generally periodic manner. It may be an electric, electromagnetic wave, optical, acoustical, mechanical or other form of signal. The terms phase shift and phase shift signal are intended to imply an effective time displacement of a corresponding alternating signal which may or may not be of constant waveform. The term analog as in analog signal is intended to generally imply a signal whose value may vary more or less continuously over a range. In a particular application, an analog signal generated by a signal source may possess this characteristic to a greater or lesser extent. The term logical as in logical signal is intended to generally imply a signal which will normally have one of a predetermined number of values except for transitions between values. The term digital as in digital signal is intended to generally imply a signal representing a digital value which may correspond to one or more logical signals. A particular signal may have a combination of analog, logical and/or digital properties. For example, the polarity of an analog signal relative to a reference value may be a logical signal and/or a binary digital signal. The term sampling means is used in a broad sense and is intended to include analog sampling means, digital sampling means and combinations thereof. The term subset is intended in its broad sense. A particular subset may include an entire set of which it is a subset. Two subsets of the same set may or may not overlap.

I claim:

1. In a digital phase measurement system, the combination including a source of a first reference alternating signal establishing a reference phase, a source of a second alternating signal of substantially the same frequency of the reference signal whose phase is to be measured relative to the phase of said reference signal, means responsive to said first and second alternating signals generating a set of additional alternating signals each in a substantially predetermined phase relationship to predetermined multiples, differing from one, of the phase differences of said second alternating signal relative to the phase of said first alternating signal, means generating a set of a plurality of logical signals whose values are predetermined functions of said first, second and additional alternating signals respectively, means to provide a plurality of first subsets of logical signals, with each first subset comprising a plurality of said logical signals, and with each of said first subsets of logical signals corresponding to the relative phase of a single one of said alternating signals, means to control said means to provide, and means for connecting said logical signals to digital data responsive means.

2. The combination of claim 1 wherein said source of said second alternating signal includes a source of a third alternating signal having a substantially predetermined phase relative to said first alternating signal, a source of an analog input signal, and phase modulation means generating said second alternating signal with a phase, relative to said third alternating signal, corresponding to the value of said analog input signal.

3. The combination of claim 2 including means connected to said means to provide for correlating a plurality of said logical signals into a second subset comprising an intermediate code representation of a digital data value corresponding to said analog input signal, said intermediate code representation being such that no more than one logical signals of said second subset of logical signals need change between any two adjacent digital data values.

4. The combination of claim 3 including means for converting said digital data value of said intermediate code representation into a different output code representation of the same digital data value for transmission to said digital data receiving means.

5. The combination of claim 2 wherein said means for generating said set of logical signals includes means for generating a set of analog signals corresponding to the relative phase of at least one of said alternating signals, and means for generating a third subset of said logical signals as predetermined functions of said set of analog signals, the number of logical signals in said third subset being greater than the number of analog signals in said set of analog signals.

6. The combination of claim 5 including a subset of said set of analog signals comprising a first set of component signals corresponding to a first cyclic variable corresponding to said analog input signal, said means for generating said third subset of logical signals including means for generating at least one additional set of component signals corresponding to at least one additional cyclic variable which is at a substantially predetermined phase relationship to a constant multiple, differing from one, of said first cyclic variable, a plurality of logical signals of said third subset of logical signals being at least partially predetermined functions of said additional component signals.

7. The combination of claim 2 wherein a subset of said additional alternating signals corresponds to phase multiples which are substantially proportional to successive integer powers of two.

8. The combination of claim 7 including means to provide a fourth subset of logical signals comprising a pair of logical signals corresponding to the phase of each alternating signal of a subset of the set of said first, second and additional alternating signals, said means for connecting said logical signals to said digital data responsive means including means to select one of each of said pair of logical signals for transmission to said digital data responsive means, said means to select being responsive to a predetermined function of the values of said logical signals exclusive of the pair of signals affected by said means to select.

9. The combination of claim 8 wherein said means for connecting said logical signals to said digital data responsive means includes means for converting said digital data value from said intermediate code representation into a different output code representation of the same digital data value for transmission to said digital data responsive means.

10. The combination of claim 1 wherein said means generating a set of additional alternating signals comprises a phase shift multiplication system including a source of a third alternating signal having a phase shift relative to said first phase reference alternating signal, a controlled oscillator generating a fourth alternating signal whose frequency and phase are controlled by a control signal and which comprises a multiplied phase shift signal corresponding to said third alternating signal, frequency division means connected to said oscillator and generating a fifth alternating signal of substantially predetermined frequency and phase relationship to said fourth alternating signal, control means connected to said sources of said first and third alternating signals and to said frequency division means, said control means generating said control signal as a substantially predetermined function of said first, third and fifth alternating signals.

11. In a digital phase measurement system, the combination including a source of a first phase reference alternating signal, a source of a second alternating signal whose phase is to be measured, each of said first and second signals having a frequency substantially $\omega f$, means connected to said sources of said first and second alternating signals for generating a set of additional alternating signals, each being of a phase relative to the phase of said first alternating signal which is a substantially predetermined phase relationship to predetermined multiples, differing from one, of the phase of said second alternating signal relative to said first alternating signal, means providing a source of a sampling control signal, sampling means coupled to receive said alternating signals and responsive to said sampling control signal for sampling a plurality of signals corresponding to the phases of said alternating signals and providing sampling means output signals, means coupled to receive said sampling means output signals for generating a set of a plurality of logical signals whose values are predetermined functions of the respective values of the sampling means output signals generated in response to said sampling control signal, means correlating the set of logical signals into a plurality of first subsets of logical signals, each first subset comprising a plurality of said logical signals and each of said first subsets of logical signals corresponding to the relative phase angle of a single one of said alternating signals at a time of sampling and means for connecting said logical signals to digital data receiving means.

12. The combination of claim 11 further characterized by said source of said second alternating signal including a source of a third alternating signal of a substantially predetermined phase relative to said first alternating signal, a source of an analog input signal, and phase modulation means generating said second alternating signal with a phase, relative to said third alternating signal, corresponding to the value of said analog input signal.

13. The combination of claim 12 including means to provide a second subset of a plurality of said logical signals comprising an intermediate code representation of a digital data value corresponding to said analog input signal, said intermediate code representation being such that no more than one of said second subset of logical signals need change between any two adjacent digital data values.

14. The combination of claim 13 further characterized by said means connecting said logical signals to said digital data receiving means including means for converting said digital data value from said intermediate code representation into a different output code representation of the same digital data value for transmission to said digital data receiving means.

15. The combination of claim 12 further characterized by said means for generating said set of logical signals including means for generating a set of analog signals corresponding to the relative phase of at least one of said alternating signals, and means for generating a third subset of said logical signals as predetermined functions of said set of analog signals, the number of logical signals in said third subset being greater than the number of analog signals in said set of analog signals.

16. The combination of claim 15 wherein a subset of said set of analog signals comprises a first set of component signals corresponding to a first cyclic variable corresponding to said analog input signal, said means for generating said third subset of logical signals including means for generating at least one additional set of component signals corresponding to at least one additional cyclic variable which is at a substantially predetermined phase relationship to a constant multiple, differing from one, of said first cyclic variable, a plurality of logical signals of said third subset of logical signals being at least partially predetermined functions of said additional component signals.

17. The system of claim 11 further characterized by said digital phase measurement system including a plurality of phase detection means generating a plurality of output signals corresponding to the relative phases of a subset of said alternating signals, and means connecting said sampling means to sample the output signals of said phase detection means.

18. The combination of claim 17 further characterized by said source of said second alternating signal including a source of a third alternating signal of a substantially predetermined phase relative to said first alternating signal, a source of an analog input signal, and phase modulation means generating said second alternating signal with a phase, relative to said third alternating signal, corresponding to the value of said analog input signal.

19. The combination of claim 18 including means providing a second subset of a plurality of said logical signals comprising an intermediate code representation of a digital data value corresponding to said analog input signal, said intermediate code representation being such that no more than one logical signal of said second subset of logical signals need change between any two adjacent digital data values.

20. The combination of claim 19 further characterized by said means for connecting said logical signals to said digital data receiving means including means for converting said digital data value from said intermediate code representation into a different output code representation of the same digital data value for transmission to said digital data receiving means.

21. The combination of claim 18 including means providing a subset of said additional alternating signals corresponding to phase multiples which are substantially proportional to successive integer powers of two.

22. The combination of claim 21 wherein said means correlating includes means to provide a fourt subset of logical signals comprising a pair of logical signals corresponding to the phase of each alternating signal of a subset of the set of said first, second and additional alternating signals, said means for connecting said logical signals to digital data receiving means including means for the selection of one of each of said last mentioned pair of logical signals for transmission to digital data receiving means as a predetermined function of the values of said logical signals exclusive of the pair from which the selection is made.

23. The system of claim 11 further characterized by means connecting said sampling means to sample the effective instantaneous values of a subset of said alternating signals, each sampling being effectively at a time having a predetermined relationship to the time of said sampling control signal.

24. The combination of claim 23 further characterized by said source of said second alternating signal including a source of a third alternating signal of a substantially predetermined phase relative to said first alternating signal, a source of an analog input signal, and phase modulation means generating said second alternating signal with a phase, relative to said third alternating signal, corresponding to the value of said analog input signal.

25. The combination of claim 24 wherein said means correlating provides a second subset of a plurality of said logical signals comprising an intermediate code representation of a digital data value corresponding to said analog input signal, said intermediate code representation being such that no more than one of said second subset of logical signals need change between any two adjacent digital data values.

26. The combination of claim 25 wherein said means for connecting said logical signals to digital data receiving means including means for converting said digital data value from said intermediate code representation into a different output code representation of the same digital data value.

27. The combination of claim 24 including means providing a subset of said additional alternating signals corresponding to phase multiples which are substantially proportional to successive integer powers of two.

28. The combination of claim 27 wherein said means correlating includes means providing an identiable fourth subset of logical signals comprising a pair of logical signals corresponding to the phase of each alternating signal of a subset of the set of said first, second and additional alternating signals, said means for connecting said logical signals to digital data receiving means including means for the selection of one of each of said last mentioned pair of logical signals, the selection being a predetermined function of the values of said logical signals exclusive of the pair from which the selection is made.

29. In a digital phase measurement system, the combination including a source of a first reference electromagnetic wave signal having a reference phase, a source of a second electromagnetic wave signal whose plase is to be measured and of substantially the same frequency as the first electromagnetic wave signal, means responsive to said first and second electromagnetic wave signals generating a set of additional electromagnetic wave signals which have phases relative to said first electromagnetic wave signal in a substantially predetermined phase relationship to predetermined multiples, differing from one, of the phase of said second electromagnetic wave signal relative to said first electromagnetic wave signal, means generating a set of a plurality of logical signals whose values are predetermined functions of the relative phases of said first, second and additional electromagnetic wave signals, and means for connecting said logical signals to said digital data receiving means.

30. The combination of claim 29 wherein said source of said second electromagnetic wave signal includes a source of a third electromagnetic wave signal of a substantially predetermined phase relative to said first electromagnetic wave signal, a source of an analog input signal, and phase modulation means generating said second electromagnetic wave signal with a phase, relative to said third electromagnetic wave signal, corresponding to the value of said analog input signal.

31. In combination, means for providing a digital data value indicating the phase difference of a second alternating signal in relation to the phase of a first reference alternating signal which are substantially the same frequency, including means for generating a set of additional alternating signals of predetermined frequency each having a substantially predetermined phase relationship to predetermined multiples of the phase of said second alternating signal relative to said first alternating signal, means connected to receive said alternating signals for generating a plurality of logical signals having values representing predetermined functions of the relative phases of said first, second and additional alternating signals, including means for providing a plurality of first identifiable subsets of logical signals, with each subset comprising a plurality of said logical signals, and corresponding to the relative phase of a single one of said alternating signals.

32. The combination of claim 31 including means for providing a third alternating signal of a substantially predetermined phase relative to said first alternating signal, and means for modulating the phase of said third signal as a function of the value of an analog signal to be measured to provide said second alternating signal.

* * * * *